United States Patent
Helmick et al.

(10) Patent No.: US 11,211,141 B2
(45) Date of Patent: Dec. 28, 2021

(54) STORAGE SYSTEM WITH MULTIPLE COMPONENTS AND METHOD FOR USE THEREWITH

(71) Applicant: SanDisk Technologies LLC, Addison, TX (US)

(72) Inventors: Daniel L. Helmick, Broomfield, CO (US); Martin V. Lueker-Boden, Fremont, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 16/888,622

(22) Filed: May 29, 2020

(65) Prior Publication Data
US 2020/0294616 A1 Sep. 17, 2020

Related U.S. Application Data

(63) Continuation of application No. 15/297,993, filed on Oct. 19, 2016, now Pat. No. 10,679,722.
(Continued)

(51) Int. Cl.
*G11C 29/52* (2006.01)
*G06F 3/06* (2006.01)
(Continued)

(52) U.S. Cl.
CPC ............ *G11C 29/52* (2013.01); *G06F 3/0616* (2013.01); *G06F 3/0656* (2013.01);
(Continued)

(58) Field of Classification Search
CPC .. G06F 3/0656; G06F 11/1048; G06F 3/0616; G06F 3/0688; G11C 29/52; G11C 5/04
(Continued)

(56) References Cited

U.S. PATENT DOCUMENTS 6,026,465 A * 2/2000 Mills ...................... G06F 12/08
711/103
6,154,419 A 11/2000 Shakkarwar
(Continued)

FOREIGN PATENT DOCUMENTS

WO WO 2006/28643 3/2006
WO WO 2007/02324 1/2007
(Continued)

OTHER PUBLICATIONS

"DDR2 SDRAM," Micron Technology, Inc., 2006, 133 pages.
(Continued)

*Primary Examiner* — David Yi
*Assistant Examiner* — Zubair Ahmed
(74) *Attorney, Agent, or Firm* — Morgan, Lewis & Bockius LLP

(57) ABSTRACT

A storage system with several integrated components and method for use therewith are provided. In one embodiment, a storage system comprising: a plurality of non-volatile memory devices; a controller in communication with the plurality of non-volatile memory devices; a plurality of data buffers in communication with the controller and configured to store data sent between the controller and an input/output bus; and a command and address buffer configured to store commands and addresses sent from a host, wherein the command and address buffer is further configured to synchronize data flow into and out of the plurality of data buffer; wherein at least three of the above components are integrated with each other.

20 Claims, 51 Drawing Sheets

Related U.S. Application Data

(60) Provisional application No. 62/380,239, filed on Aug. 26, 2016.

(51) Int. Cl.
*G06F 11/10* (2006.01)
*G11C 5/04* (2006.01)

(52) U.S. Cl.
CPC ........ *G06F 3/0688* (2013.01); *G06F 11/1048* (2013.01); *G11C 5/04* (2013.01)

(58) Field of Classification Search
USPC ........................................................ 711/103
See application file for complete search history.

(56) References Cited

U.S. PATENT DOCUMENTS

| | | |
|---|---|---|
| 6,276,844 B1 | 8/2001 | Coteus et al. |
| 6,317,352 B1 | 11/2001 | Halbert et al. |
| 6,345,321 B1 | 2/2002 | Litaize et al. |
| 6,369,605 B1 | 4/2002 | Bonella et al. |
| 6,414,868 B1 | 7/2002 | Wong et al. |
| 6,434,035 B2 | 8/2002 | Miersch et al. |
| 6,480,409 B2 | 11/2002 | Park et al. |
| 6,492,600 B1 | 12/2002 | Jimarez et al. |
| 6,493,250 B2 | 12/2002 | Halbert et al. |
| 6,496,906 B1 | 12/2002 | Novak et al. |
| 6,502,173 B1 | 12/2002 | Aleksic et al. |
| 6,553,450 B1 | 4/2003 | Dodd et al. |
| 6,566,761 B1 | 5/2003 | Sharma et al. |
| 6,580,036 B2 | 6/2003 | Kim et al. |
| 6,625,687 B1 | 9/2003 | Halbert et al. |
| 6,674,313 B2 | 1/2004 | Kurisu et al. |
| 6,704,818 B1 | 3/2004 | Martin et al. |
| 6,717,255 B2 | 4/2004 | Oggioni et al. |
| 6,820,181 B2 | 11/2004 | Jeddeloh et al. |
| 6,854,042 B1 | 2/2005 | Karabatsos |
| 6,914,851 B1 | 7/2005 | Kiehl |
| 7,000,062 B2 | 2/2006 | Perego et al. |
| 7,010,642 B2 | 3/2006 | Perego et al. |
| 7,017,002 B2 | 3/2006 | Perego et al. |
| 7,051,151 B2 | 5/2006 | Perego et al. |
| 7,107,415 B2 | 9/2006 | Jeddeloh et al. |
| 7,110,322 B2 | 9/2006 | Farmwald et al. |
| 7,120,743 B2 | 10/2006 | Meyer et al. |
| 7,133,972 B2 | 11/2006 | Jeddeloh |
| 7,200,062 B2 | 4/2007 | Kinsley et al. |
| 7,210,059 B2 | 4/2007 | Jeddeloh |
| 7,222,213 B2 | 5/2007 | James |
| 7,234,070 B2 | 6/2007 | James |
| 7,254,036 B2 | 8/2007 | Pauley et al. |
| 7,260,685 B2 | 8/2007 | Lee et al. |
| 7,269,042 B2 | 9/2007 | Kinsley et al. |
| 7,286,436 B2 | 10/2007 | Bhakta et al. |
| 7,289,386 B2 | 12/2007 | Yen et al. |
| 7,307,863 B2 | 12/2007 | Yen et al. |
| 7,310,752 B2 | 12/2007 | Jeddeloh |
| 7,349,277 B2 | 3/2008 | Kinsley et al. |
| 7,375,970 B2 | 5/2008 | Pauley et al. |
| 7,379,316 B2 | 5/2008 | Rajan |
| 7,386,656 B2 | 6/2008 | Rajan et al. |
| 7,392,338 B2 | 6/2008 | Rajan et al. |
| 7,411,858 B2 | 8/2008 | Ju |
| 7,472,220 B2 | 12/2008 | Rajan et al. |
| 7,532,537 B2 | 5/2009 | Solomon et al. |
| 7,619,912 B2 | 11/2009 | Bhakta et al. |
| 7,630,202 B2 | 12/2009 | Pauley et al. |
| 7,636,274 B2 | 12/2009 | Solomon et al. |
| 7,742,220 B2 | 6/2010 | Kogut et al. |
| 7,916,574 B1 | 3/2011 | Solomon et al. |
| 8,001,434 B1 | 8/2011 | Lee et al. |
| 8,072,837 B1 | 12/2011 | Solomon et al. |
| 8,081,535 B2 | 12/2011 | Bhakta et al. |
| 8,081,536 B1 | 12/2011 | Solomon et al. |
| 8,081,537 B1 | 12/2011 | Bhakta et al. |
| 8,264,903 B1 | 9/2012 | Lee et al. |
| 8,472,511 B2 | 6/2013 | Zerbe et al. |
| 8,489,837 B1 | 7/2013 | Lee |
| 9,111,608 B2 | 8/2015 | Best |
| 9,128,632 B2 | 9/2015 | Lee et al. |
| 9,135,206 B2 | 9/2015 | Oh et al. |
| 9,164,890 B2 | 10/2015 | Shin et al. |
| 9,342,453 B2 | 5/2016 | Nale |
| 9,357,649 B2 | 5/2016 | Chun |
| 9,811,263 B1 | 11/2017 | The |
| 2002/0112119 A1 | 8/2002 | Halbert et al. |
| 2002/0124153 A1 | 9/2002 | Litaize et al. |
| 2002/0144071 A1 | 10/2002 | Williams et al. |
| 2003/0012229 A1 | 1/2003 | Braun |
| 2003/0018880 A1 | 1/2003 | Litaize et al. |
| 2003/0074490 A1 | 4/2003 | Pochmuller |
| 2003/0120895 A1 | 6/2003 | Litaize et al. |
| 2003/0193927 A1 | 10/2003 | Hronik |
| 2003/0195714 A1 | 10/2003 | Djeddeloh |
| 2003/0229770 A1 | 12/2003 | Jeddeloh |
| 2004/0260891 A1 | 12/2004 | Jeddeloh et al. |
| 2004/0260909 A1 | 12/2004 | Lee et al. |
| 2004/0260957 A1 | 12/2004 | Jeddeloh et al. |
| 2004/0264255 A1 | 12/2004 | Royer |
| 2005/0005181 A1 | 1/2005 | Lee et al. |
| 2005/0044457 A1 | 2/2005 | Jeddeloh |
| 2005/0050255 A1 | 3/2005 | Jeddeloh |
| 2005/0060600 A1 | 3/2005 | Jeddeloh |
| 2005/0066137 A1 | 3/2005 | Jeddeloh et al. |
| 2005/0086417 A1 | 4/2005 | Meyer et al. |
| 2005/0086441 A1 | 4/2005 | Meyer et al. |
| 2005/0091464 A1 | 4/2005 | James |
| 2005/0190587 A1 | 9/2005 | Greeff |
| 2005/0257021 A1 | 11/2005 | James |
| 2006/0020492 A1 | 3/2006 | Goodwin et al. |
| 2006/0048385 A1 | 3/2006 | Cady et al. |
| 2006/0049500 A1 | 3/2006 | Goodwin |
| 2006/0049502 A1 | 3/2006 | Goodwin et al. |
| 2006/0049513 A1 | 3/2006 | Goodwin |
| 2006/0050488 A1 | 3/2006 | Goodwin |
| 2006/0050489 A1 | 3/2006 | Wehrly et al. |
| 2006/0050492 A1 | 3/2006 | Goodwin et al. |
| 2006/0050496 A1 | 3/2006 | Goodwin |
| 2006/0050497 A1 | 3/2006 | Goodwin |
| 2006/0050498 A1 | 3/2006 | Cady et al. |
| 2006/0050592 A1 | 3/2006 | Cady et al. |
| 2006/0053345 A1 | 3/2006 | Goodwin |
| 2006/0090102 A1 | 4/2006 | Wehrly et al. |
| 2006/0091529 A1 | 5/2006 | Wehrly et al. |
| 2006/0136683 A1 | 6/2006 | Meyer et al. |
| 2006/0198238 A1 | 9/2006 | Partridge et al. |
| 2007/0030752 A1 | 2/2007 | Yen et al. |
| 2007/0050530 A1 | 3/2007 | Rajan |
| 2007/0058471 A1 | 3/2007 | Rajan et al. |
| 2007/0115017 A1 | 5/2007 | Goodwin et al. |
| 2007/0192563 A1 | 8/2007 | Rajan et al. |
| 2007/0195613 A1 | 8/2007 | Rajan et al. |
| 2007/0204075 A1 | 8/2007 | Rajan et al. |
| 2007/0216445 A1 | 9/2007 | Raghavan et al. |
| 2007/0247194 A1 | 10/2007 | Jain |
| 2008/0010435 A1 | 1/2008 | Smith et al. |
| 2008/0025108 A1 | 1/2008 | Rajan et al. |
| 2008/0025122 A1 | 1/2008 | Schakel et al. |
| 2008/0025136 A1 | 1/2008 | Rajan et al. |
| 2008/0025137 A1 | 1/2008 | Rajan et al. |
| 2008/0027697 A1 | 1/2008 | Rajan et al. |
| 2008/0027702 A1 | 1/2008 | Rajan et al. |
| 2008/0027703 A1 | 1/2008 | Rajan et al. |
| 2008/0028135 A1 | 1/2008 | Rajan et al. |
| 2008/0028136 A1 | 1/2008 | Schakel et al. |
| 2008/0028137 A1 | 1/2008 | Schakel et al. |
| 2008/0031030 A1 | 2/2008 | Rajan et al. |
| 2008/0031072 A1 | 2/2008 | Rajan et al. |
| 2008/0037353 A1 | 2/2008 | Rajan et al. |
| 2008/0056014 A1 | 3/2008 | Rajan et al. |
| 2008/0062773 A1 | 3/2008 | Rajan et al. |
| 2008/0063251 A1 | 3/2008 | Deutsch |
| 2008/0082763 A1 | 4/2008 | Rajan et al. |

(56) References Cited

U.S. PATENT DOCUMENTS

| | | |
|---|---|---|
| 2008/0103753 A1 | 5/2008 | Rajan et al. |
| 2008/0104314 A1 | 5/2008 | Rajan et al. |
| 2008/0109206 A1 | 5/2008 | Rajan et al. |
| 2008/0109595 A1 | 5/2008 | Rajan et al. |
| 2008/0109597 A1 | 5/2008 | Schakel et al. |
| 2008/0109598 A1 | 5/2008 | Schakel et al. |
| 2008/0115006 A1 | 5/2008 | Smith et al. |
| 2008/0120443 A1 | 5/2008 | Rajan et al. |
| 2008/0123459 A1 | 5/2008 | Rajan et al. |
| 2008/0126687 A1 | 5/2008 | Rajan et al. |
| 2008/0126688 A1 | 5/2008 | Rajan et al. |
| 2008/0126689 A1 | 5/2008 | Rajan et al. |
| 2008/0126690 A1 | 5/2008 | Rajan et al. |
| 2008/0126692 A1 | 5/2008 | Rajan et al. |
| 2008/0133825 A1 | 6/2008 | Rajan et al. |
| 2008/0170425 A1 | 7/2008 | Rajan |
| 2008/0239857 A1 | 10/2008 | Rajan et al. |
| 2008/0239858 A1 | 10/2008 | Rajan et al. |
| 2009/0024789 A1 | 1/2009 | Rajan et al. |
| 2009/0024790 A1 | 1/2009 | Rajan et al. |
| 2009/0049269 A1* | 2/2009 | Kirsch ............... G06F 13/4239 711/202 |
| 2011/0041005 A1 | 2/2011 | Selinger |
| 2011/0082971 A1* | 4/2011 | Berke ............... G11C 8/12 711/105 |
| 2015/0134857 A1 | 5/2015 | Hahn |
| 2015/0255156 A1 | 9/2015 | Chen |
| 2016/0132240 A1 | 5/2016 | Berke et al. |
| 2017/0322726 A1* | 11/2017 | Walker ............... G06F 12/00 |
| 2017/0357604 A1* | 12/2017 | Lim ............... G06F 12/0879 |
| 2017/0371815 A1 | 12/2017 | Liu |
| 2018/0004688 A1 | 1/2018 | Chung |

FOREIGN PATENT DOCUMENTS

| | | |
|---|---|---|
| WO | WO 2007/28109 | 3/2007 |
| WO | WO 2007/95080 | 8/2007 |
| WO | WO 2011/08580 | 1/2011 |

OTHER PUBLICATIONS

"DDR4 Registering Clock Driver—DDR4RCD01," JEDEC Standard, JESD82-31, Aug. 15, 2016.

DDR4 SDRAM Load Reduced DIMM Design Specification JEDEC Standard, No. 21C, Revision 1.00, Aug. 2015, 41 pages.

DDR4 SDRAM UDIMM Design Specification, JEDEC Standard, No. 21C, Revision 1.20, Jun. 2016, 40 pages.

"DDR4 SDRAM," JEDEC Solid State Technology Association, (Revision of JESD79-4, Sep. 2012), Nov. 2013, 217 pages.

"JEDEC Announces Support for NVDIMM Hybrid Memory Modules," JEDEC, May 26, 2015, printed from the internet on Aug. 16, 2016, at https://www.jedec.org/news/pressreleases/jedec-announces-support-nvdimm-hybrid-memory-modules, 3 pages.

"You Need More Memory," Diablo Technologies, printed from the internet on Aug. 23, 2016 at http://www.diablo-technologies.com/memory1/, 5 pages.

SAINIO, et al., "The Evolution, Functionality and Benefits of NVDIMMs for Storage and Server Applications," SNIA, Jun. 30, 2015, 35 pages.

Simmtester.com, "What is Hybrid DIMM Memory Module?", DocMemory, 2013, printed from the internet on Aug. 23, 2016 at http://www.simmtester.com/page/news/printerFormat.asp?num=180&md=814116, 2 pages.

Wikipedia, "ULLtraDIMM", Jan. 6, 2015, printed from the internet on Aug. 23, 2016 at https://en.wikipedia.org/wiki/ULLtraDIMM, 2 pages.

Office Action from U.S. Appl. No. 15/297,953, dated Mar. 19, 2018, 22 pages.

Office Action from U.S. Appl. No. 15/297,971, dated Jan. 25, 2018, 16 pages.

Office Action from U.S. Appl. No. 15/297,982, dated Jan. 31, 2018, 22 pages.

Office Action from U.S. Appl. No. 15/298,025, dated Feb. 26, 2018, 17 pages.

U.S. Appl. No. 14/943,925, filed Nov. 17, 2015, entitled "Driver-Less Storage Device Using Serially-Attached Non-Volatile Memory," 23 pages.

U.S. Appl. No. 15/297,953, filed Oct. 19, 2016, entitled "Media Controller and Method for Management of CPU-Attached Non-Volatile Memory," 56 pages.

U.S. Appl. No. 15/297,971, filed Oct. 19, 2016, entitled "Electrically-Buffered NV-DIMM and Method for Use Therewith," 86 pages.

U.S. Appl. No. 15/297,982, filed Oct. 19, 2016, entitled "Storage System with Integrated Components and Methods for Use Therewith," 111 pages.

U.S. Appl. No. 15/298,025, filed Oct. 19, 2016, entitled "Media Controller with Response Buffer for Improved Data Bus Transmissions and Method for Use Therewith," 98 pages.

* cited by examiner

STORAGE SYSTEM WITH MULTIPLE COMPONENTS AND METHOD FOR USE THEREWITH

CROSS-REFERENCE TO RELATED APPLICATION

This application is a continuation of application Ser. No. 15/297,993, filed on Oct. 19, 2016, now U.S. Pat. No. 10,679,722, which claims the benefit of U.S. Provisional Application No. 62/380,239, filed on Aug. 26, 2016, the entirety of each of which is incorporated herein by reference for all purposes.

BACKGROUND

Many computer systems use one or more dual in-line memory modules (DIMMs) attached to a central processing unit (CPU) to store data. Some DIMMs contain dynamic random-access memory (DRAM) chips. However, DRAM is relatively expensive, requires a relatively-large amount of power, and is failing to scale capacity at a rate matching processor power, which can be undesirable when used in servers, such as enterprise and hyperscale systems in data centers where vast amounts of data are stored. To address these issues, non-volatile DIMMs (NV-DIMMs) have been developed, which replaces volatile DRAM chips with non-volatile memory devices. As compared to DRAM-based DIMMs, NV-DIMMs can provide lower cost per gigabyte, lower power consumption, and longer data retention, especially in the event of a power outage or system crash. Like some DRAM-based DIMMs, some NV-DIMMs are designed to communicate over a clock-data parallel interface, such as a double-data rate (DDR) interface.

DETAILED DESCRIPTION

Overview

Figure 1:
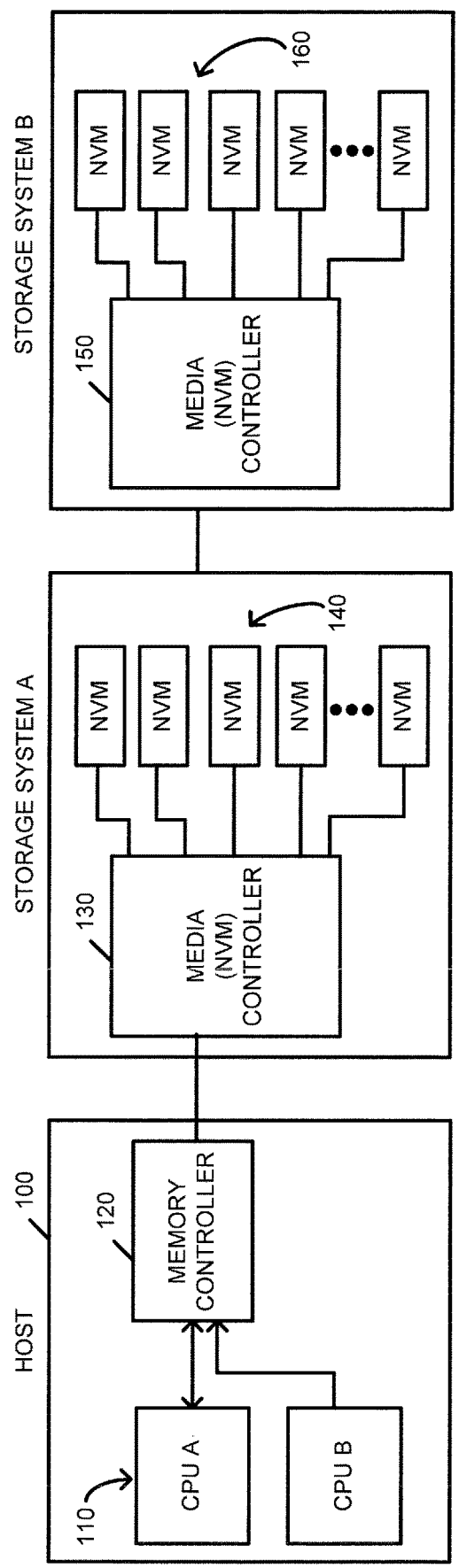
FIG. 1 is a block diagram of a host and storage systems of an embodiment

By way of introduction, the below embodiments relate to a storage system with several integrated components and method for use therewith. In one embodiment, a storage system comprising: a plurality of non-volatile memory devices; a controller in communication with the plurality of non-volatile memory devices; a plurality of data buffers in communication with the controller and configured to store data sent between the controller and an input/output bus; and a command and address buffer configured to store commands and addresses sent from a host, wherein the command and address buffer is further configured to synchronize data flow into and out of the plurality of data buffer; wherein at least three of the above components are integrated with each other.

In some embodiments, the storage system further comprises a response buffer configured to store a ready signal sent from the controller after the controller reads data from the plurality of non-volatile memory devices in response to a read command from the host.

In some embodiments, the at least three components are integrated as two or more separate components on a same package.

In some embodiments, the at least three components are integrated as by having at least one of the components be part of an application-specific integrated circuit (ASIC) of another component.

In some embodiments, the controller is configured to associate read and/or write commands with identifiers so the read and/or write commands can be processed in a different order from an order in which they are received from the host.

In some embodiments, the command and address buffer comprises a registered clock driver.

In some embodiments, the plurality of data buffers comprise random access memory.

In some embodiments, the command and address buffer is further configured to reduce a frequency of a clock received from the host.

In some embodiments, the command and address buffer is further configured to perform bandwidth conversion.

In some embodiments, physical and command layers of the storage system are configured to be compatible with a DRAM DIMM communication protocol.

In some embodiments, physical and command layers of the storage system are configured to be compatible with one or more of the following: unbuffered DIMM (UDIMM), registered DIMM (RDIMM), and load-reduced DIMM (LRDIMM).

In some embodiments, the controller is further configured to perform the following after the ready signal is sent to the host: receive a send command from the host; and in response to receiving the send command from the host, send the data to the host.

In some embodiments, the data is sent to the host after a time delay, and wherein the time delay is chosen based on a communication protocol used with the host.

In some embodiments, the controller is configured to communicate with the host using a clock-data parallel interface.

In some embodiments, the clock-data parallel interface comprises a double data rate (DDR) interface.

In some embodiments, at least one of the plurality of non-volatile memory devices comprises a three-dimensional memory.

Other embodiments are possible, and each of the embodiments can be used alone or together in combination.

General Introduction to One Implementation of One Embodiment

As explained in the background section above, dual in-line memory modules (DIMMs) can be attached to a central processing unit (CPU) of a host to store data. Non-volatile dual in-line memory modules (NV-DIMMs) have been developed to replace volatile DRAM chips on standard DIMMs with non-volatile memory devices, such as NAND. As compared to DRAM-based DIMMs, NV-DIMMs can provide lower cost per gigabyte, lower power consumption, and longer data retention, especially in the event of a power outage or system crash. Like some DRAM-based DIMMs, some NV-DIMMs are designed to communicate over a clock-data parallel interface, such as a double-data rate (DDR) interface.

However, existing standards that are appropriate for DRAM-based DIMMs may not be appropriate for NV-DIMMs. For example, some existing standards require read and write operations to be completed within a specified ("deterministic") amount of time. While completing read and write operations in the specified amount of time is typically not a problem for DRAM memory, the mechanics of reading and writing to non-volatile memory can cause delays that exceed the specified amount of time. That is, DRAM-based DIMM protocols expect consistent, predictable, and fast responses, which non-volatile memory may not be able to provide. To account for this, some emerging standards (e.g., JEDEC's NVDIMM-P standard) allow for "non-deterministic" read and write operations to put "slack" in the communication between the storage system and the host. Under such standards, read and write operations to the NV-DIMM are not required to be completed by a certain amount of time. Instead, in the case of a read operation, the NV-DIMM informs the host when the requested data is ready, so the host can then retrieve it. In the case of a write operation, the host can be restricted from having more than a certain number of write commands outstanding to ensure that the non-volatile memory device does not receive more write commands than it can handle.

The approach of allowing non-deterministically timed operations at a protocol level is just one possible approach for dealing with the unpredictable nature of non-volatile memories. Other approaches do not take advantage of non-deterministic modifications to the DDR standard. Instead, they rely on software approaches to construct compound read and write procedures out of conventional DDR primitives. Each DDR primitive may correspond either to a direct access to the non-volatile memory itself, or it may correspond to indirect operations performed via the use of intermediate circuit elements, such as control registers or buffers. Though the read or write algorithms themselves may require an unspecified number of iterations or DRR commands to complete and thus may not complete within a specific timeframe—each individual primitive DDR operation completes within the well-defined time limits set by the usual (deterministically-timed) DDR standards.

Some of the following embodiments take advantage of the non-deterministic aspect of the emerging standard to allow the NV-DIMM to perform time-consuming actions that it may not have the time to do under conventional, DRAM-based DIMM standards. These actions will sometimes be referred to herein as operations having an undetermined duration from the host's perspective and may include memory and data management operations. These memory and data management operations may be important to the operation of the NV-DIMM. For example, as compared to DRAM, a non-volatile memory device can have lower endurance (i.e., number of writes before failure) and less reliably store data (e.g., because of internal memory errors that cause bits to be stored incorrectly). These issues may be even more pronounced with emerging non-volatile memory technologies that would likely be used as a DRAM replacement in an NV-DIMM. As such, in one embodiment, the NV-DIMM takes advantage of not being "under the gun" to perform operations having an undetermined duration from the host's perspective, such as memory and data management operations (e.g., wear leveling and error correction operations) that it may not be able to perform in the allotted time under conventional, DRAM-based DIMM standards.

It should be noted that this introduction merely discusses one particular implementation of an embodiment and that other implementations and embodiments can be used, as discussed in the following paragraphs. Further, while some of these embodiments will be discussed in terms of an NV-DIMM attached to a CPU of a host, it should be understood that any type of storage system can be used in any suitable type of environment. Accordingly, specific architectures and protocols discussed herein should not be read into the claims unless expressly recited therein.

General Discussion of Clock-Data Parallel Interfaces and New Protocols

Clock-data parallel interfaces are a simple way of transferring digitized data and commands between any two devices. Any transmission line carrying data or commands from one device to the other are accompanied by a separate "clock" transmission-line, which provides a time-reference for sampling changes in the data and command buses. In some embodiments, the clock may be deactivated when the interface is inactive, transmitting no data or commands. This provides a convenient way of reducing power dissipation when inactive. In some embodiments of clock-data parallel interfaces, the clock is a single-ended transmission-line, meaning that the clock consists of one additional transmission line, whose voltage is compared to a common voltage reference shared by many transmission lines travelling between the CPU and memory devices. In other embodiments, the timing reference might be a differential clock, with both a positive clock reference and a clock complement, which switches to a low voltage simultaneously with every low-to-high-voltage switch of the positive clock—an event known as the "rising-edge" of the clock—and conversely the clock complement switches to high-voltage state with every high-to-low-voltage transition of the positive clock reference—and event known as the "falling-edge" of the clock. Clock-data parallel interfaces are often classified by how many beats of data are sent along with the clock. In "single-data rate" or SDR interfaces, the command or data buses transition once per clock cycle, often with the rising edge of the reference clock. In "double-data rate" or DDR interfaces, the command and data buses send twice as much data per clock period, by allowing the command and data buses to switch twice per period, once on the rising edge of the clock, and once on the falling edge of the clock. Furthermore, there are quad-data rate (QDR) protocols, which allow for four data or command transitions per clock. Typically, clock-data parallel interfaces are, by their simplicity, efficient and low latency, and the receiver circuitry may be as simple as a single bank of logic flip-flops. However, there may be additional complexity induced by the need to synchronize the newly-latched data with the internal clock of the devices themselves, one of the many jobs handled by a collection of signal conditioning circuits known as the "physical communication layer" or simply "Phy Layer."

Serial interfaces, by contrast, typically rely on clock-data recovery processes to extract the time-reference from a single electrical transmission line, which switches voltage at regular time intervals, but in such a pattern that also communicates commands and/or data (in some embodiments, many different lines are run in parallel for increased bandwidth, and thus each line may encode data for an entire command, and entire sequence of data, or just a portion of a command or data sequence). Encoding the clock and the data in the same physical transmission line reduces timing uncertainties caused by mismatched delays between clock and data or command lines and thus allows for clock frequencies of 25 GHz or higher, for very-high bandwidth communication. However, such interfaces also have some disadvantages. Due to the nature of clock-data recovery, the transmission line must remain active continuously in order to maintain synchronization of the inferred clock reference between the communication partners. Power-saving modes are possible, but re-entering the active mode requires significant retraining delays. Moreover, the very nature of clock-data recovery requires slightly more time to decode each message, and one-way communication delays are common for even a well-trained serial link. This adds extra latency to any data request.

The interface between computer CPUs and their corresponding memory devices is one example of an interface where optimization of both power and latency are desired. So, though there exists high bandwidth serial CPU-memory interfaces, such as Hybrid Memory Cube, the bulk of contemporary interfaces between CPUs and memory devices still use clock-data parallel interfaces. For instance, synchronous dynamic random access memory (SDRAM) uses a single clock to synchronize commands on a command bus consisting of a plurality of transmission lines, each encoding one-bit of command-sequence information. Depending on the embodiment, commands in a SDRAM command sequence may include, but are not limited to, the following: activate a row of cells in a two-dimensional data array for future reading or writing; read some columns in a currently-active row; write some columns in a currently-active row; select a different bank of cells for reading or writing; write some bits to the memory mode registers to change aspects of the memory device's behavior; and read back values from the mode registers to identify the status of the memory device.

Data associated with these commands is sent or received along a separate data bus consisting of a separate and parallel plurality of data transmission lines, referred to as the DQ bus. In some embodiments, the DQ bus may be half-duplex and bi-directional, meaning that the same lines are used for receipt and transmission of data, and data cannot be simultaneously sent from the memory device to the CPU while data is flowing in the opposite direction, nor vice-versa. In other embodiments, the DQ bus may be full-duplex with separate lines for receipt or transmission of data. The data on the DQ bus may be safely assumed to be synchronous with the device command clock. However, for longer transmission lines or faster operational frequencies, this may lead to poor synchronization. Thus, other embodiments exist where the overall DQ bus is subdivided into a plurality of smaller DQ groups, each with its own "DQ strobe" signal, DQS, which serves as a separate timing reference for the wires in that DQ group. For instance, in one embodiment, a 64-bit DQ bus may be divided into 8 groups (or "bytelanes") of 8 DQ-lines in each, each synchronized by its own DQS strobe. The DQS strobes may be differential or single-ended, depending on the embodiment. In some embodiments, some DQ lines may provide encode for not just data stored by the host, but also additional parity or other signal data for the purpose of recording additional error correcting codes. Depending on the embodiment, many DDR protocols have a range of other control signal transmission lines driven by CPU to the memory device, which for example may, in some embodiments, command the functions include but are not limited to: Command Suppression lines (CS_N), Clock Enable (CKE), or enablement of on-die termination (ODT).

An electronic system may consist of one or a plurality of data processing elements—where the act of processing may include computation, analysis, storage of data or transmission of the data over a network or peripheral bus—attached to a plurality of memory devices. Examples of data processing elements include, but are not limited to, CPUs, CPU caches, application-specific integrated circuits, peripheral buses, Direct Memory Access (DMA) engines, or network interface devices. In the many DRAM configurations, a plurality of memory circuits are bundled together into modules; for example, in modules described by the dual-inline memory module (DIMM) standard. Within a module, some devices may transmit data in parallel along separate DQ groups, while others may be all be connected in parallel to the same transmission lines within a DQ group. Again, in many typical DRAM configurations, a plurality of modules then may be connected in parallel to form a channel. In addition to the memory modules, each channel is connected to exactly one data processing element, hereafter referred to as the host. Each memory device may be connected to the host via a portion of a half-duplex DQ bus (as opposed to a full-duplex DQ bus) or may furthermore be attached to the same DQ transmission lines as several other memory devices—either on the same module or on other adjacent modules in the same channel. Therefore, there is the risk that a memory device could choose to assert data on the DQ bus or at the same time as other memory devices on the same bus, and thus there is need for arbitration on the bus. Therefore, SDRAM protocols rely on a centralized, time-windowed, bus allocation scheme: the host by default is the only device permitted to transmit data on the DQ bus, and by default all memory devices leave their DQ lines high-impedance most of the time. When a command requiring a response is sent to a particular memory device, that device is permitted to transmit data on the DQ bus but only within a certain window of time following the first pulse of the command. The window starts a fixed number of clock cycles after the command and has a typical duration of just one or two clock-cycles longer than the time required to transmit the data. Memory devices transmitting data outside this window will either fail to get their data to the host successfully, or will corrupt data coming back from adjacent memory devices.

The DQ bus arbitration scheme used by these clock-data parallel SDRAM protocols works well for DRAM. The technology behind DRAM devices has advanced to the point where their data access times are extremely consistent and predictable. DRAM however is a relatively power-hungry technology, as it requires frequent refresh thousands of times a second.

Non-volatile memories such as phase-change random access memory (PCM), oxidative resistive random access memory (OxRAM or ReRAM), conductive-bridge random access memory (CBRAM), NAND Flash (NAND), magnetic tunnel junction-based magnetic random access memory (MRAM), memristor, NOR Flash (NOR), spin torque-transfer magnetic memory (STT-MRAM), and ferroelectric random-access memory (FeRAM), all promise low-latency data access for data, can be optimized for lower power-consumption for many data heavy workloads, and may soon offer random-access storage at higher density than DRAM. However, they require slightly more relaxed data-access protocols than DRAM. All of these non-volatile memories exhibit non-deterministic read and write latencies. It is impossible to accurately know at the time a read or write command is written how long it would take to access or commit the data to or from a cell of non-volatile memory for all NVM choices and for all NVM device architectures. However, it is possible to mimic deterministic latencies. Deterministic latencies may be mimicked by assuming worst case timing conditions or giving up on a read that may be taking too long. Modifications of the DDR SDRAM protocols could be specified based on pessimistic read or write latency specifications. For example, a memory that commits most writes within 100 ns, but occasionally takes 10 us to commit data for unpredictable reasons, could use a DDR protocol that does not allow writes for a whole 10 us after the previous write, and does not allow reads in this period also (since for some memory technologies writes mean that reads must also be delayed). This however would present a dramatic limit to the maximum bandwidth achievable by such a device, and furthermore, could limit the performance of other devices on the same channel. Conversely, one can imagine a modification of the standard DDR or SDR or QDR SDRAM protocols that allow flexibility for non-deterministic read latencies and non-deterministic write latencies. In one embodiment, this protocol is referred to as a synchronous non-volatile RAM (hereafter SNVRAM) protocol.

For example, in some embodiments of SNVRAM protocols, the read command may be split into three smaller commands. Where before a read command-sequence consisted of two-parts: an activate command, followed by a read to specify the row and column of the data requested, the command would now consist of an activate command, a read command, and finally—after some undetermined delay—a send command. The activate/read combination would specific the two part request to read a specific region. However, no response would be sent following the read command; instead, the memory device would assert a signal, called for example "READ READY" (sometimes referred to herein as "R_RDY"), back to the host at some non-determined time after the read command. This assertion would then prompt the host to issue the SEND command as other SDRAM activity is allowed to transfer the completely extracted data from the memory device back to the host. The response from the SEND command would go out over the shared DQ bus within predetermined window following the SEND command. In this way, the typical read command would support non-deterministic read latencies; however, performance characteristics such as the average minimum latency or overall bandwidth of the system is not limited by the slowest possible read. The average performance of the protocol matches the typical performance of the device while still allowing some flexibility for outliers which are clearly expected as a physical consequence of the choice of media.

In one embodiment, the SNVRAM includes the following characteristics:
  Much like existing SDRAM or DDR protocols, it supports communication between a single host and a plurality of memory devices on the same memory channel. Hosts may be attached to separate memory channels, though each channel operates independently, and thus the protocol does not specify the behavior of devices in other channels. Transmission lines for the operation of one channel can be used exclusively by that channel. In other embodiments, the host may attach to a single memory device, and that memory device may relay the commands and data on to a second device in a chained style of deployment.

As in existing SDRAM or DDR protocols, each signal or bus from the host to the channel can be synchronous to a clock signal following a parallel transmission line.

As in existing SDRAM or DDR protocols, there exist logical commands such as "activate address block," "read element within active address block," or "write to element within active address block" which can be sent along a command bus.

As in existing SDRAM or DDR protocols, the command bus can be synchronized to a master clock or master command strobe for the channel.

As in existing SDRAM or DDR protocols, data returning from the memory device can be sent along a separate data bus, which consists of a plurality of transmission lines referred to as the DQ bus.

As in existing SDRAM or DDR protocols, each line in the DQ bus may be synchronous to the master clock in some embodiments. In other embodiments, the DQ bus is synchronous to a separated DQ strobe signal (generated either by the host or by the memory device), here after labelled DQS. There may be multiple DQS lines in some embodiments, each corresponding to a subset of the DQ bus lines.

As in existing SDRAM or DDR protocols some embodiments exist in which the DQ bus may be bidirectional, and may accommodate storable data from the host to the memory device. Other embodiments may include a separate write DQ bus.

As in existing SDRAM or DDR protocols, data from the host to the memory device on a DQ bus can be transmitted synchronous with either the master clock or the appropriate DQS lines, depending on the embodiment under consideration.

As in existing SDRAM or DDR protocols, the DQ buses may be attached to multiple memory devices in addition to the single host. Arbitration on this bus is done on the basis of time-windows. When a memory device receives from the host a command requiring a response, it has a narrow window of time in which it owns the DQ-bus and may assert data.

As in existing SDRAM or DDR protocols, within a channel, memory devices may be grouped together as a plurality to form coordinated modules.

SNVRAM protocols are typically unique from SDRAM protocols in that there are additional control lines sending signals from the storage system to the host. (Typical SDRAM interfaces only include control signals sent from the host to the storage system). These additional control lines are hereafter referred to as the "response bus" (or RSP). The response bus may be synchronous to the master clock in some embodiments, or in other embodiments may have its own strobe signal generated by the memory module. The response bus includes, but is not limited to, signals, which for our purposes are here identified as "READ READY" (R_RDY) and "WRITE CREDIT INCREMENT." (WC_INC). However, it should be noted that different embodiments of SNVRAM protocols may have electrical signals with similar functions, though the protocol may refer to them by a different name. Accordingly, it should be understood that specific signal names used herein are merely examples.

In some embodiments of NVRAM protocols, the response bus may be shared by all modules in a channel and arbitrated by the host, or in other embodiments the response bus may consist of distinct transmission lines—not shared between any modules—passing only from each module to the host, not making electrical contact with any other modules.

Just as different embodiments of the SDRAM or DDR protocols transmit data at protocol-specified rates, data on any command bus may be specified for transmission at SDR, DDR, or QDR rates by the particular protocol embodiment Data on any command bus, clocks or strobes may be sent single-ended or differentially, depending on the specifications included by the embodiment of the SNVRAM protocol SNVRAM protocols provide a simple way of accommodating the irregular behavior of nondeterministic non-volatile media without unnecessarily restricting their bandwidth. However, there are many other opportunities that can be realized by such protocols. In addition to compensating for non-deterministic behavior of the memory, these protocols also can be used to provide time for various maintenance tasks and data quality enhancements, such as error correction, I/O scheduling, memory wear-leveling, in-situ media characterization, and logging of controller-specific events and functions. Once the hardware implementing these functions becomes more complex, contention for hardware resources performing these functions become another potential source of delays. All such delays can cause significant performance or reliability issues when using a standard SDRAM communication protocol. However, the use of non-deterministically timed SNVRAM protocol allows for flexible operation and freedom of hardware complexity. Furthermore, non-deterministic read-timings allow for the possibility of occasional faster read response through caching.

Discussion of the Drawings

Turning now to the drawings, FIG. 1 is a block diagram of a host 100 in communication with storage systems of an embodiment. As used here, the phrase "in communication with" could mean directly in communication with or indirectly in communication with through one or more components, which may or may not be shown or described herein. In this illustration, there are two storage systems shown (storage system A and storage system B); however, it should be understood that more than two storage systems can be used or only one storage system can be used. In this embodiment, the host 100 comprises one or more central processing units (CPUs) 110 and a memory controller 120. In this illustration, there are two CPUs (CPU A and CPU B); however, it should be understood that more than two CPUs can be used or only a single CPU can be used. The memory controller may also be connected to devices other than just CPUs and may be configured to relay memory requests on behalf of other devices, such as, but not limited to, network cards or other storage systems (e.g., a hard drive or a solid-state drive (SSD)). Furthermore, the memory controller may relay memory requests on behalf of one or more software applications running on the CPU, which sends requests to the memory controller 120 for access to the attached storage systems.

In this embodiment, the host 100 also comprises a memory controller 120 in communication with the CPUs 110 (although, in other embodiments, a memory controller is not used), which communicates with the storage systems using a communication interface, such as a clock-data parallel interface (e.g., DDR) and operates under a certain protocol (e.g., one set forth by the Joint Electron Device Engineering Council (JEDEC)). In one embodiment, the memory controller 120 correlates access requests to the storage systems from the CPUs 110 and sorts out replies from the storage systems and delivers them to the appropriate CPUs 110.

As also shown in FIG. 1, storage system A comprises a media (non-volatile memory) controller 130 in communication with a plurality of non-volatile memory devices 140. In this embodiment, storage systems A and B contain the same components, so storage system A also comprises a media (non-volatile memory) controller 150 in communication with a plurality of non-volatile memory devices 160. It should be noted that, in other embodiments, the storage systems can contain different components.

The media controller 130 (which is sometimes referred to as a "non-volatile memory (NVM) controller" or just "controller") can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 130 can be configured with hardware and/or firmware to perform the various functions described below and shown in the flow diagrams.

In general, the controller 130 receives requests to access the storage system from the memory controller 120 in the host 100, processes and sends the requests to the non-volatile memories 140, and provides responses back to the memory controller 120. In one embodiment, the controller 130 can take the form of a non-volatile (e.g., flash) memory controller that can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when the host 100 needs to read data from or write data to the non-volatile memory, it will communicate with the non-volatile memory controller. If the host 100 provides a logical address to which data is to be read/written, the flash memory controller can convert the logical address received from the host 100 to a physical address in the non-volatile memory. (Alternatively, the host 100 can provide the physical address.) The non-volatile memory controller can also perform various operations having an undetermined duration from the host's perspective, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). More information about one particular embodiment of the controller 130 is set forth below in conjunction with FIG. 6.

A non-volatile memory device 140 can also take any suitable form. For example, a non-volatile memory device 140 can contain a single memory die or multiple memory dies, and can be equipped with or without an internal controller. As used herein, the term "die" refers to the collection of non-volatile memory cells, and associated circuitry for managing the physical operation of those non-volatile memory cells, that are formed on a single semiconductor substrate. A non-volatile memory die 104 may include any suitable non-volatile storage medium, including NAND flash memory cells, NOR flash memory cells, PCM, RRAM, OxRAM, CBRAM, MRAM, STT-RAM, FeRAM, or any other non-volatile technology. Also, volatile storage that mimics non-volatility can be used, such as a volatile memory that is battery-backed up or otherwise protected by an auxiliary power source. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion. Some other memory technologies were discussed above, and additional discussion of possible memory technologies that can be used is provided below as well. Also, different memory technologies may have different algorithms (e.g., program in place and wear leveling) applicable to that technology.

For simplicity, FIG. 1 shows a single line connecting the controller 130 and non-volatile memory device 140, it should be understood that that connection can contain a single channel or multiple channels. For example, in some architectures, 2, 4, 8, or more channels may exist between the controller 130 and a memory device 140. Accordingly, in any of the embodiments described herein, more than a single channel may exist between the controller 130 and the memory device 140, even if a single channel is shown in the drawings.

Figure 2A:
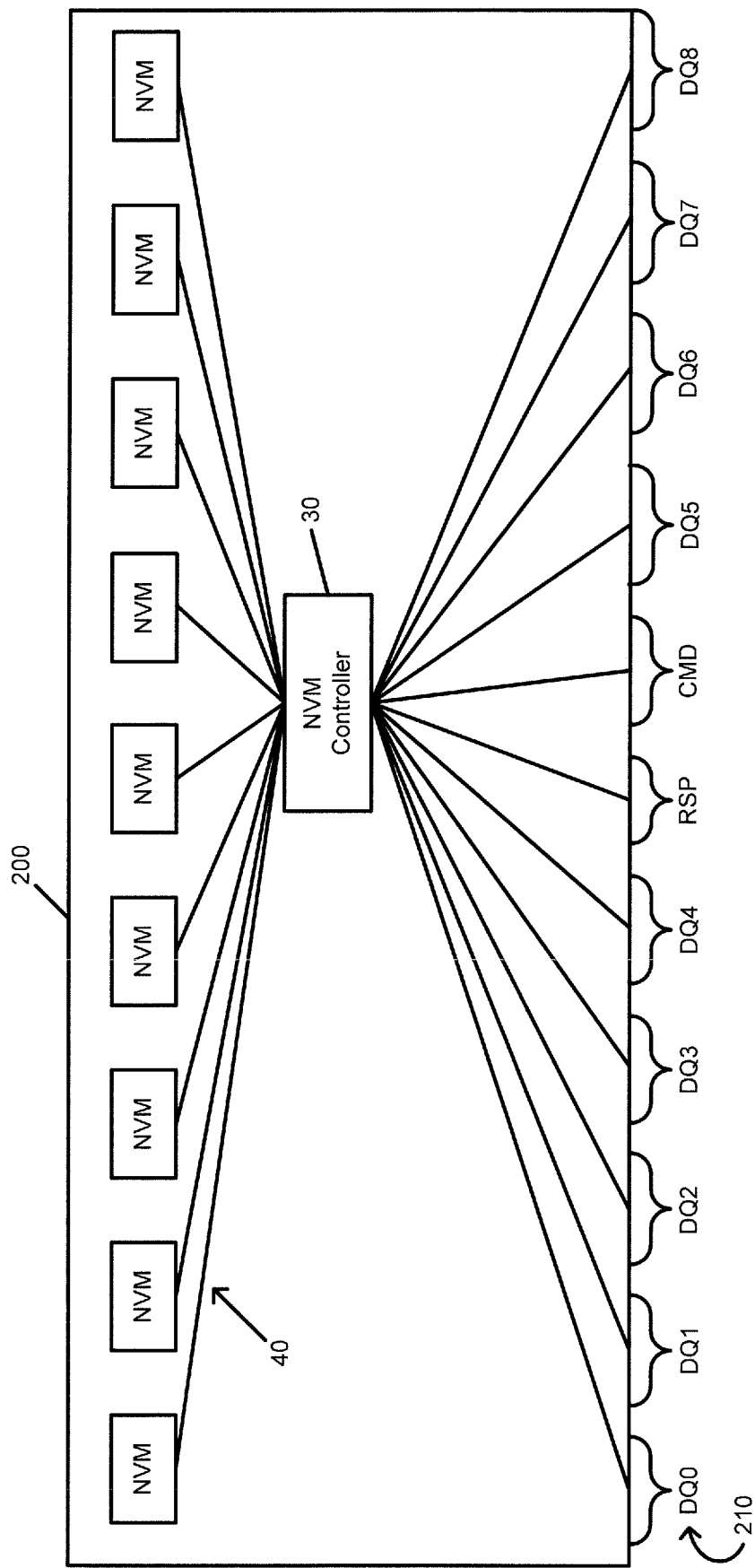
FIG. 2A is a block diagram of a storage system of an embodiment in which the storage system takes the form of a non-volatile dual in-line memory module (NV-DIMM).
Figure 2B:
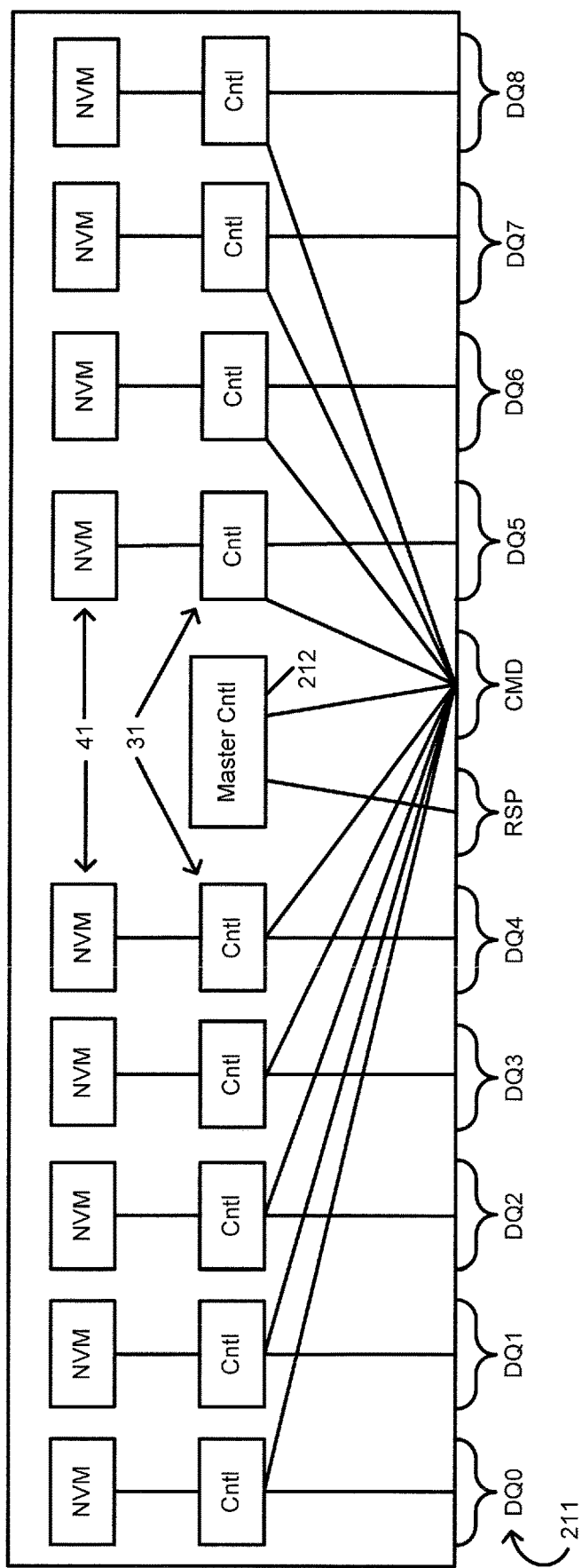
FIG. 2B is a block diagram of a storage system of an embodiment having a distributed controller.

The host 100 and storage systems can take any suitable form. For example, in one embodiment (shown in FIG. 2A), the storage module takes the form of a non-volatile dual in-line memory module (NV-DIMM) 200, and the host 100 takes the form of a computer with a motherboard that accepts one or more DIMMs. In the NV-DIMM 200 shown in FIG. 2A, there are nine non-volatile memory devices 40, and the NV-DIMM 200 has an interface 210 that includes 9 data input/output DQ groups (DQ0-DQ8), a command bus, and a response bus. Of course, these are merely examples, and other implementations can be used. For example, FIG. 2B shows an alternate embodiment, in which the storage system has a distributed controller 31 and a master controller 212 (which, although not shown, connects to all the distributed controllers 31). As compared to the storage system in FIG. 2A, each NVM device 41 communicates with its own NVM controller 31, instead of all NVM devices communicating with a single NVM controller. In one embodiment, the master controller 212 does any synchronizing activity needed, including determining when all the distributed controllers 31 are read to send the RD_RDY signal, which will be discussed in more detail below.

Figure 3:
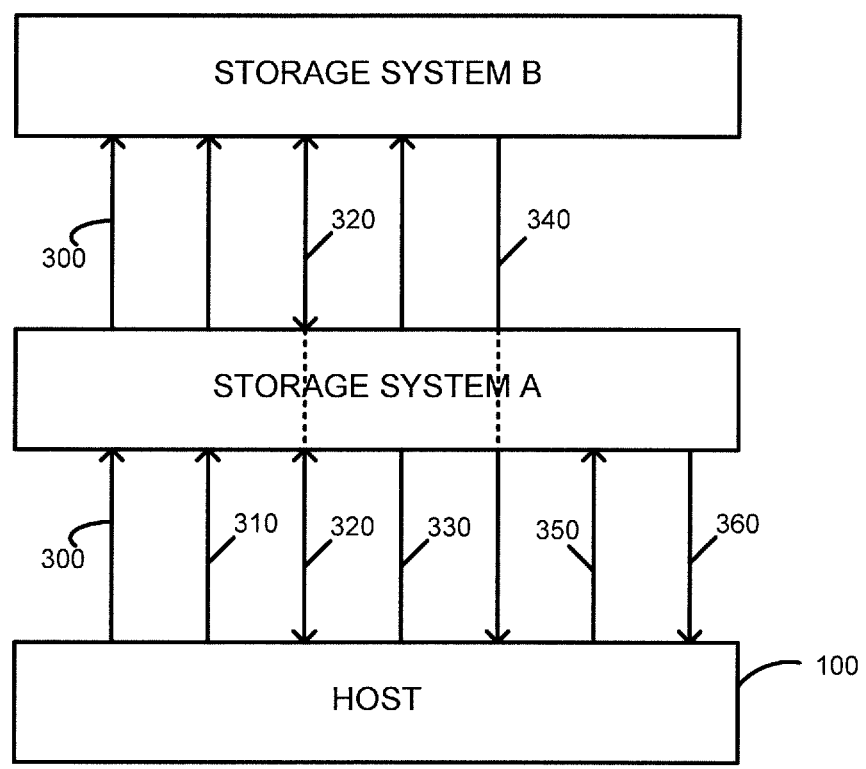
FIG. 3 is a block diagram showing signals between a host and storage systems of an embodiment.

As mentioned above, multiple storage systems can be used, in which signals can be passed through one storage system to reach another. This is shown in FIG. 3. In FIG. 3, storage system A is closer in line to the host 100 than storage system B. Arrow 300 represents shared memory input signals that are sent from the host 100 to the command pin in both the first and second storage systems. Examples of shared memory input signals that can be used include, but are not limited to, an address signal, a read chip select signal, a bank group signal, a command signal, an activate signal, a clock enable signal, a termination control signal, and a command identifier (ID) signal. Arrow 310 represents a memory channel clock, which can also be sent on the command pin. Arrow 320 represents shared memory output signals, which can be sent on the DQ0-DQ8 groups. Examples of shared memory output signals include, but are not limited to, data signals, parity signals, and data strobe signals. Arrow 330 represents dedicated memory input signals to storage system B, and arrow 350 represents dedicated memory input signals to storage system A. Examples of dedicated memory input signals, which can be sent on the command pin, include, but are not limited to, clock enable signals, data strobe, chip select signals, and termination control signals. Arrow 340 represents a device-dedicated response line to storage system B, and arrow 360 represents a device-dedicated response line to storage system A. Examples of signals send on the device-dedicated response lines, which can be sent on the command pin, include, but are not limited to, read data ready (R_RDY) signals, a read identifier (ID) signal, and a write flow control signal. These signals will be discussed in more detail below.

Figure 4:
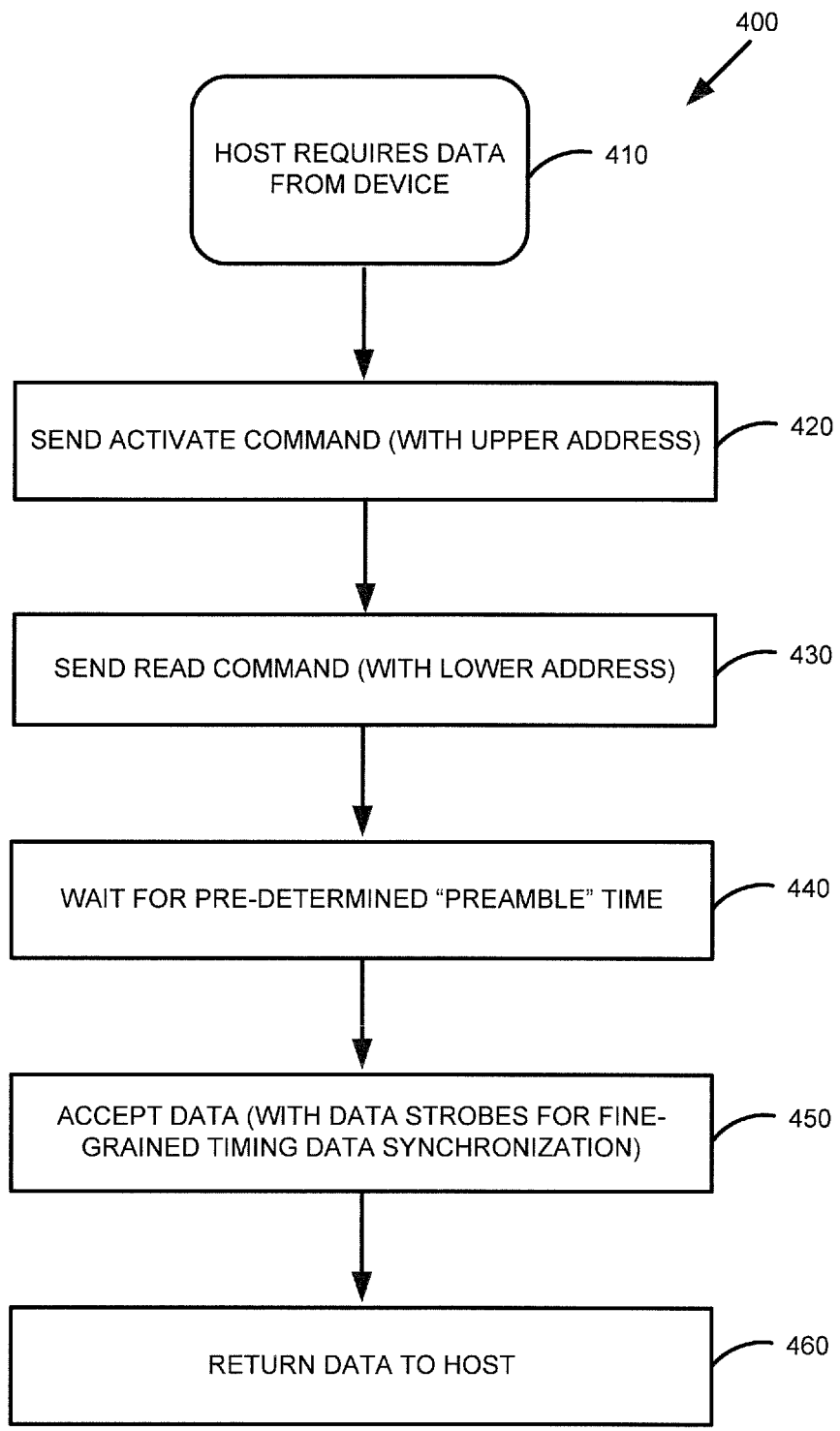
FIG. 4 is a flow chart of a method for reading data from a DRAM DIMM.
Figure 5:
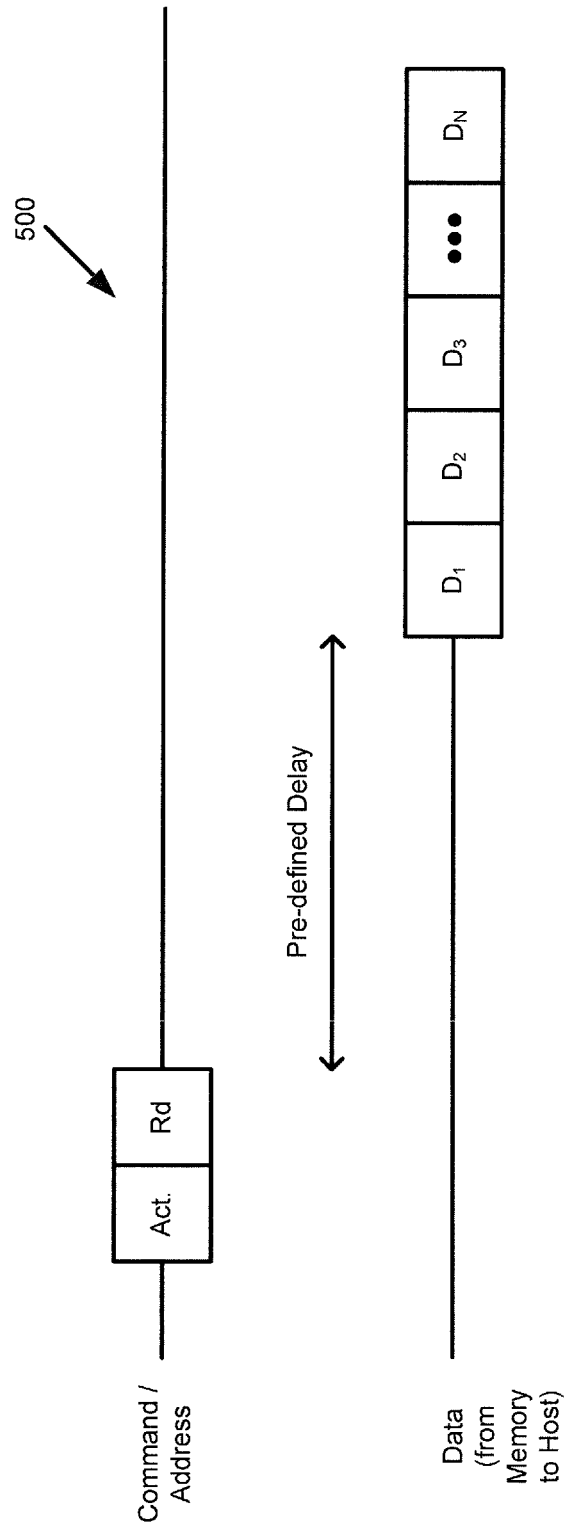
FIG. 5 is a timing diagram of a method for reading data from a DRAM DIMM.

One aspect of these embodiments is how the NVM controller 130 in the storage system handles read and write commands. Before turning to that aspect of these embodiments, the flow chart 400 in FIG. 4 will be discussed to illustrate how a conventional host reads data from a convention DDR-based DRAM DIMM. This flow chart 400 will be discussed in conjunction with the timing diagram 500 in FIG. 5. As shown in FIG. 4, when the host required data from the DIMM (referred to as the "device" in FIG. 4) (act 410), the memory controller in the host sends an activate command with the upper address (act 420). The memory controller in the host then sends a read command with the lower address (act 430). This is shown as the "Act" and "Rd" boxes on the command/address line in FIG. 5. The memory controller in the host then waits a predetermined amount of time (sometimes referred to as the "preamble time") (act 440). This is shown as "predefined delay" in FIG. 5. After the predetermined ("deterministic") amount of time has expired, the memory controller in the host accepts the data (with data strobes for fine grained timing synchronization) (act 450) (boxes D1-DN on the data line in FIG. 5), and the data is provided to the host (act 460).

As mentioned above, while this interaction between a host and the storage system is adequate with the storage system is a DRAM DIMM, complications can arise when using a deterministic protocol with an NV-DIMM because of the mechanics behind reading and writing to non-volatile memory can cause delays that exceed the amount of time specified for a read or write operation under the protocol. To account for this, some emerging standards allow for "non-deterministic" read and write operations. Under such standards, read and write operations to the NV-DIMM are not required to be completed by a certain amount of time.

Figure 6:
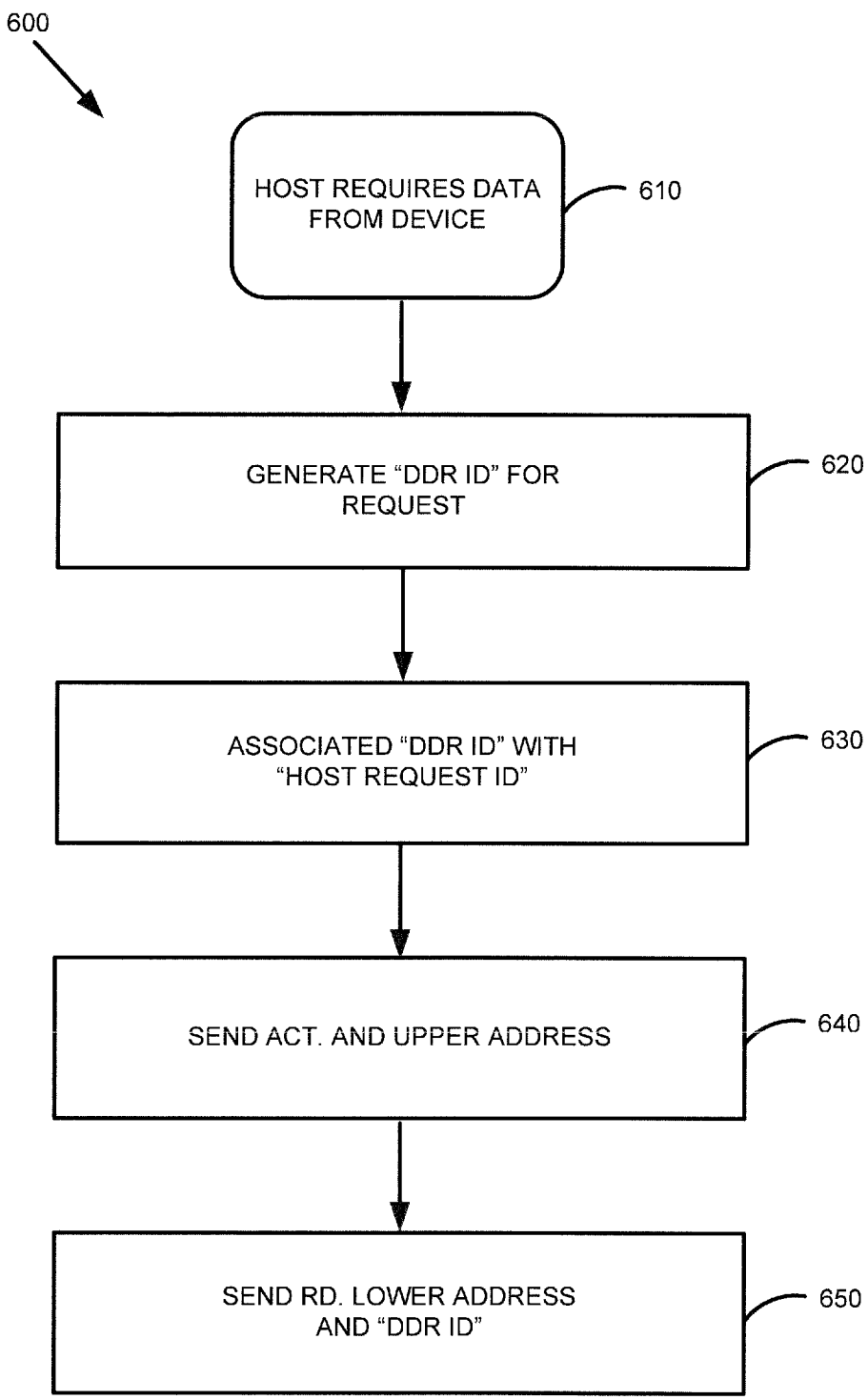
FIG. 6 is a flow chart of a method of an embodiment for a host to send a read command.
Figure 7:
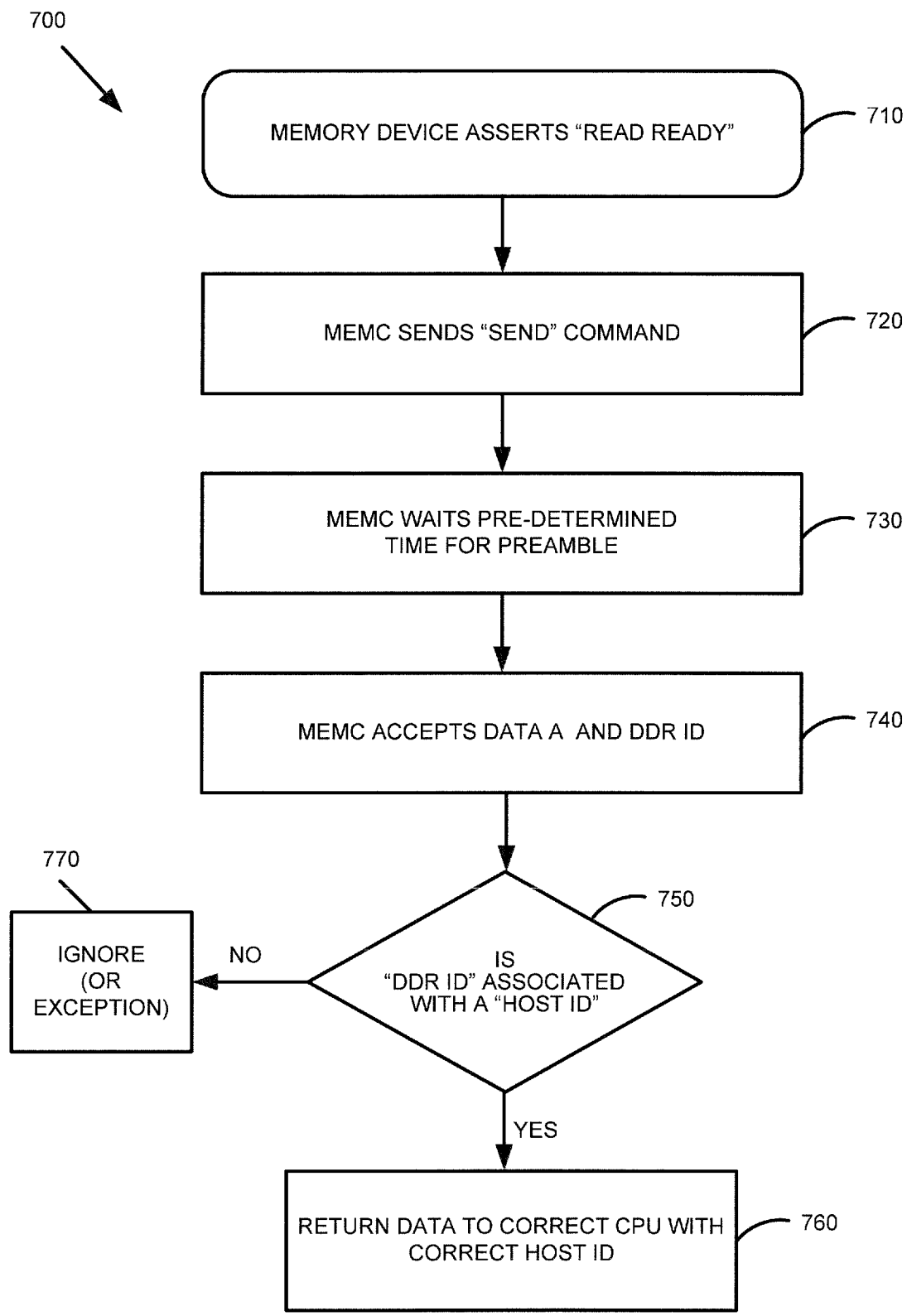
FIG. 7 is a flow chart of a method of an embodiment for a host to request a return of read data by utilizing a send command and process received data.
Figure 8A:
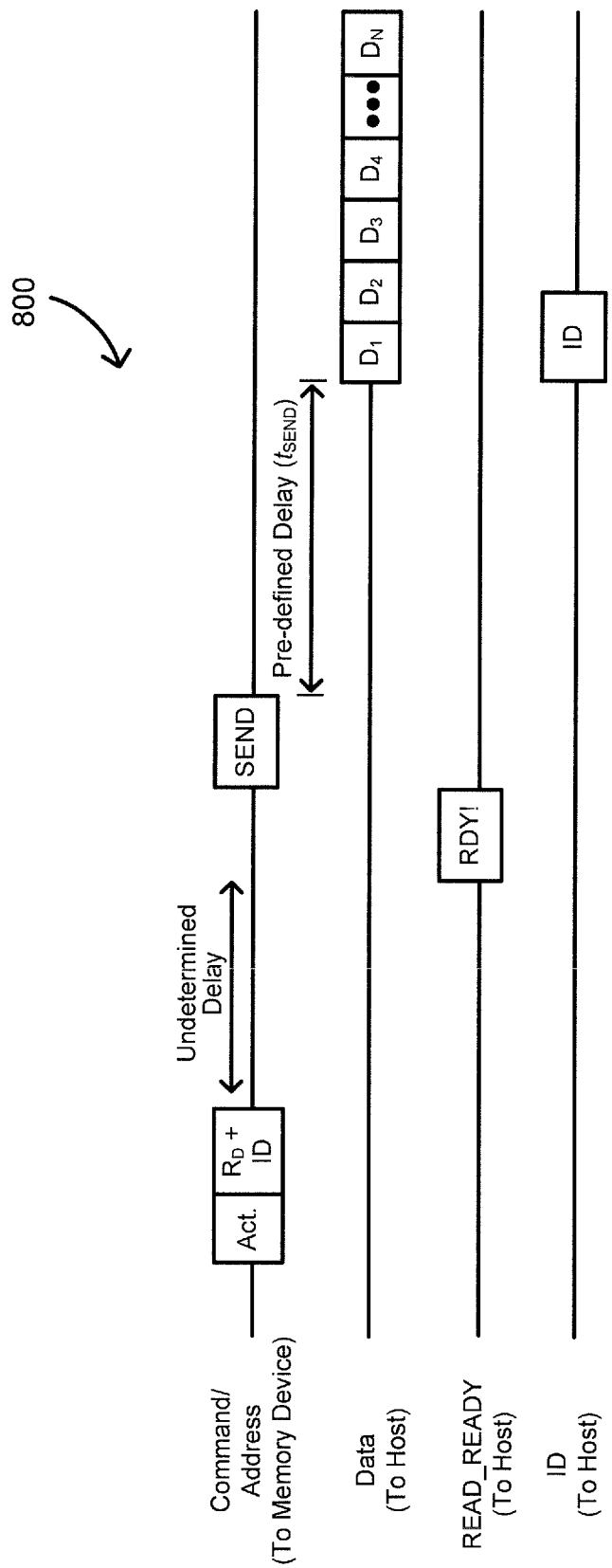
FIGS. 8A and 8B are timing diagrams of a non-deterministic method for reading data from a storage system of an embodiment.
Figure 8B:
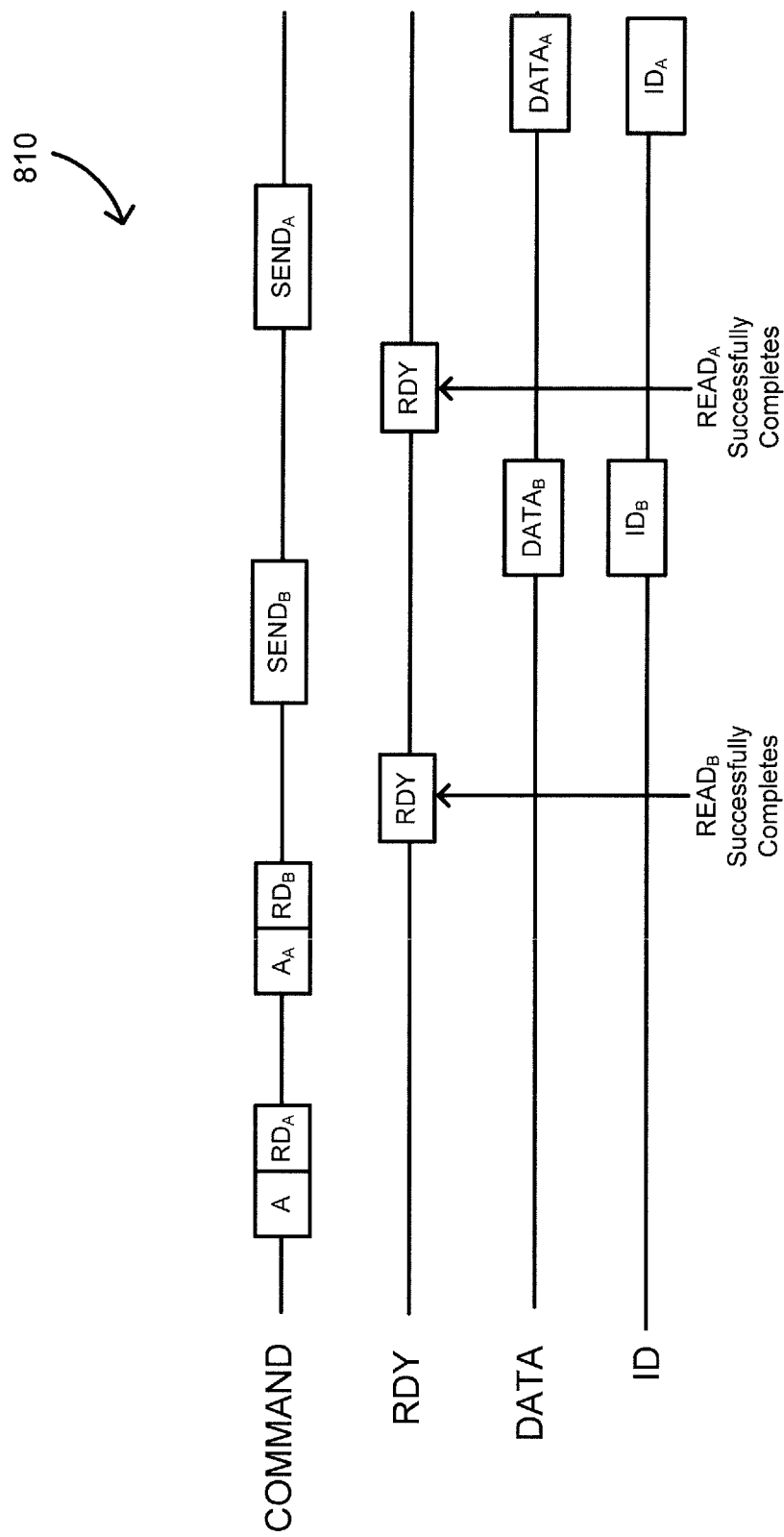

In the case of a read operation, the NV-DIMM informs the host 100 when the requested data is ready, so the host can then retrieve it. This is shown in the flow charts 600, 700 in FIGS. 6 and 7 and timing diagram 800 in FIG. 8A. As shown in FIG. 6, when the host 100 requires data from the storage system (act 610), the host 100 generates a double data rate identifier (DDR ID) for the request (act 620). The host 100 then associates the DDR ID with a host request ID (e.g., an ID of the CPU or other entity in the host 100 that requested the data) (act 630). Next, the host 100 sends the activation command and the upper address (act 640) and then sends the read command, lower address, and DDR ID (act 650). This is shown by the "Act" and "Rd +ID" boxes on the command/address line in FIG. 8A. (FIG. 8B is another timing diagram 810 for the read process discussed above, but, here, there are two read commands, and the later-received read (read command B) command completes before the first-received read command (read command B). As such, data B is returned to the host 100 before data A.)

In response to receiving the read command, the controller 130 takes an undetermined amount of time to read the data from the non-volatile memory 140. After the data has been read, the controller 130 tells the host 100 the data is ready by sending a R_RDY signal on the response bus (act 710 in FIG. 7). In response, the host 100 sends a "send" command on the command/address line (act 720), and, after a predefined delay, the controller 130 returns the data to the host 100 (act 730) (as shown by the "D1"-"DN" boxes on the data line and the "ID" box on the ID line in FIG. 8B). The memory controller 120 in the host 100 then accepts the data and the DDR ID (act 740). Next, the memory controller 120 determines if the DDR ID is associated with a specific host ID of one of the CPUs 110 in the host 100 (act 750). If there is, the memory controller 120 returns the data to the correct CPU 110 (act 760); otherwise, the memory controller 120 ignores the data or issues an exception (act 770).

Figure 8C:
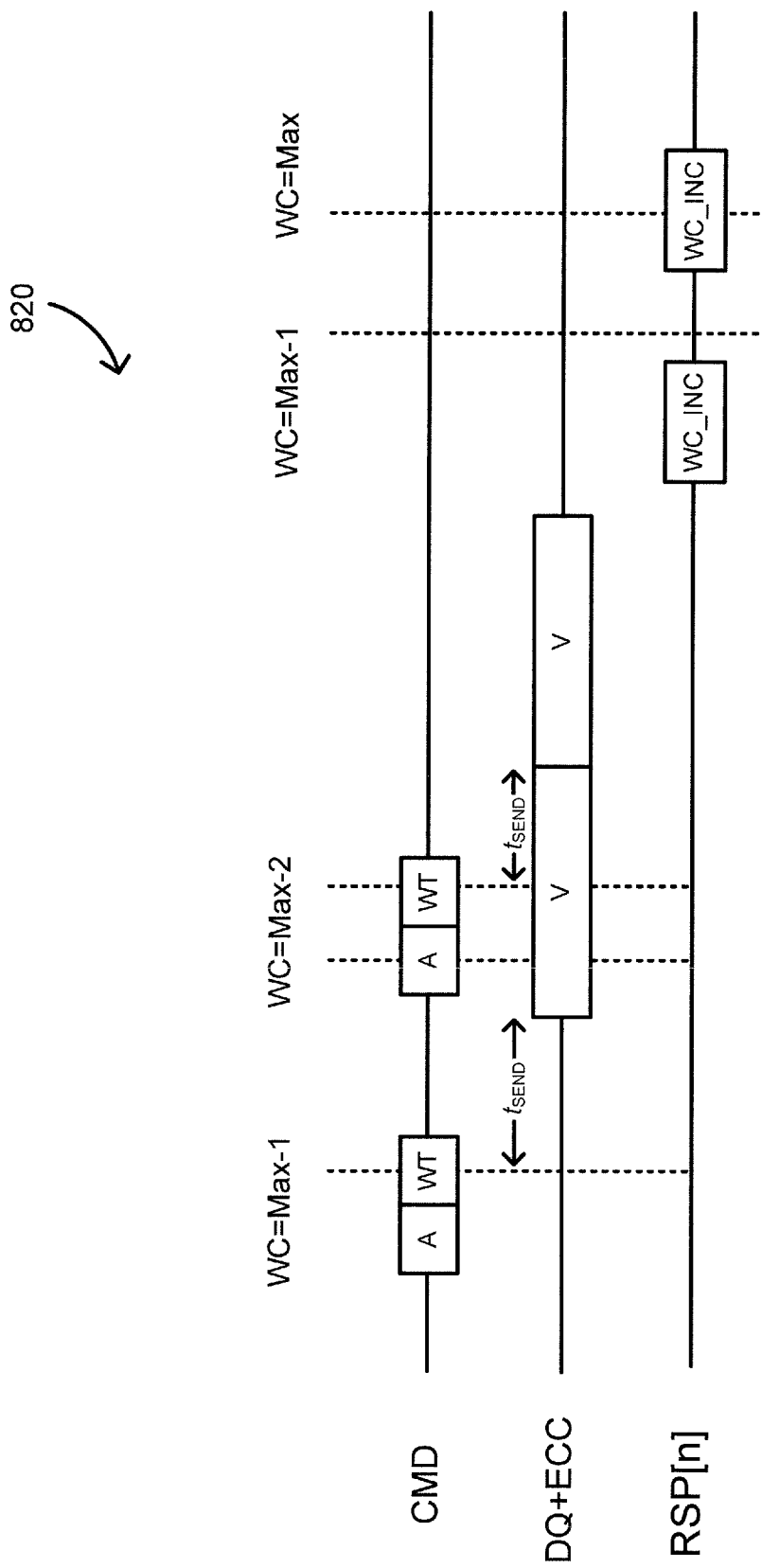
FIG. 8C is a timing diagram of a non-deterministic method for writing data to a storage system of an embodiment.

In the case of a write operation, the host 100 can be restricted from having more than a certain number of write commands outstanding to ensure that the non-volatile memory device does not receive more write commands than it can handle. This is shown in the write timing diagram 820 in FIG. 8C. As shown in FIG. 8C, every time the host 100 issues a write command, it decreases its write flow control credits (labeled "WC" in the drawing). When a write operation is complete, the media controller 130 sends a response to the host 100 for it to increase its write flow control credits.

The protocol discussed above is one embodiment of a NVRAM protocol which supports reads and write operations of unpredictable duration. As discussed previously, in some embodiments, the controller 130 can take advantage of the non-deterministic aspect in read and write operations to perform time-consuming actions (which may be referred to herein as operations having an undetermined duration from the host's perspective) that it may not have the time to do under conventional, DRAM-based DIMM standards. These operations having an undetermined duration from the host's perspective, such as memory and data management operations, may be important to the operation of the NV-DIMM. For example, as compared to DRAM, a non-volatile memory device 140 can have lower endurance (i.e., number of writes before failure) and less reliably store data (e.g., because of internal memory errors that cause bits to be stored incorrectly). These issues may be even more pronounced with emerging non-volatile memory technologies that would likely be used as a DRAM replacement in an NV-DIMM. As such, in one embodiment, the NV-DIMM takes advantage of not being "under the gun" to perform operations having an undetermined duration from the host's perspective (e.g., wear leveling and error correction operations) that it may not be able to perform in the allotted time under conventional, DRAM-based DIMM standards.

In general, an operation that has an undetermined duration from the host's perspective refers to an operation that (1) by its nature, does not have a predetermined duration (e.g., because the operation's duration depends on one or more variables) or (2) has a predetermined duration but that duration is not known to the host (e.g., a decryption operation may have a predetermined duration, but that duration is undetermined from the host's perspective because the host does not know whether or not the storage system will be performing a decryption operation). An "operation that has an undetermined duration from the host's perspective" can take any suitable form. For example, such an operation can be a "memory and data management function," which is an action taken by the controller 130 to manage the health and integrity of the NVM device. Examples of memory and data management function include, but are not limited to, wear leveling, data movement, metadata writing/reading (e.g., logging, controller status and state tracking, wear leveling tracking updates), data decode variations (ECC engine variations (syndromes, BCH vs LDPC, soft bit decodes), soft reads or re-reads, layered ECC requiring increased transfers and reads, RAID or parity reads with their compounded decoding and component latencies), resource contention (ECC engine, channels, NVM property (die, block, plane, IO circuitry, buffers), DRAM access, scrambler, other hardware engines, other RAM contention), controller exceptions (bugs, peripherals (temperature, NOR), media characterization activities (determining the effective age of memory cells—determining the bit error rate (BER), or probing for memory defects). Furthermore, the media controller may introduce elements, such as caches, that have the inverse effect (fast programs, temporary writes with reduced retention or other characteristics), and serve to accelerate read or write operations in ways that would be difficult to predict deterministically.

Further, operations of undetermined duration from the host perspective can include, but are not limited to, program refreshes, steps for verification (e.g., skip verify, regular settings, tight settings), data movement from one media/state to another location or another state (e.g., SLC to TLC, ReRam to NAND, STT-MRAM to ReRam, burst settings to hardened settings, low ECC to high ECC), and longer media settings (e.g., easier voltage transients). Such operations can be performed, for example, for endurance stretching, retention improvement or mitigation, and performance acceleration (e.g., writing this burst of data quickly or programming this data more strongly in the preferred direction such that future reading settle more quickly).

The media/NVM controller 130 can be equipped with various hardware and/or software modules to perform these memory and data management operations. As used herein, a "module" may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Figure 9:
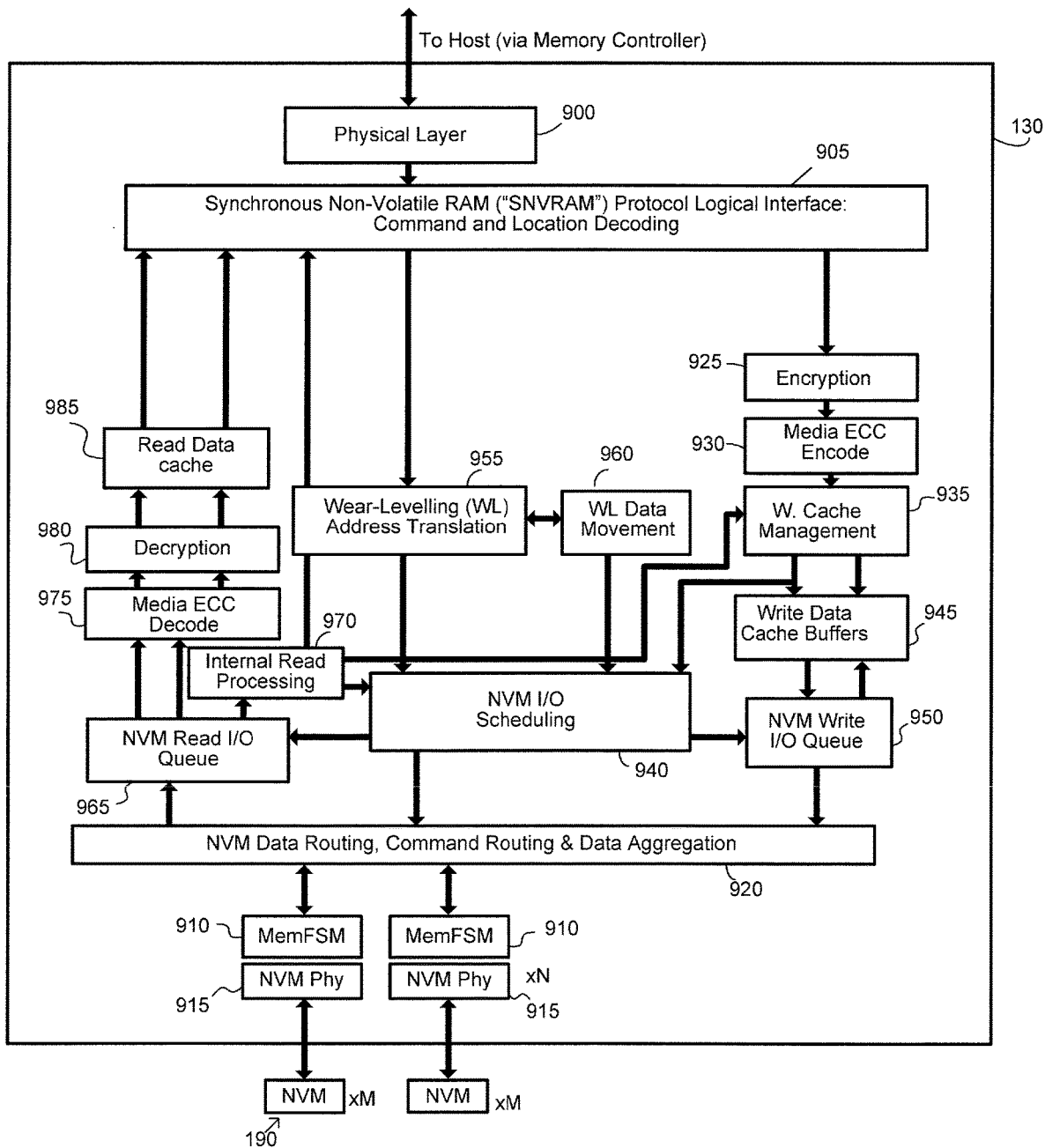
FIG. 9 is a block diagram of a controller of a storage system of an embodiment.

FIG. 9 is a block diagram of an NVM controller 130 of one embodiment showing various modules that can be used to perform memory and data management functions. In this particular embodiment, the controller 130 is configured to perform encryption, error correction, wear leveling, command scheduling, and data aggregation. However, it should be noted that the controller 130 can be configured to perform other types and numbers of memory and data management functions.

As shown in FIG. 9, this NVM controller 900 comprises a physical layer 900 and a non-volatile RAM ("SNVRAM") protocol logical interface (which included command and location decoding) 905 that is used to communicate with the host 100 (via the memory controller 120). The physical layer 900 is responsible for latching in the data and commands, and the interface 905 separates out the commands and locations and handles additional signaling pins between the host 100 and the controller 130. The controller 130 also includes N number of memory finite state machines (MemFSMs) 910 and NVM physical layer (Phy) 910 that communicate with M number of non-volatile memory devices 140.

In between these input and output portions, the controller 130 has a write path on the right, a command path in the middle, and a read path on the left. Although not shown, the controller 130 can have a processor (e.g., a CPU running firmware) that can control and interface with the various elements shown in FIG. 9. Turning first to a write operation, after a command and location have been decoded by the interface 905, the address is sent to a wear-leveling address translation module 955. In this embodiment, the host 100 sends a logical address with a command to write data, and the wear-leveling address translation module 955 translates the logical address to a physical address in memory 140. In this translation, the wear-leveling address translation module 955 shuffles the data to be placed at a physical address that has not been well worn. The wear-leveling data movement module 960 is responsible for rearranging the data if a sufficiently unworn memory area cannot be found within the address translation scheme. The resulting physical address, along with the associated command and address where the data can be found in local buffers inside the controller 130, are inputted to the NVM I/O scheduling module 940, which schedules read and write operations to the memory 140. The NVM I/O scheduling module 940 can include other functions to schedule, such as, but not limited to, erases, setting changes, and defect management.

In this embodiment, in parallel to the address translation, for a write operation, the data is first encrypted by the encryption engine 925. Next, the media error correction code (ECC) encoder 930 generates ECC protection for the data while it is at rest in the NVM memory 140. Protecting data while at rest may be preferred since non-volatile memories are much more prone to errors than DRAM when retrieving previously-stored data. However, decoding data with error correction is not always a constant time operation, so it would be difficult to perform such operations under deterministic protocols. While ECC is used in this example, it should be understood that any suitable data protection scheme can be used, such as, but not limited to, cyclic redundancy check (CRC), redundant array of independent disks (RAID), scrambling, data weighting/modulation, or other alteration to protect from degradation from physical events such as temperature, time, and voltage exposure (DRAM is also prone to error, but NVM is prone to different errors. Thus, each NVM likely requires a different protection scheme while at rest. Often, it is a tradeoff latency to cost). Also, while not shown to simplify the drawing, it should be noted that other data protection systems can be used by the controller 130 to protected data when "in flight" between the host 100 and the controller 130 and when moving around in the controller 130 (e.g., using CRC, ECC, or RAID).

As mentioned above, data protection schemes other than ECC can be used. The following paragraphs provide some additional information on various data protection schemes.

Regarding ECC, some embodiments of error-checking codes, such as BCH or other Hamming codes, allow for the decoding engine, which can use a nearly-instantaneous syndrome, to check to validate the correctness of the data. However, a syndrome-check failure may entail the solution of complex algebraic equations which can add to significant delay. Moreover, if multiple syndrome-check failures occur at the same time, there may be hardware-resource-generated backlogs due to the unavailability of hardware resources for decoding. However, these occasional delays can be handled by delaying the read-ready notification to the host. Other coding schemes, such as LDPC or additional CRC checks, may also be included for more efficient use of space or higher reliability, and though these others schemes are likely to have additional variations in time to process the data coming out of the storage media, these variations can also be handled by a simple delay of the read-ready signal.

Another form of data protection may take the form of soft-bit decoding, whereby the binary value of the data stored in the medium is measured with higher confidence by measuring the analog values of the data stored in the physical memory medium several times, relative to several threshold values. Such techniques will take longer to perform, and may add additional variability to the combined data read and decoding process. However these additional delays if needed can be handled gracefully by postponing the READ READY signal back to the host.

Further, reliability still can be added using nested or layered error correcting schemes. For instance, the data in the medium may be encoded such that the data that can survive N errors out of every A bytes read, and can survive M (where M>N) errors out of every B where (B>A) bytes read. A small read of size A may thus be optimal for fast operation, but sub-optimal for data-reliability in the face of a very bad data-block with greater than N errors. Occasional problems in this scheme can be corrected by first reading and validating A bytes. If errors persist, the controller has the option to read the much larger block, at the penalty of a delay, but with successful decoding of the data. This is another emergency decoding option made possible by the non-deterministic read-timings afforded by the SNVRAM-supported media controller.

Also, gross failures of a particular memory device could be encoded via RAID techniques. Data could be distributed across a plurality of memory devices to accommodate the complete failure of some number of memory devices within this set. Spare memory devices could be included in a memory module as fail-in-place spares to receive redundancy data once a bad memory devices is encountered.

Returning to FIG. 9, after the media error correction code (ECC) encoder 930 generates ECC protection for the data, the data is sent to the write cache management module 935, which determines whether or not there is space in the write data cache buffers 945 and where to put the data in those buffers 945. The data is stored in the write data cache buffers 945 where it is stored until read. So, if there is a delay in scheduling the write command, the data can be stored in the write data cache buffers 945 indefinitely until the memory 140 is ready to receive the data.

Once the write command associated with that write-data-cache-buffer entry comes to the front of the queue, the data entry is passed to the NVM write I/O queue 950. When indicated by the NVM I/O scheduler 940, the command is passed from the NVM I/O scheduler 940 to the NVM data routing, command routing, and data aggregation module 920, and the data is passed from the NVM write I/O queue 950 to the NVM data routing, command routing, and data aggregation module 920. The command and data are then passed to the appropriate channel. The memory finite state machine (MemFSM) 910, which is responsible for parsing the commands into more fine-grain, NVM-specific commands and controlling the timing of when those commands are dispersed to the NVM devices 140. The NVM Phy 915 controls timing to an even finer level, making sure that the data and command pulses are placed at well-synchronized intervals with respect to the NVM clock.

Turning now to the read path, as data from read commands come back from the NVM devices 140, the NVM data routing, command routing, and data aggregation module 920 places the read data in the NVM read I/O queue 965. In this embodiment, the read data can take one of three forms: data that is requested by a user, NVM register data (for internal use by the controller 130), and write-validation data. In other embodiments, one or more of these data classes can be held in different queues. If the data was read for internal purposes, it is processed by the internal read processing module 960 (e.g., to check that previously-written data was correctly written before sending an acknowledgement back to the host 100 or sending a rewrite request to the scheduler 940). If the data was requested by the user, metadata indicating the command ID associated with the read data is attached to the data. This command ID metadata is associated with the read data as it is transmitted through the read pipeline (as indicated by the double arrow). The data is then sent to the media ECC decoder 975, which decodes the data, and then to the decryption module 980, which decrypts the data before sending it to the read data cache 955. The data stays in the read data cache 955 until the host 100 requests it by identifying the command ID block. At that time, the data is sent to the interface 905 and physical layer 900 for transmission to the host 100.

Figure 10:
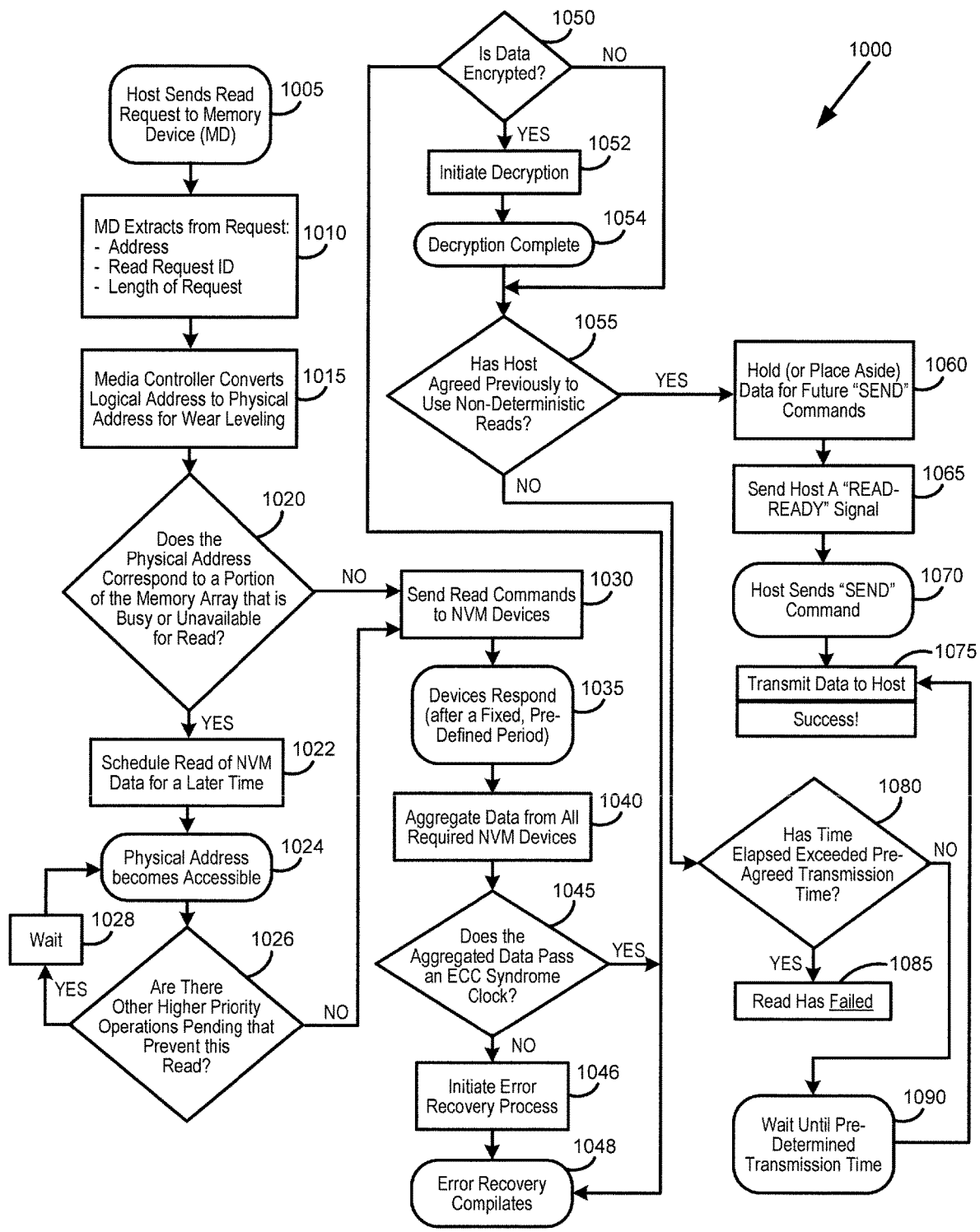
FIG. 10 is a flow chart of a method for reading data from a storage system of an embodiment.

FIG. 10 is a flow chart 1000 of a method for reading data using the controller 130 of FIG. 6. As shown in FIG. 10, first the host 100 sends a read request to the storage system (act 1050). The NVM controller 130 in this embodiment then extracts the following elements from the request: address, read request ID, and length of the request (act 1010). The NVM controller 130 then converts the logical address from the request to a physical address for wear leveling (act 1015).

The NVM controller 130 then determines if the physical address corresponds to a portion of the memory array that is busy or unavailable for reads (act 1020). If the memory portion is busy or unavailable, the NVM controller 130 schedules the read of the non-volatile memory devices 140 for a later time (act 1022) At that later time, if the physical address becomes available (act 1024), the NVM controller 130 determines if there are other higher priority operations pending that prevent the read (act 1026). If there are, the NVM controller 130 waits (act 1028).

If/when the memory portion becomes available, the NVM controller 130 sends read commands to the NVM devices 140 to read the requested data (act 1030). The NVM devices 140 then returns the requested data (act 1035). Depending on the type of devices used, the NVM devices 140 can return the data after a fixed, pre-determined time period. The NVM controller 130 then can process the returned data. For example, after aggregating the data returned from the various NVM devices 140 (act 1040), the NVM controller 130 can determine if the data passes an error correction code (ECC) check (act 1045). If the data does not pass the ECC check, the NVM controller 130 can initiate an error recovery process (act 1046). After the error recovery process is completed (act 1048) or if the aggregated data passed the ECC check, the NVM controller 130 determines if the data is encrypted (act 1050). If the data is encrypted, the NVM controller 130 initiates a decryption process (act 1052).

After the decryption process is completed (act 1054) or if the data was not encrypted, the NVM controller 130 optionally determines whether the host 100 previously agreed to use non-deterministic reads (act 1055). (Act 1055 allows the NVM controller 130 to be used for both deterministic and non-deterministic reads but may not be used on certain embodiments.) If the host 100 previously agreed, the NVM controller 130 holds (or puts aside) the read data for a future send command (as discussed below) (act 1060). The NVM controller 130 also sends a signal on the "READ READY" line to the host 100 (act 1065). When it is ready, the memory controller 120 in the host 100 sends a send command (act 1070). In response to receiving the send command from the host 100, the NVM controller 130 transmits the processed, read data, along with the command ID, to the host 100 (e.g., after a pre-defined delay (there can be global timeouts from the memory controller in the host)) (act 1075).

If the host 100 did not previously agree to use non-deterministic reads (act 1055), the NVM controller 130 will handle the read, as in the conventional system discussed above. That is, the NVM controller 130 will determine if the elapsed time exceeds the pre-agreed transmission time (act 1080). If the elapsed time has not exceeded the pre-agreed transmission time, the NVM controller 130 transmits the data to the host 100 (act 1075). However, if the elapsed time has exceeded the pre-agreed transmission time, the read has failed (act 1085).

Figure 11:
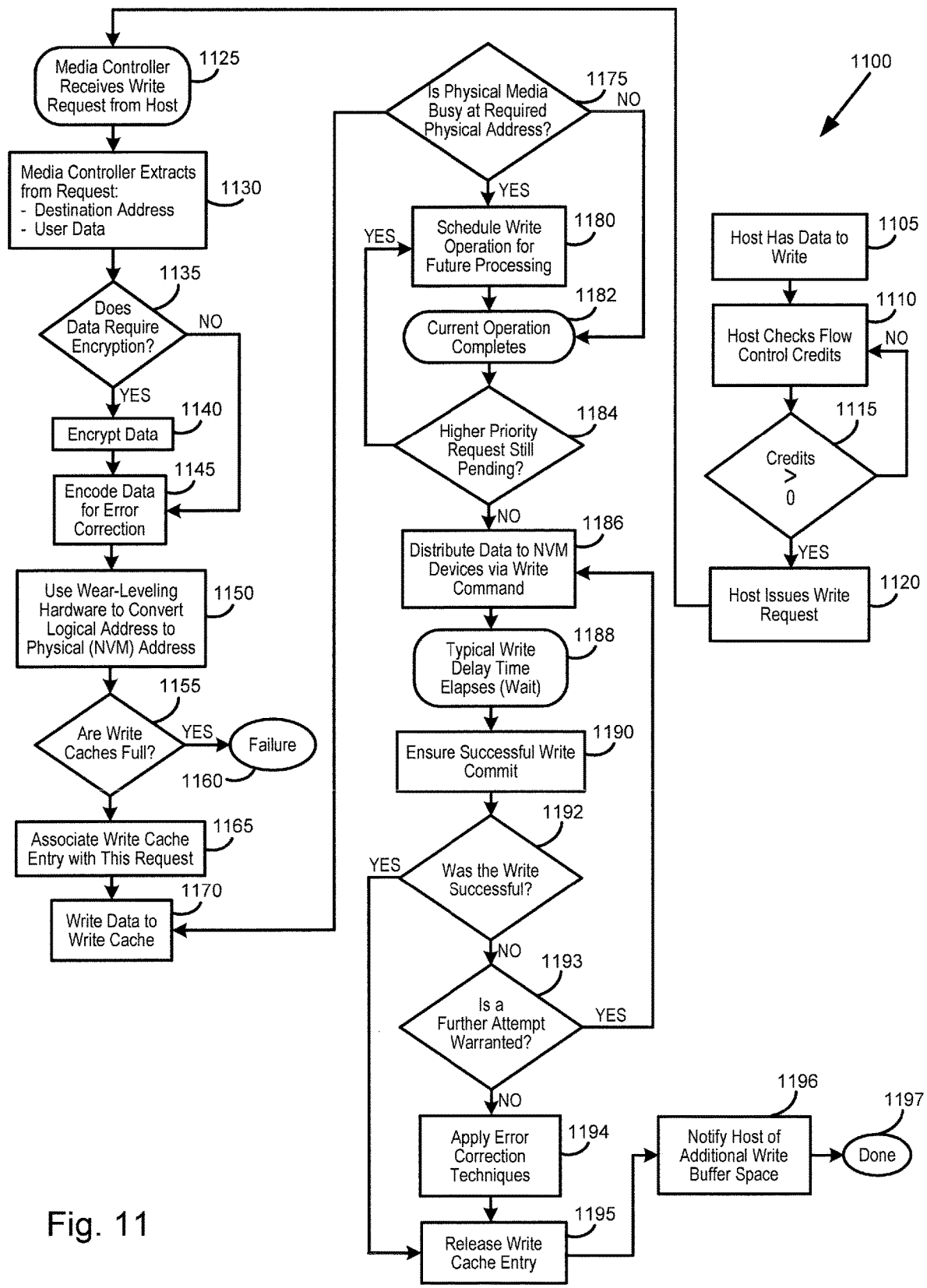
FIG. 11 is a flow chart of a method for writing data to a storage system of an embodiment.

Turning now to a write operation, FIG. 11 is a flow chart 1100 that starts when the host 100 has data to write (act 1105). Next, the host 1110 checks to see if there is an available flow control credit for the write operation (acts 1110 and 1115). If there is a flow control credit available, the host 100 issues the write request (act 1130), and the media controller 130 receives the write request from the host 10 (act 1125). The controller 130 then extracts the destination address and user data from the request (act 1130). Since a non-deterministic protocol is used in this embodiment, the controller 130 can now spend time performing memory and data management operations. For example, if the data requires encryption (act 1135), the controller 130 encrypts the data (act 1140). Otherwise, the controller 130 encodes the data for error correction (act 1145). As noted above, any suitable error correction scheme can be used, such as, but not limited to, ECC, cyclic redundancy check (CRC), redundant array of independent disks (RAID), scrambling, or data weighting/modulation. Next, the controller 130 uses wear-leveling hardware (or software) to convert the logical address to a physical (NVM) address (act 1150). The controller 130 then determines if the write cache is full (act 1155). If it is, the controller 130 signals a failure (act 1160). A failure can be signaled in any suitable way, including, but not limited to, using a series of voltages on a dedicated pin or pins on the response bus, writing the error in log (e.g., in the NVM controller), or incrementing or annotating the error in the serial presence detect (SPD) data. If it isn't, the controller 130 associates a write cache entry with the current request (act 1165) and writes the data to the write cache (act 1170).

The controller 130 then determines if the physical media is busy at the required physical address (act 1175). If it is, the controller 130 schedules the write operation for future processing (act 1180). If it isn't, the controller 130 waits for the current operation to complete (act 1182) and then determines if there is a higher-priority request still pending (act 1184). If there isn't, the controller 130 distributes the data to the NVM devices 140 via write commands (act 1186). The controller 130 then waits, as there are typical delays in writing to NVM devices (act 1188). Next, optionally, the controller 140 ensures that the write commit was successful (act 1190) by determining if the write was successful (act 1192). If the write was not successful, the controller 130 determines if further attempts are warranted (act 1193). If they are not, the controller 130 optionally can apply error correction techniques (act 1194). If and when the write is successful, the controller 130 releases the write cache entry (act 1195) and notifies the host 100 of additional write buffer space (act 1196), and the write operation than concludes (act 1197).

The flow charts in FIGS. 10 and 11 both describe the process for performing a single read operation or a single write operation. However, in many media controller embodiments, multiple read or write operations may proceed in parallel, thus creating a continuous pipeline of read or write processes. Many of these steps in turn will support out-of-order processing. The flow charts serve as an example of the steps that may be required to process a single read or write request.

In summary, some of the above embodiments provide a media controller that interfaces to a host via a particular embodiment of the SNVRAM protocol and also interfaces to a plurality of memory devices. In addition to using non-deterministic read- and write-timing features of the SNVRAM protocol, the media controller is specifically designed to enhance the life of the media (NVM), optimally correct errors in the media, and schedule requests through the media to optimize throughput, all while presenting a low-latency, high-bandwidth memory interface to the host. In this way, the media controller can manage the health and integrity of the storage medium by "massaging" memory idiosyncrasies. Also, the media controller can collect and aggregate data from NVM chips for more efficient data processing and error-handling.

There are many alternatives that can be used with these embodiments. For example, while a clock-data parallel interface was in the examples above, other types of interfaces can be used in different embodiments, such as, but not limited to, SATA (serial advanced technology attachment), PCIe (peripheral component interface express), NVMe (non-volatile memory express), RapidIO, ISA (Industry Standard Architecture), Lightning, Infiniband, or FCoE (fiber channel over Ethernet). Accordingly, while a parallel, DDR interface was used in the above example, other interfaces, including serial interfaces, can be used in alternate embodiments. However, current serial interfaces may encounter long latencies and I/O delays (whereas a DDR interface provides fast access times). Also, as noted above, while the storage system took the form of an NV-DIMM in the above examples, other types of storage systems can be used, including, but not limited to embedded and removable devices, such as a solid-state drive (SSD) or memory card (e.g., secure digital (SD), micro secure digital (micro-SD) card, or universal serial bus (USB) drives.

As another alternative, NVM chips can be built that can speak either standard DDR or newer SNVRAM protocols without the use of a media controller. However, use of a media controller is presently preferred as currently-existing NVM devices have much larger features than more-developed DRAM devices; thus, NVM chips cannot be depended on to speak at current DDR frequencies. The memory controller can slow down DDR signals to communicate with the NVM chips. Also, the functions that the media controller performs can be relatively complex and expensive to integrate into the memory chips themselves. Further, media controller technology is likely to evolve, and it may be desired to allow for upgrading the media controller separately to better handle a particular type of memory chip. That is, sufficiently isolating the NVM and NVM controller enables incubation of new memories while also providing a DRAM speed flow through for mature NVMs. Additionally, the media controller allows error checking codes and wear levelling schemes that distribute data across all chips and handle defects, and there is a benefit from aggregating data together through one device.

As discussed above, in some embodiments, the controller 130 can take advantage of the non-deterministic aspect in read and write operations to perform time-consuming actions that have an undetermined duration from the host's perspective. While memory and data management operations were mentioned above as examples of such actions, it should be understood that there are many other examples of such actions, such as monitoring the health of the individual non-volatile media cells, protecting them from wear, identifying failures in the circuitry used to access the cells, ensuring that user data is transferred to, or removed from the cells in a timely matter that is consistent with the operational requirements of the NVM device, and ensuring that user data is reliably stored and not lost or corrupted due to bad cells or media circuit failures. Furthermore, in cases where sensitive data may be stored on such device, operations that have an undetermined duration from the host's perspective can include encryption as a management service to prevent the theft of non-volatile data by malicious entities.

More generally, an operation that has an undetermined duration from the host's perspective can include, but is not limited to, one or more of the following: (1) NVM activity, (2) protection of data stored in the NVM, and (3) data movement efficiencies in the controller.

Examples of NVM activity include, but are not limited to, user data handling, non-user media activity, and scheduling decisions. Examples of user data handling include, but are not limited to, improving or mitigating endurance of NVM (e.g., wear leveling data movement where wear leveling is dispersing localized user activity over a larger physical space to extend the device's endurance, and writing or reading the NVM in a manner to impact the endurance characteristics of that location), improving or mitigating retention of the NVM (e.g., program refreshes, data movement, and retention verifications), varied media latency handling to better manage the wear impact on the media during media activity (writes, reads, erases, verifications, or other interactions) (e.g., using longer or shorter latency methods as needed for NVM handling to improve a desired property (endurance, retention, future read latency, BER, etc.)), and folding of data from temporary storage (SLC or STT-MRAM) to more permanent storage (TLC or ReRam). Examples of non-user media activity include, but are not limited to, device logs (e.g., errors, debug information, host usage information, warranty support information, settings, activity trace information, and device history information), controller status and state tracking (e.g., algorithm and state tracking updates for improved or continuous behavior on power loss or power on handling, and intermediate verification status conditions for media write confirmations, defect identifications, and data protection updates to ECC (updating parity or layered ECC values), media characterization activities (e.g., characterizations of NVM age or BER, and examination of NVM for defects), and remapping of defect areas.

Examples of protection of data stored in the NVM include, but are not limited to, various ECC engine implementations (e.g., BCH or Hamming (hardware implementation choices of size, parallelization of implementation, syndromes, and encoding Implementation choices such as which generator polynomial, level of protection, or special case arrangements), LDPC (e.g., hardware implementation choices of size, parallelization of implementation, array size, and clock rate; and encoding implementation choices such as level of protection and polynomial selection to benefit media BER characteristics), parity (e.g., user data CRC placed before the ECC, and RAID), layered protection of any of the above in any order (e.g., CRC on the user data, ECC over the user data and CRC, two ECC blocks together get another ECC, calculate the RAID over several ECC'ed blocks for a full stripe of RAID), decode retry paths (e.g., choices on initiating and utilizing the other layers of protection (e.g., speculatively soft reading, wait until failure before reading the entire RAID stripe, low power vs high power ECC engine modes)), ECC Retries with or without any of the following: speculative bit flips, soft bit decodes, soft reads, new reads (e.g., re-reads and soft reads (re-reading the same data with different settings), and decode failure), and data shaping for improved storage behavior (e.g., reduced intercell interference (e.g., using a scrambler or weighted scrambler for improved sense circuitry performance).

Examples of data movement efficiencies in the controller include, but are not limited to, scheduling architecture and scheduling decisions. Scheduling architecture can relate to the availability of single vs multiple paths for each of the following: prioritization, speculative early starts, parallelization, component acceleration, resource arbitration, and implementation choices specific to that component. The quantity, throughput, latencies, and connections of every device resource will implicitly impact the scheduling. Scheduling architecture can also include internal bus conflicts during transfers (e.g., AXI bus conflicts), ECC engines, NVM communication channels (e.g., bandwidth, speeds, latencies, idle times, congestion of traffic to other NVM, ordering or prioritization choices, and efficiencies of usage for command, data, status, and other NVM interactions), NVM access conflicts often due to the arrangement and internal circuitry access of each specific NVM (e.g., die, block, plane, TO circuitry, buffers, bays, arrays, word lines, strings, cells, combs, layers, and bit lines), memory access (e.g., external DRAM, SRAM, eDRAM, internal NVMs, and ECC on those memories), scrambler, internal data transfers, interrupt delays, polling delays, processors and firmware delays (e.g., processor code execution speed, code efficiency, and function, thread or interrupt exchanges), and cache engines (e.g., efficiency of cache searches, cache insertion costs, cache filling strategies, cache hits successfully and efficiently canceling parallel NVM and controller activity, and cache ejection strategies). Scheduling decisions can include, but are not limited to, command overlap detections and ordering, location decoding and storage schemes (e.g., cached look-up tables, hardware driven tables, and layered tables), controller exceptions (e.g., firmware hangs, component timeouts, and unexpected component states), peripheral handling (e.g., alternative NVM handling such as NOR or EEPROM, temperature, SPD (Serial Presence Detect) interactions on the NVDIMM-P, and alternative device access paths (e.g., low power modes and out of band commands), power circuitry status), and reduced power modes (e.g., off, reduced power states, idle, idle active, and higher power states that may serve for accelerations or bursts).

The storage system discussed above may benefit from the use of a command and address buffer and data buffers (DB). One example of a command and address buffer is a register clock driver (RCD). While an RCD will be used in the following examples, it should be understood that other types of command and address buffers can be used. Also, a command and address buffer can have other functionality. For example, a command and address buffer, such as an RCD, also can have data parallel decode synchronization capabilities to synchronize the flow of data into and out of the DBs.

RCDs and DBs have been used with DRAM-based DIMMs to improve signal integrity. For example, when long, stray electrical lines in the DIMM cause bad electrical characteristics on the command and address group of signals, the RCD 1220 receives and repeats the command and address to the DRAM chips 1210 to help ensure they receive them. RDIMM (registered DIMM) is an example of a DIMM that has an RCD, and LRDIMM (load reduced DIMM) (or FBDIMM (Fully Buffered DIMM)) is an example of a DIMM that has both an RCD and DBs (a UDIMM (unbuffered DIMM) forces electrical routing rules impacting the bus). Signal integrity and other issues can arise when using an NV-DIMM, especially one with a media controller, such as the one discussed above. The following paragraphs will discuss the general use of RCDs and DBs in that context before turning to their use in an NV-DIMM.

Figure 12:
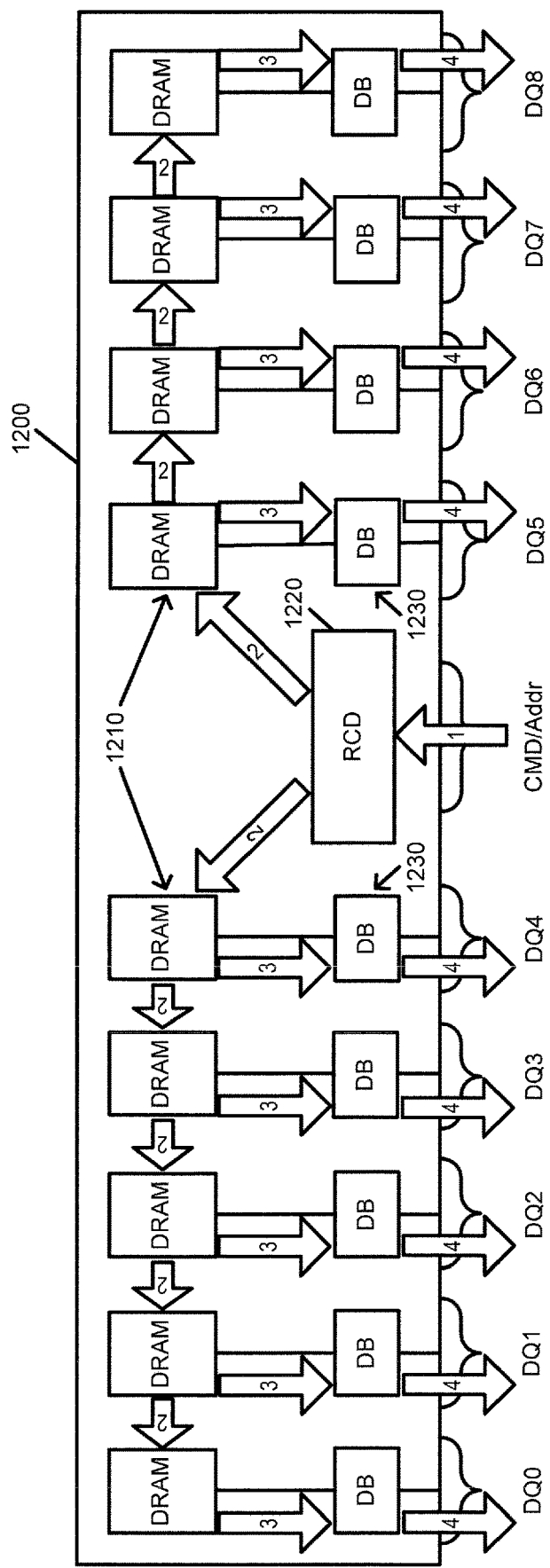
FIGS. 12 and 13 are diagrams that show read and write flows, respectively, of a DRAM-based DIMM.
Figure 13:
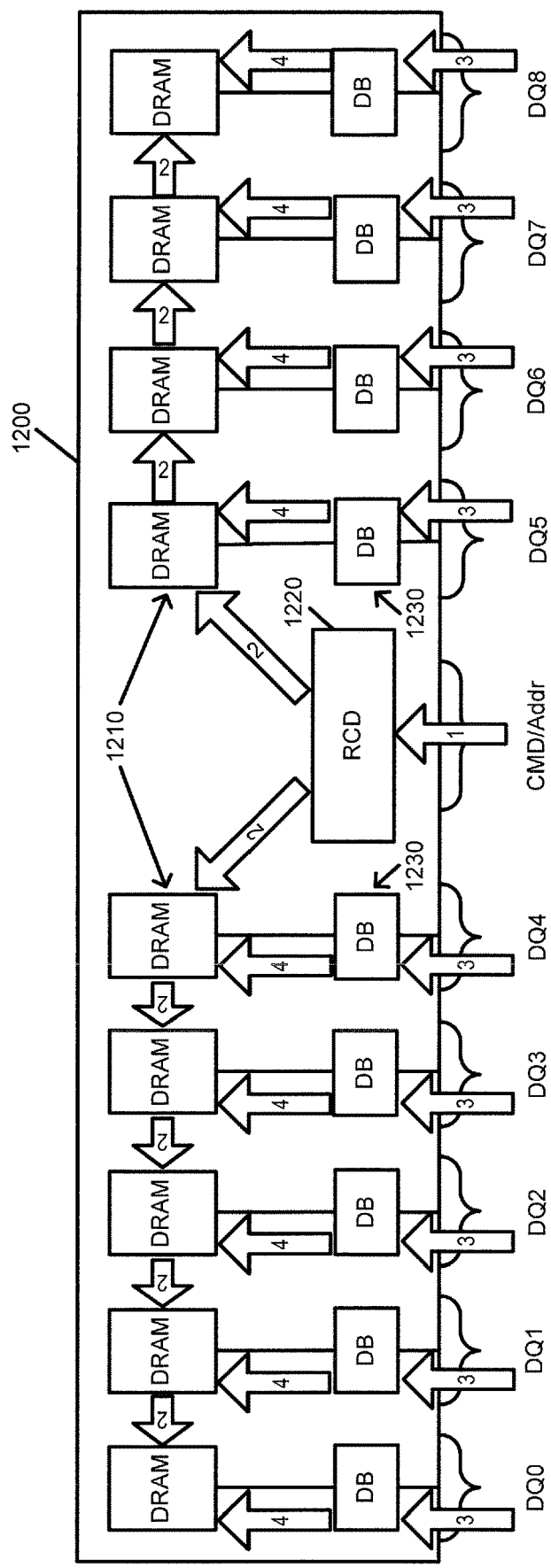

Returning to the drawings, FIGS. 12 and 13 are illustrations of a DRAM DIMM 1200, which has a plurality of DRAM chips 1210, an RCD 1220, and a plurality of DBs 1230. Although not shown in FIGS. 12 and 13 to simplify the drawings, the RCD 1220 is in communication with all the DRAM chips 1210 and the DBs 1230. In general, the DBs 1230 store data being sent to or read from the DIMM 1200, and the RCD 1220 serves as a repeater to repeat the command and address received on the CMD/Addr line of the DIMM to the DRAM chips 1210. The RCD 1220 also controls when the DBs 1230 release the data that they store.

FIG. 12 shows the read flow in the DIMM 1200, and FIG. 13 shows the write flow in the DIMM. As shown in FIG. 12, a read command is received by the RCD 1220 on the CMD/Addr line (arrow 1). Next, the RCD 1220 communicates a "read" command to the address in each DRAM block 1210, as each DRAM block is addressed the same here (arrow 2). The data is then read from each of the DRAMs 1210 and moved to the corresponding DB 1230 (arrow 3). In DRAM-based DIMM protocol, the DIMM has a certain amount of time after receiving the read command to provide the data back to the host. So, after that amount of time has passed, the RCD 1220 signals the DBs 1230 to release the data to the host (arrow 4). Between each of these steps, there is a variation allowed with this scheme. In this architecture, the RCD 1220 just assumes that the data is in the DBs 1230 after the amount of time has passed, and, usually, this is a safe assumption given how reliable DRAM latency is in reading data.

Turning now to FIG. 13, in a write operation, a write command is received by the RCD 1220 on the CMD/Addr line (arrow 1). Almost immediately thereafter, the RCD 1220 communicates to the DRAM blocks 1210 to being the write process (arrow 2). Next, after a fixed time delay tWL, the DBs 1230 receive the data to be written (arrow 3), and then transmit the data to the DRAM blocks 1210 (arrow 4).

Figure 14:
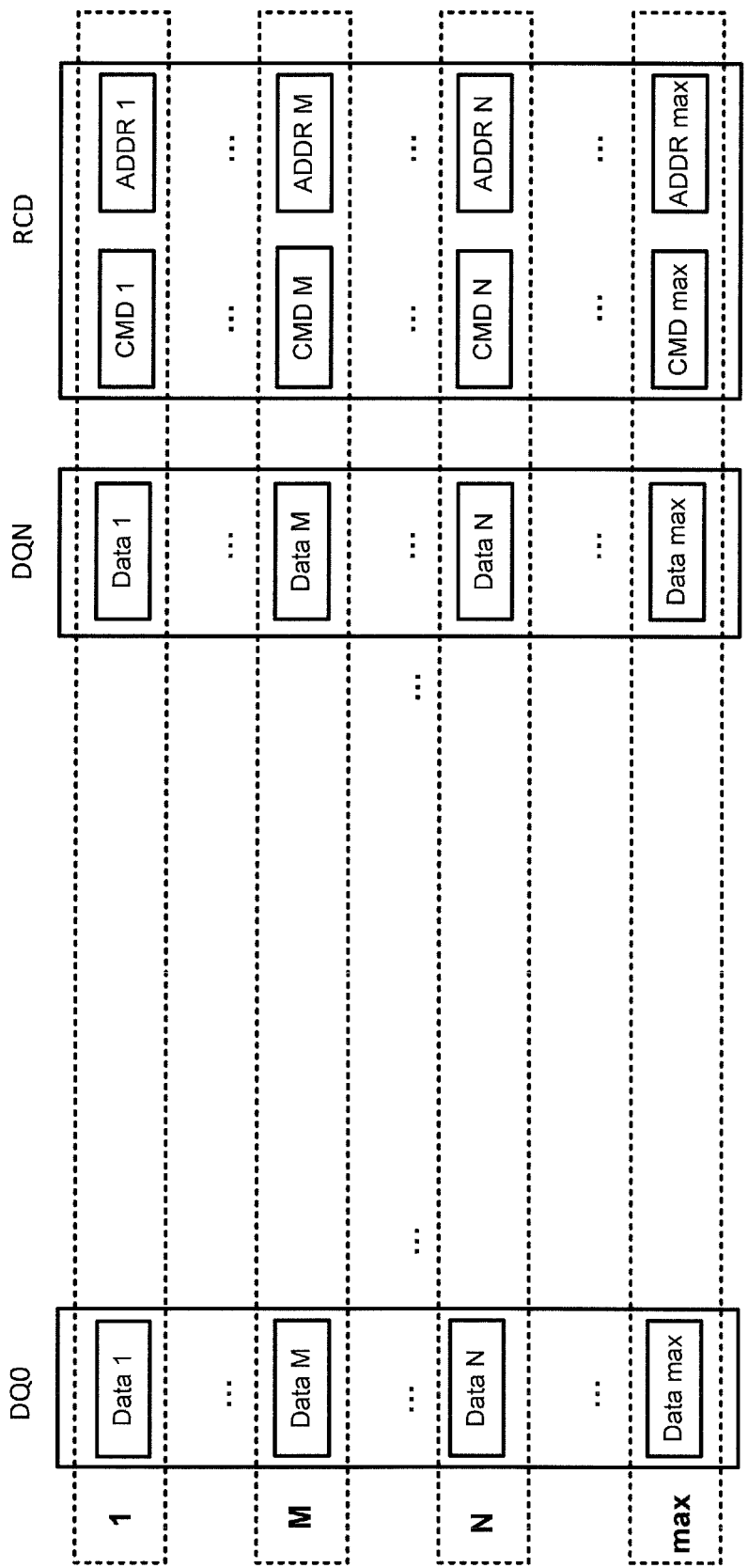
FIG. 14 is a diagram of internal states of data flow in a DRAM-based DIMM.

FIG. 14 is a diagram of internal states of data flow in a DRAM-based DIMM. The earlier layer of decoding and routing allows us to assume each sub-block in this diagram is correctly decoded and understood as a group. Abstractly, each of the sub-groups can be moved up to a larger set of data that moves together. The dotted boxes in this drawing convey four of the groups that may be treated together. Although there are times where the CMD/ADDR may come in earlier than the DQ data, the relationships are well formed, so we can ignore this time delay. In any case, a maximum of DQ and CMD/ADDR can describe the state of the physical layer.

Figure 15:
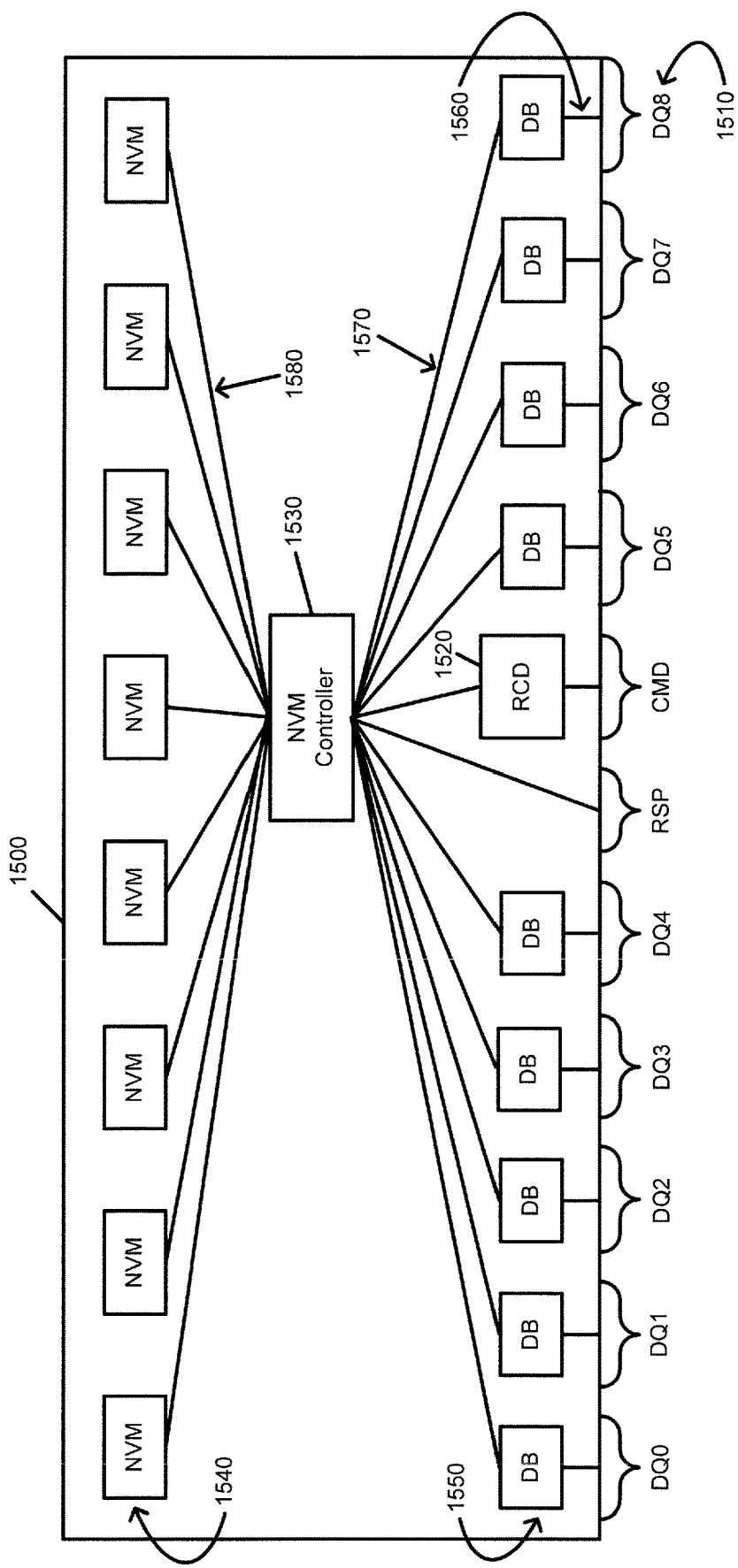
FIG. 15 is a block diagram of a storage system of an embodiment in which the storage system takes the form of a non-volatile dual in-line memory module (NV-DIMM).

Now with the general background of RCDs and DBs provided, the following paragraphs will discuss the use of RCDs and DBs in an NV-DIMM. Returning to the drawings, FIG. 15 is a block diagram of a storage system 1500 that is similar to the storage system 200 in FIG. 2A, discussed above. As with that storage system 200, this storage system 100 comprises an interface 1510 that includes 9 data input/output pins (DQ0-DQ8), command pins, and response pins, an NVM controller 1530, and nine non-volatile memory devices 1240. New to this embodiment is the RCD 1520 and DBs 1550.

One advantage of this embodiment is that RCD 1520 and DBs 1550 act to electrically buffer the NV-DIMM. For example, as shown in the storage system 200 in FIG. 2A, the DQ traces can be long and difficult to route, which can impact the buses signal integrity (SI) quality. In contrast, the traces 1560 between the DRAM bus pins and the RCD 1520 and DBs 1560 are relatively short, assuring signal integrity of the DRAM bus. These traces 1560 can be strictly specified for maximum SI and NV-DIMM-P operability in each of UDIMM, RDIMM, LRDIMM, and any other DIMM configurations (now existing or later developed) without degrading bus integrity (this can increase vendor competition and reduce system integration challenges). That is, the speed of the lines 1560 can be of sufficient signal integrity and speed to match other DRAM physical communications. In contrast, the lines 1570 going between the RCD 1520 and DBs 1550 and the NVM controller 1530, as well as the lines 1580 between the NVM controller 1530 and NVM devices 1540 may be specified with looser specifications, as communication on these lines 1570, 1580 may be absorbed into the existing JEDEC specification latency lenient responses (i.e., the latency can be isolated behind the RCD 1520 and DBs 1550) or the electrical routing contained entirely within the DIMM can assure sufficient SI for transmission. This enables multi-vendor development of DB and RCD chips and "agnostic" placement of the NVM devices and NVM controller. Further, this allows sufficient isolation of the NVM devices and NVM controller to enable incubation of new memories while also providing a DRAM speed flow through for mature NVMs. Also, the RAM buffers in the DBs 1550 and RCD 1520 with non-deterministic protocol can be sufficient to separate and align behaviors of NV-DIMM-P internals and DRAM bus externals.

In one embodiment, each DQx is inferring a grouping of data, strobe, and clocking signals coming from the memory controller 120 in the host 100. The number of sets of DQs might have a maximum of DQ7 or DQ8 in one deployment, but there are other maximums, such as DQ9. (Some specifications refer to these as CBs (Check Bits).) Accordingly, these embodiments can apply to any number of data group signals, and the maximum DQ group number will be referred to herein as N. DQ and RCD signal timings and constraints within each group (e.g., message content lines, strobes, and clocks) can be very strict. For example, the "message lines" may be either data in the case of DQ or it may be command and address in the case of RCD. This will ensure that each eight bytes of data and the commands and addresses are received together and decoded correctly by group. Each message can be received and correctly interpreted by the DBs 1550 or RCD 1530 (depending on the appropriate group), so that the overall timing constraints between each DQ and the RCD 1530 may be more lenient. The framework of delays of the entire DRAM bus can be much more relaxed than a single edge of the DRAM bus clock rate. Thus, the DQ and the RCD 1530 can be able to decode and encode correctly to the corresponding and relating buffers. In one embodiment, the memory controller 1530 sends the message groups all at once, and the correct placements and signal integrity rules are assured, such that the data reaches each component and is decoded correctly.

The basic operation of the RCD 1520 and DBs 1550 is similar to the operation of the RCD 1220 and DBs 1230 in the above example with a DRAM-based DIMM, with some differences to account for the use of NVM devices 1540 and the NVM controller 1530. That is, in general, the DBs 1550 store data being sent to or read from the NVM devices 1540, and the RCD 1520 serves as a repeater to repeat the command and address received on the CMD/Addr line of the storage system 1500 to the NVM devices 1540. However, the DRAM-based DIMM uses a deterministic protocol, with the RCD 1220 instructing the DBs 1230 to release their data to the host after a predetermined amount of time. As mentioned above, due to the mechanics of read data from a non-volatile memory, the requested data may be not be ready to be sent to the host in that predetermined amount of time. Example of these mechanics include, but are not limited to, media choice (e.g., MRAM, PRAM, RRAM, etc.) and material for the media, process node, I/O circuit behavior, I/O circuit protocol, intermittent logic dies, controller delays, data errors (BER, defects) that require higher or lower ECC which means more or less number of NVM dies, placements of NVM devices and controllers, NVM communication channel delays (e.g., command vs data groups of commands, shared data and command, serializer/deserializer (SerDes) vs parallel), and NVM channel connection options (e.g., Through Silicon Via (TSV), Through Silicon sideWall (TSW), direct, intermediary).

Accordingly, in the embodiment shown in FIG. 15, the RCD 1520 is configured (e.g., by programming a processor in the RCD 1520 with firmware/software or by providing a purely hardware implementation) to receive and respond to the new read command discussed above. Specifically, the RCD 1520 in this embodiment is configured to provide a ready signal on the CMD/Addr line whenever the DBs 1550 contain the data in response to a read command and is further configured to instruct the DBs 1550 to release their data to the host (after a predefined delay) in response to the RCD 1520 receiving a send command.

Figure 16:
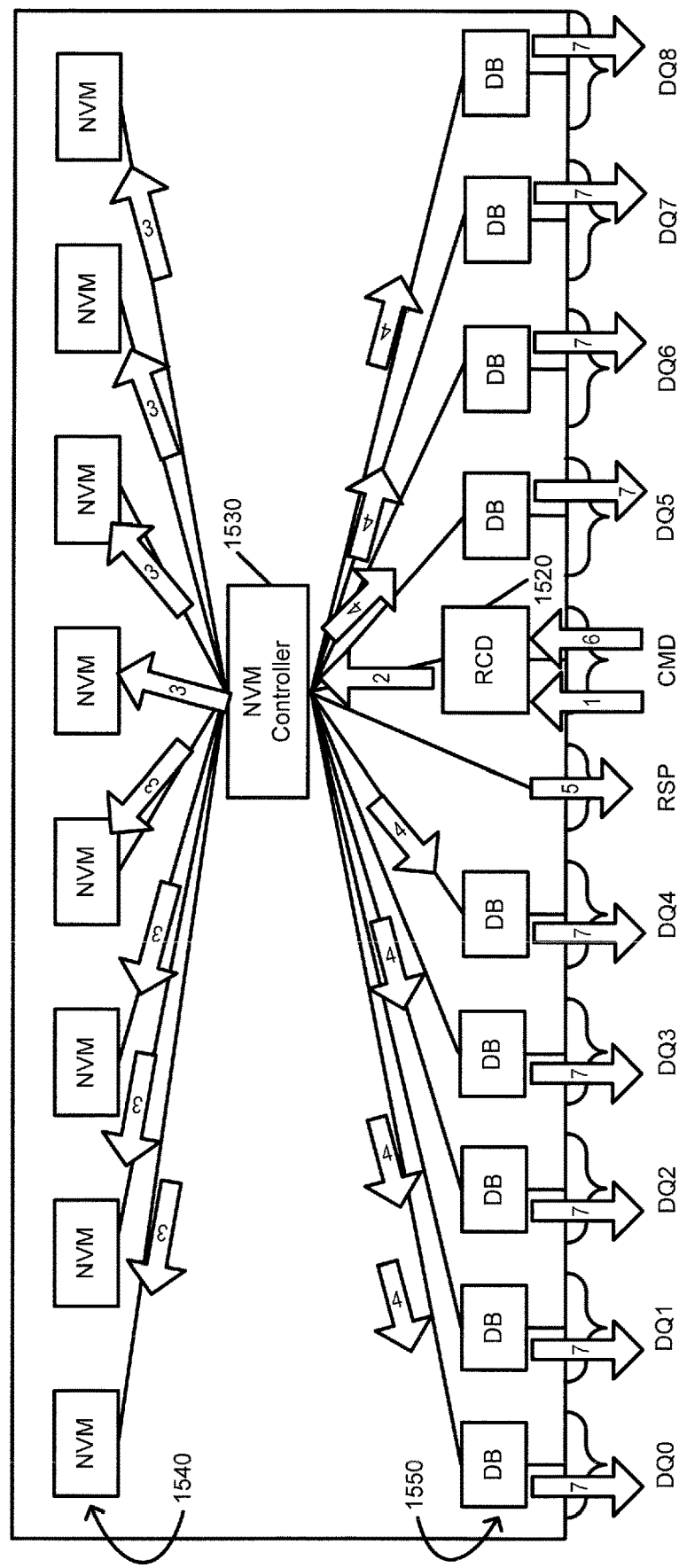
FIG. 16 is a block diagram illustrating a read operation of a storage system of an embodiment.

FIG. 16 is a block diagram illustrating a read operation. As shown in FIG. 16, a read command received by the RCD 1520 from the memory controller in the host (arrow 1). The address and read command are then transmitted from the RCD 1520 to the NVM controller 1530 (arrow 2). The read command is processed and transmitted to the relevant NVM devices 1540 (arrow 3), and the read data returns to NVM controller and then onward to the DBs 1550 (arrow 4). When the RCD 1520 knows that the DBs 1550 contain the data (e.g., by polling or otherwise communicating with the DBs 1550 or after being instructed by the NVM controller 1530), the RCD 1520 sends the RD_RDY signal to the memory controller in the host (arrow 5). In response, the memory controller in the host issues a SEND command on the command bus (arrow 6), and, in response, the RCD 1520 instructs the DBs 1550 to transmit the data to the host (after an optional specified delay (tsend)) (arrow 7).

Figure 17:
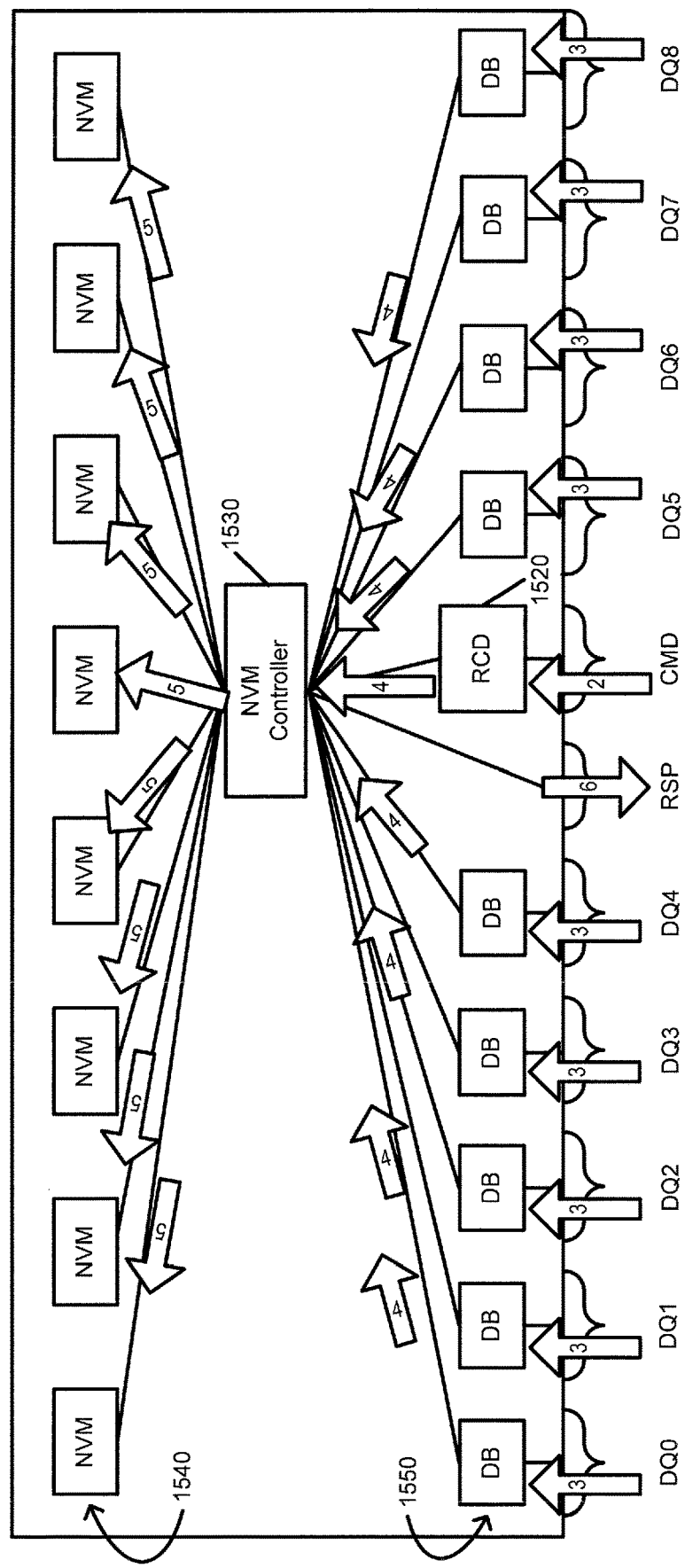
FIG. 17 is a block diagram illustrating a write operation of a storage system of an embodiment.

Turning now to the write operation (see FIG. 17), first, the memory controller in the host checks the write count to ensure that there is a remaining credit for the write operation. If there is, the memory controller in the host transmits a write command and address to the RCD 1520 (arrow 2), and the memory controller decrements its write credit count. Next, the memory controller in the host transmits data to the DBs 1550 after a specified JEDEC delay (arrow 3). Then, the command and data are transmitted from the RCD 1520 and DBs 1550 to the NVM controller 1530 (arrow 4), although the RCD 1520 may pass the address and command before the data from the DBs 1550 arrives. Next, the write data is committed to the NVM devices 1540 (arrow 5), and the write credit is passed back to the memory controller in the host on the bus (arrow 6). It should be noted that actions 5 and 6 can be swapped. However, if persistence is required before write credit confirmation, then it may be preferred to perform action 5 before 6. If persistence is not required before write credit confirmation, then it may be preferred to perform action 6 before 5. Either way, the memory controller in the host increments the write credit count (the write credit response back to the host 100 can be either single credits or multiple credits per message to the host 100).

Due the mechanics of reading and writing to NVM memory devices, read and write commands might not be completed in the order in which they were received. As discussed above, a second-received read command (Read B) may be completed before a first-received read command (Read A), for example, if Read B is a higher priority or if the physical address of Read A is unavailable for reads and Read A is scheduled for a later time. This is not an issue for DRAM-based DIMMs because read and write commands are processed in the order in which they are received. However, this can be a problem with NV-DIMMs, as the data released by the NV-DIMM to the host may not be the data that the host expects (e.g., the host is expecting to get data from Read A but instead gets data from Read B). To address this issue, an identifier (ID) is associated with various commands to keep track of what data belongs to which commands. This will be illustrated in FIGS. 18 and 19.

Figure 18A:
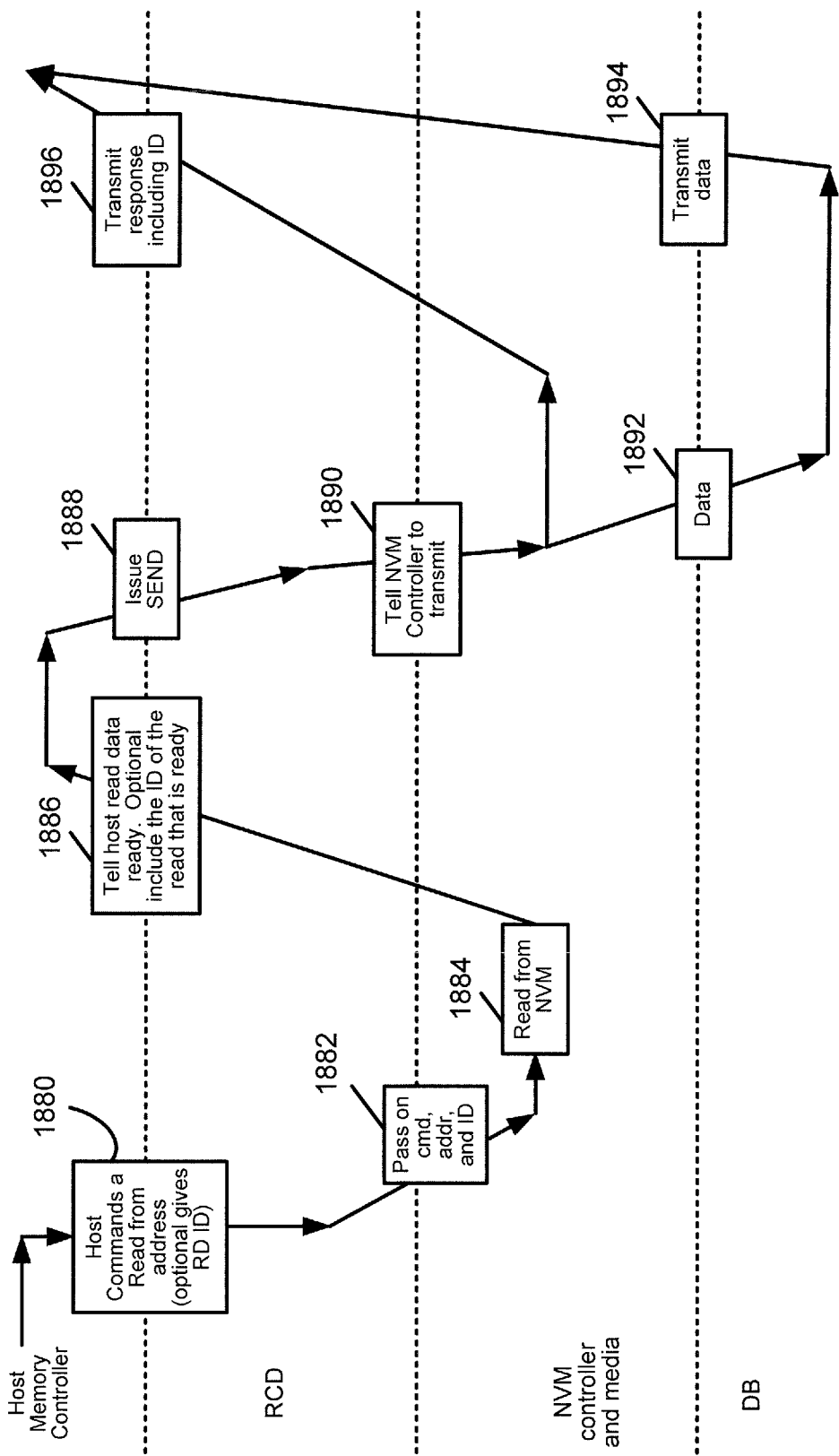
FIGS. 18A and 18B are a flow charts of a read operation of an embodiment.

FIG. 18A is a flow chart of a read operation of one embodiment using the storage system 1500 in FIG. 15. As shown in FIG. 18A, the host commands a read from an address (and givens an optional read ID (act 1880). The RCD then passes on the command, address, and ID (act 1882). It should be noted this ID (which can be used to allow for out-of-order operations) may or may not be the same as the ID received from the host. Next, the data is ready from the NVM (act 1884), and the RCD tells the host that the read data is ready (and optionally includes the ID of the read that is ready) (act 1886). The host then issues the send signal (act 1888), and the RCD tells the NVM controller to transmit (act 1890). The data (1892) is then transmitted (act 1894), along with a response including the ID (act 1896).

Figure 18B:
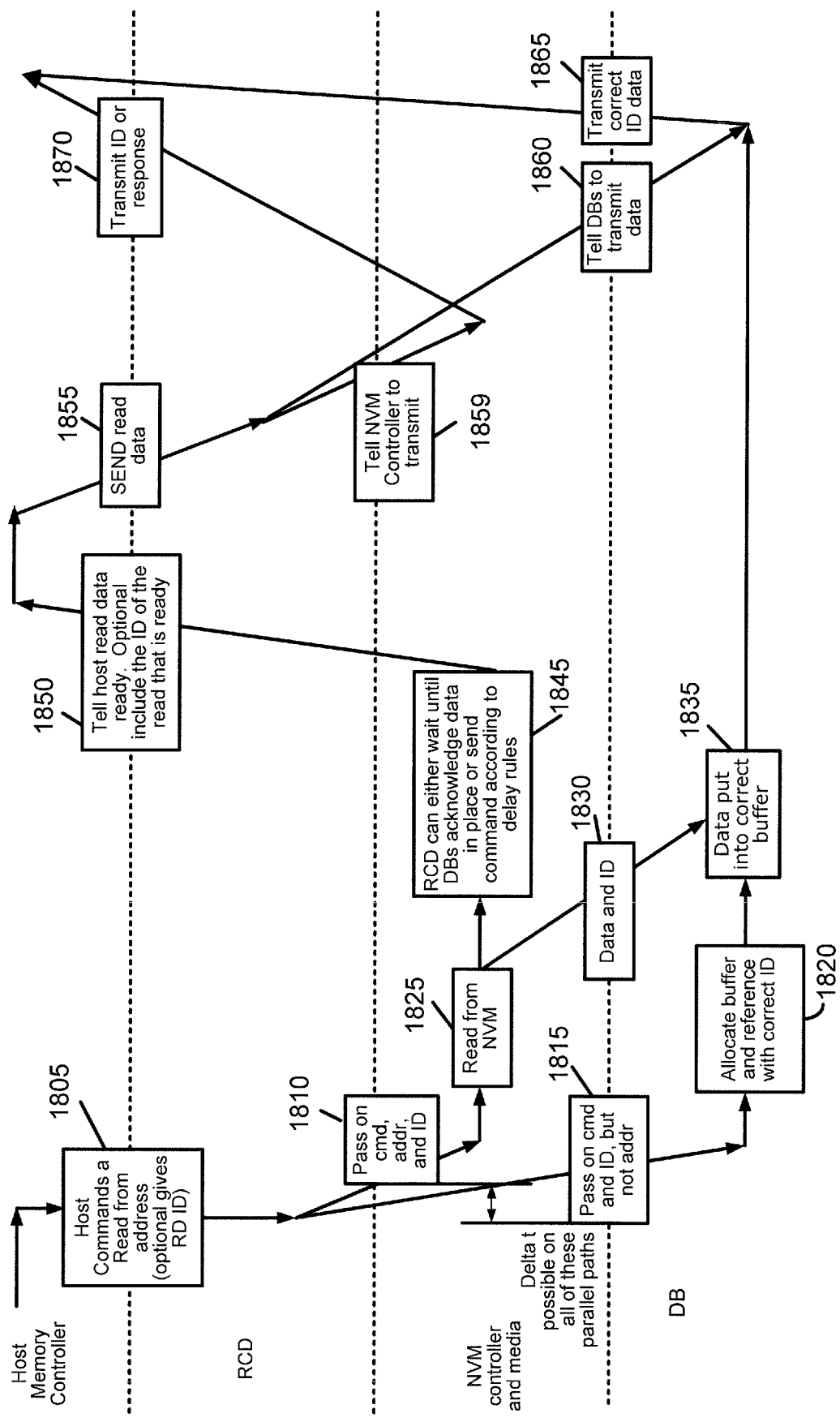

FIG. 18B is a flow chart of a read operation of another embodiment. As shown in FIG. 18B, the host 100 commands a read from an address and includes an optional read identifier (ID) (act 1805). The RCD 1520 receives the command, address, and ID to the NVM controller 1520 (act 1810). The RCD 1520 also passes the command and ID (but not address) to the DBs 1550 (act 1815). In response, the DBs 1550 allocate space for the read data and reference that allocated space with the ID (act 1820). (In another embodiment, the DBs always have some space available, and the ID is correlated in a delayed fashion to the ID contained within the RCD.) After the NVM controller 1530 reads the requested data from the NVM devices (act 1825), the NVM controller 1520 sends the data and the ID to the DBs 1550, which puts the data into the allocated space identified by the ID (act 1835). The NVM controller 1520 also sends a completion signal and the ID to the RCD 1520 (act 1840), which can either wait until the DBs 1550 acknowledge the data is in place or wait a predefined time (act 1845). After either the DBs 1550 acknowledge storing the data or after the predefined time has elapsed, the RCD 1520 tells the host 100 that the read is ready (and can also include the ID) (act 1850). The host 100 later sends a send command (with the ID) to request the read data (act 1855). The RCD then tells the NVM controller to transmit (act 1859). In response, the NVM controller tells the DBs 1550 to transmit the data associated with the ID after an optional predetermined delay specified by a standard (act 1860). The DBs 1550 then transit the data associated with the ID (act 1865), and the RCD transmits its corresponding info (act 1870).

Figure 19A:
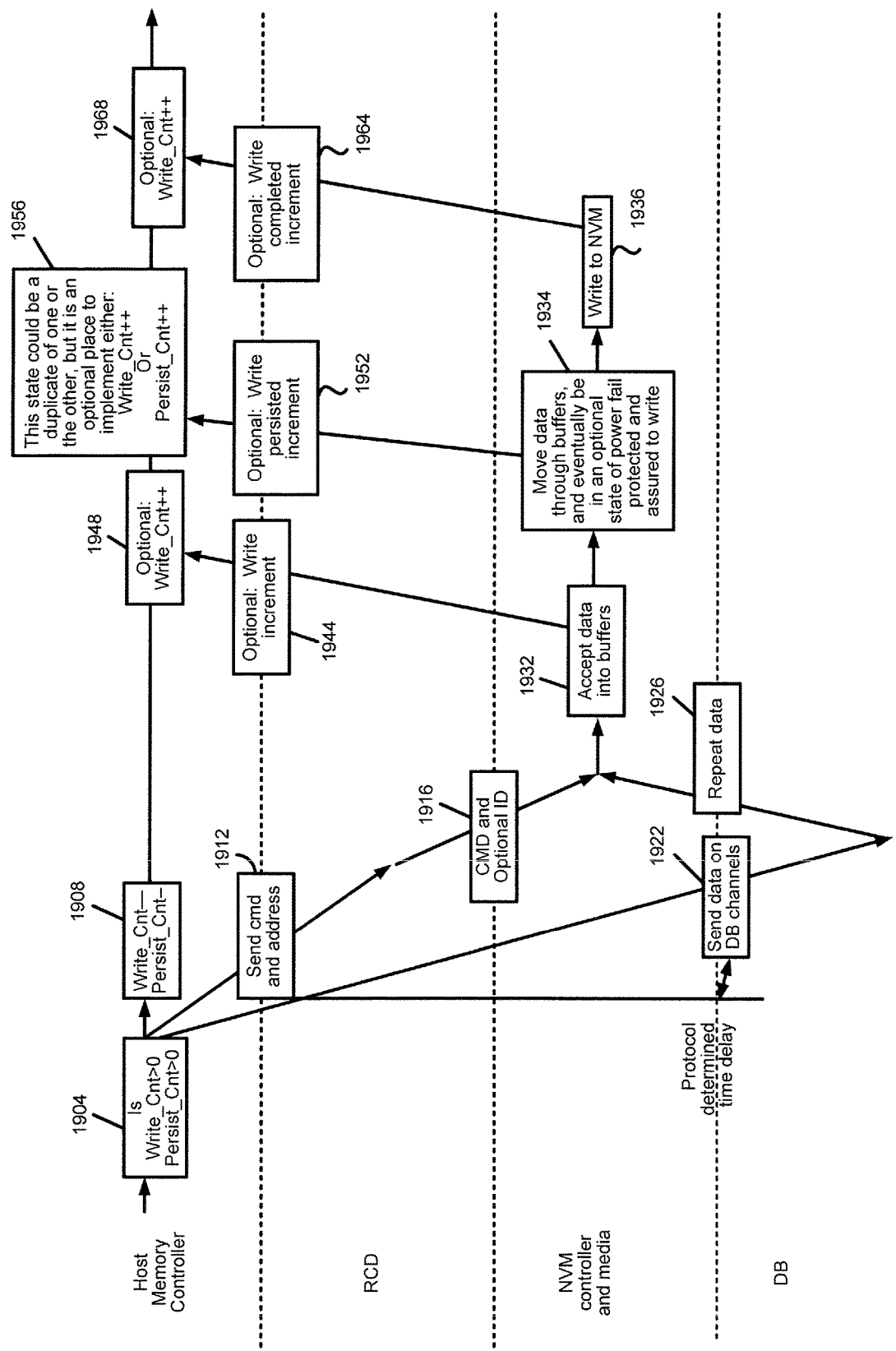
FIGS. 19A and 19B are flow charts of a write operation of an embodiment.

Turning now to FIG. 19A, FIG. 19A is a flow chart of a write operation of an embodiment. As shown in FIG. 19A, the host 100 first determines if it can send a write command by checking whether there are any credits left in the write counter and/or checking if the persistence level is greater than 0 (act 1904). It should be noted that the write counter and persistence counter are optional and that an implementation can have one, both, or neither of the counters. This particular example uses both write and persistence counters, and, if the write is allowed, the host 100 decreases the count in both counters (act 1908). When the RCD 1520 receives the write command from the host 100, it sends the command and address to the NVM controller 1530 (act 1912) and sends the data to be written to the DBs 1550 (act 1922). The RCD 1520 can also include the optional ID in embodiments where the NVM controller 1530 is pulling the data from the DBs 1550 (act 1925). The data is then repeated (act 1926). The NVM controller 1530 then accepts the data from the DBs 1550 into its write buffers (act 1932). The NVM controller 1530 then moves the data through its buffers and can eventually be in an optional state of being power-fail protected and assured to write (act 1934). The NVM controller 1530 the writes the data to the NVM devices 1540 (act 1936).

In this embodiment, there are three places that the storage system 100 can communicate the write is complete back to the host 100. The protocol may or may not differentiate between them, and it may or may not track them separately. Also, there may be times that customers or manufacturers will implement different behaviors. As shown in FIG. 19, in one embodiment, the write persist indicator and counter are incremented (acts 1944 and 1948). In another embodiment, the write persistence indicator and counter are incremented (act 1952 and 1956). In yet another embodiment, the write complete indicator and counter are incremented (acts 1964 and 1968).

Figure 19B:
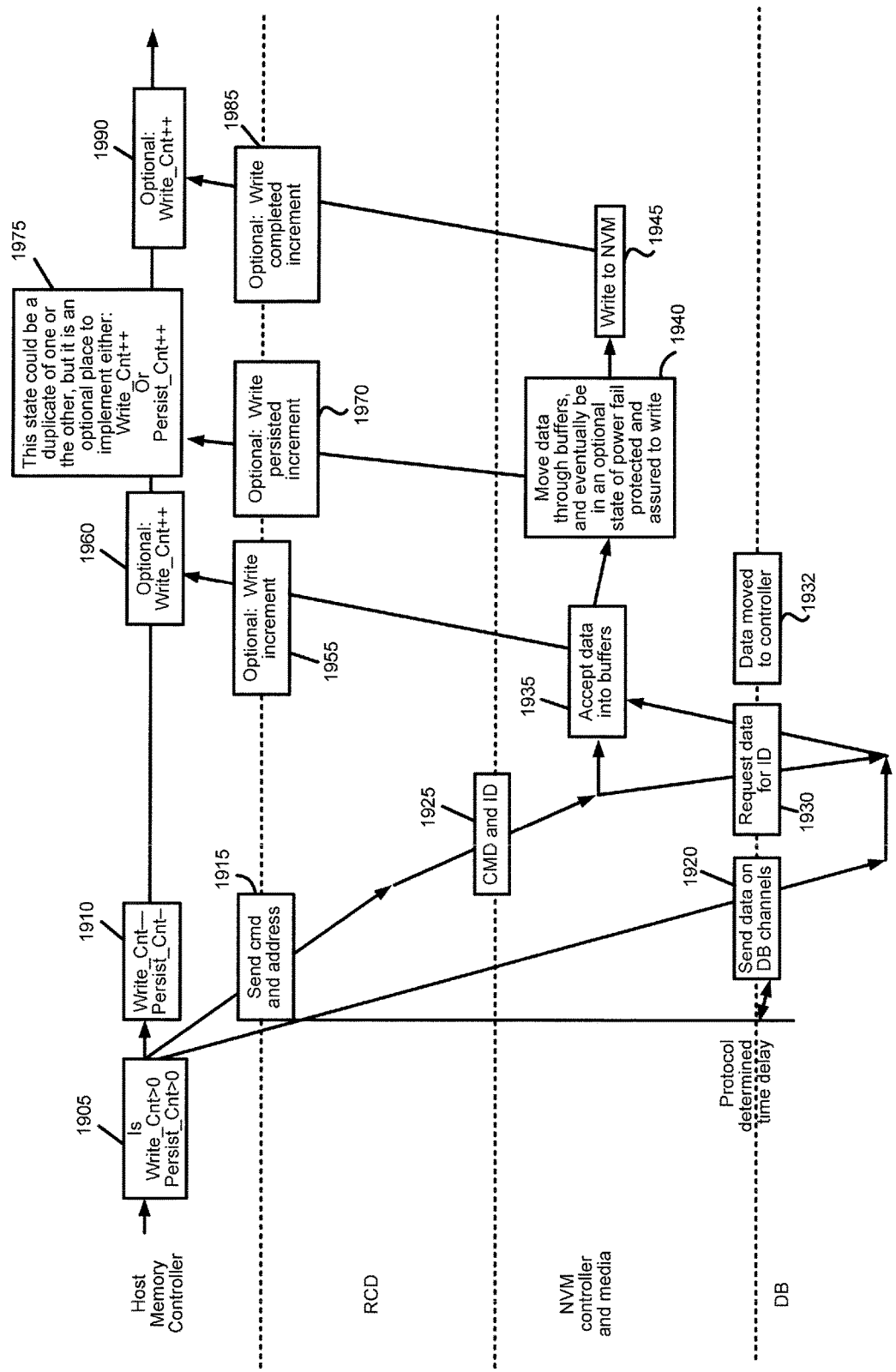

FIG. 19B is a flow chart of a write operation of another embodiment. As shown in FIG. 19B, the host 100 first determines if it can send a write command by checking whether there are any credits left in the write counter and/or checking if the persistence level is greater than 0 (act 1905). It should be noted that the write counter and persistence counter are optional and that an implementation can have one, both, or neither of the counters. This particular example uses both write and persistence counters, and, if the write is allowed, the host 100 decreases the count in both counters (act 1910). When the RCD 1520 receives the write command from the host 100, it sends the command and address to the NVM controller 1530 (act 1915) and sends the data to be written to the DBs 1550 (act 1920). The RCD 1520 can also include the write ID in embodiments where the NVM controller 1530 is pulling the data from the DBs 1550 (act 1925). If the NVM controller 1530 does not pull the data from the DBs 1550, the DBs 1550 push the write data to the NVM controller 1520, as coordinated by the RCD 1520, to request data for ID (act 1930). The data is then moved to the NVM controller 1530 (act 1932). The NVM controller 1530 then accepts the data from the DBs 1550 into its write buffers (act 1935). The NVM controller 1530 then moves the data through its buffers and can eventually be in an optional state of being power-fail protected and assured to write (act 1940). The NVM controller 1530 the writes the data to the NVM devices 1540 (act 1945).

In this embodiment, there are three places that the storage system 100 can communicate the write is complete back to the host 100. The protocol may or may not differentiate between them, and it may or may not track them separately. Also, there may be times that customers or manufacturers will implement different behaviors. As shown in FIG. 19, in one embodiment, the write persist indicator and counter are incremented (acts 1955 and 1960). In another embodiment, the write persistence indicator and counter are incremented (act 1970 and 1975). In yet another embodiment, the write complete indicator and counter are incremented (acts 1985 and 1990).

Figure 20:
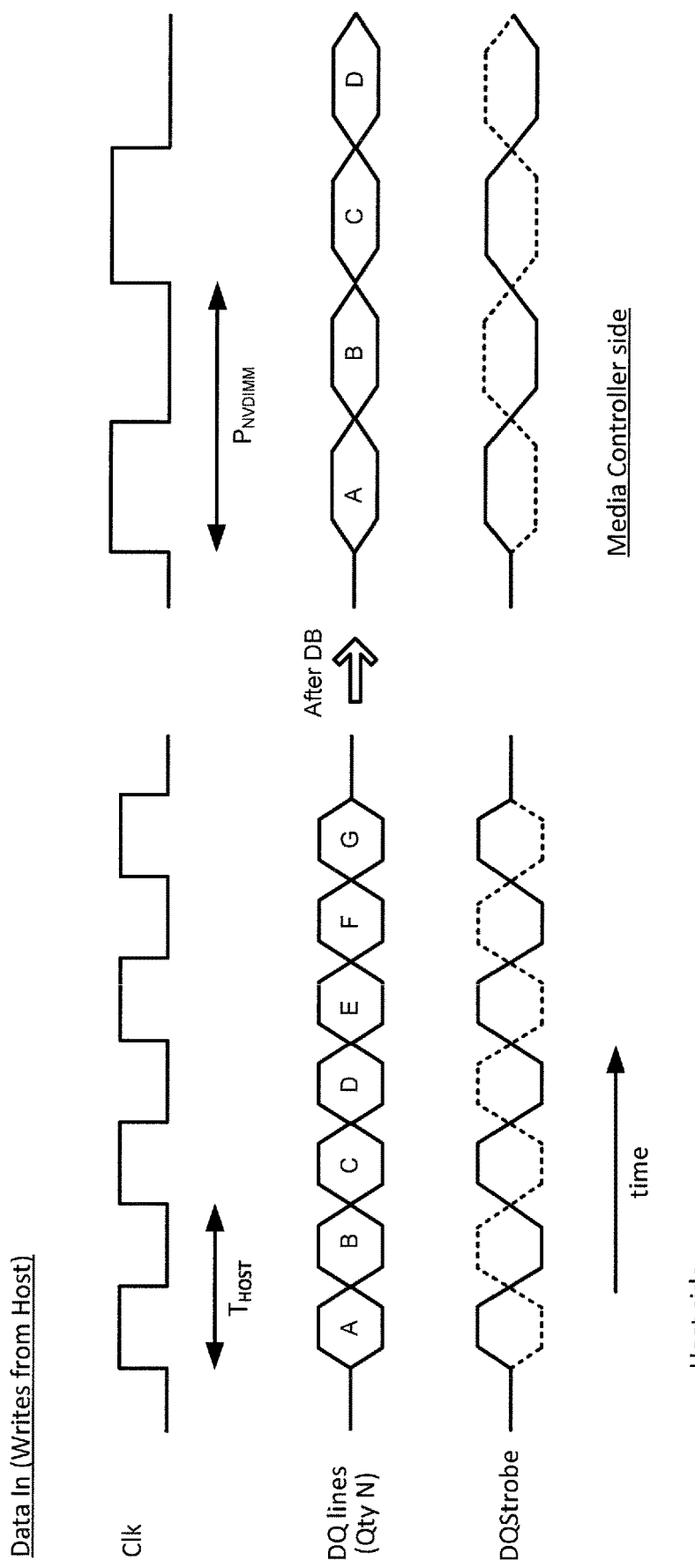
FIG. 20 is a diagram showing a change of clock speed of an embodiment.

Another issue that may need to be addressed due to the use of a NVM controller 1520 is clock rate, as the NVM controller 1520 may need a slower clock than that generated by the host 100 on the SDRAM bus. High-speed bus lines from traditional DIMMs may require complex circuity in the input/output connections on the NVM controller 1520, as well as careful routing in the storage system 1500. To address this, in one embodiment, the RCD 1520 can change the clock speed to transmit data in the internal lines in the storage system 100 at a slower frequency. (As an alternative to the RCD 1520 performing this functionality, the NVM controller 1520 or some other component in the storage system 100 can change the clock speed.) This is shown diagrammatically in FIG. 20 for incoming data (the same conversion can apply in reverse for sending data back to the host 100). FIG. 20 shows clock, DQ, and DQ strobe signal from the host 100 side (left portion of FIG. 20) and from the NVM controller 1530 side (right portion of FIG. 20). As shown in this drawing, the clock signal from the host 100 is at a frequency Thost, which due to the DDR protocol, causes data and data strobes to occur at a relatively-high frequency, which may be too much for the NVM controller 1530 to handle without significant changes to its circuitry. In contrast, as shown by the right portion of FIG. 20, by slowing down the clock to Tnvsdimm, data and data strobes can be slowed down to a relatively-low frequency, which is easier for the NVM controller 1530.

The RCD 1520 can be configured to slow down the clock using any suitable method. For example, the RCD 1520 can contain clock dividers to generate slower clocks from the source clock (e.g., by dividing the frequency by an integer to create a slower frequency). The RCD 1520 can also contain a phase-locked loop (PLL) to increase the clock frequency, which can be important for dividing the clock frequency by a non-integral fraction. For example, to divide the clock frequency by 3/2 (or, in other words, multiply by ⅔), a PLL can be used to first double the clock frequency before dividing it down by three. As another example, the RCD 1520 can have delay compensation circuitry (e.g., a phase-locked loop can contain the delay to compensate for in its feedback loop, and thus the delay would be subtracted automatically from the clock output; or explicit delay-locked loops can be added to explicitly adjust the delays). As yet another example, the RCD 1520 can have data synchronizers that slow down the data, not just the clock. This can be done using a first-in-first-out memory, which has the advantage of safely moving the data from one clock domain from another.

As mentioned above, instead of implementing these clock-changing components in the RCD 1520, they can be implemented in the NVM controller 1520. Also, the RCD 1502 may include the clock and data reclocking functions in order to relax the signal integrity and routing requirements on the DIMM-internal wiring. Furthermore, three clocks can be used (one to talk to the host (very fast), one to send data to the media controller (less fast), and one to talk to the NVM (even less fast)), in which case both the NVM controller 1520 and the RCD 1520 could be doing some clock conversion.

In embodiments where the data clock rate decreases as it passes through the RCD, the clock is preferably distributed to all the DBs. Thus, the DBs can receive a copy of the host clock and the media-controller side clock. Also, the RCD preferably knows how slow the media controller side clock is, so it can keep up its job of synchronizing the DB data transfers.

Also, in addition to clock conversion, there can be bandwidth considerations. For example, in the left portion of FIG. 20, bandwidth is defined as: N bits*(1 ns)/(Thost) 1 GHz, or N/(Thost/1 ns) [Gbits/sec]. In the right portion of FIG. 20, bandwidth would be defined as: N/(nvdimm/1 ns) [Gbits/sec]. There are various approaches that can be used to account for the bandwidth difference. For example, one approach uses serializers and deserializers to achieve the same bandwidth as a DDR across the DIMM. The deserializer can take a narrow bus of N bits with a frequency off cycles/sec and a transfer rate of f*N bits/sec and transform it to a wider bus of N*a bits, with a frequency of f/b cycles per second, and a transfer rate of f*N*a/b bits/sec (for a=b, the bandwidth is the same for the wider, slower bus). Using the serializer can transform the width back to N bits with a frequency of f cycles/sec.

In another approach, queues can be used to compensate for the bandwidth mismatch. The bus width is the same for DB input and output. In this approach, incoming data (from the host 100 to the NVM controller 1330) is held in a buffer, which can be, but does not have to be, a first-in-first-out (FIFO) memory. The use of a buffer may result in the transmission to the NVM controller 1520 taking longer, but the buffer provides a temporary holding location during transfer. Outgoing data (from the NVM controller 1530 to the DBs) can be collected in a buffer (such as, but not limited to, a FIFO) as it trickles in at a low bandwidth. The data can be retransmitted to the host only when a complete packet is received.

Figure 21:
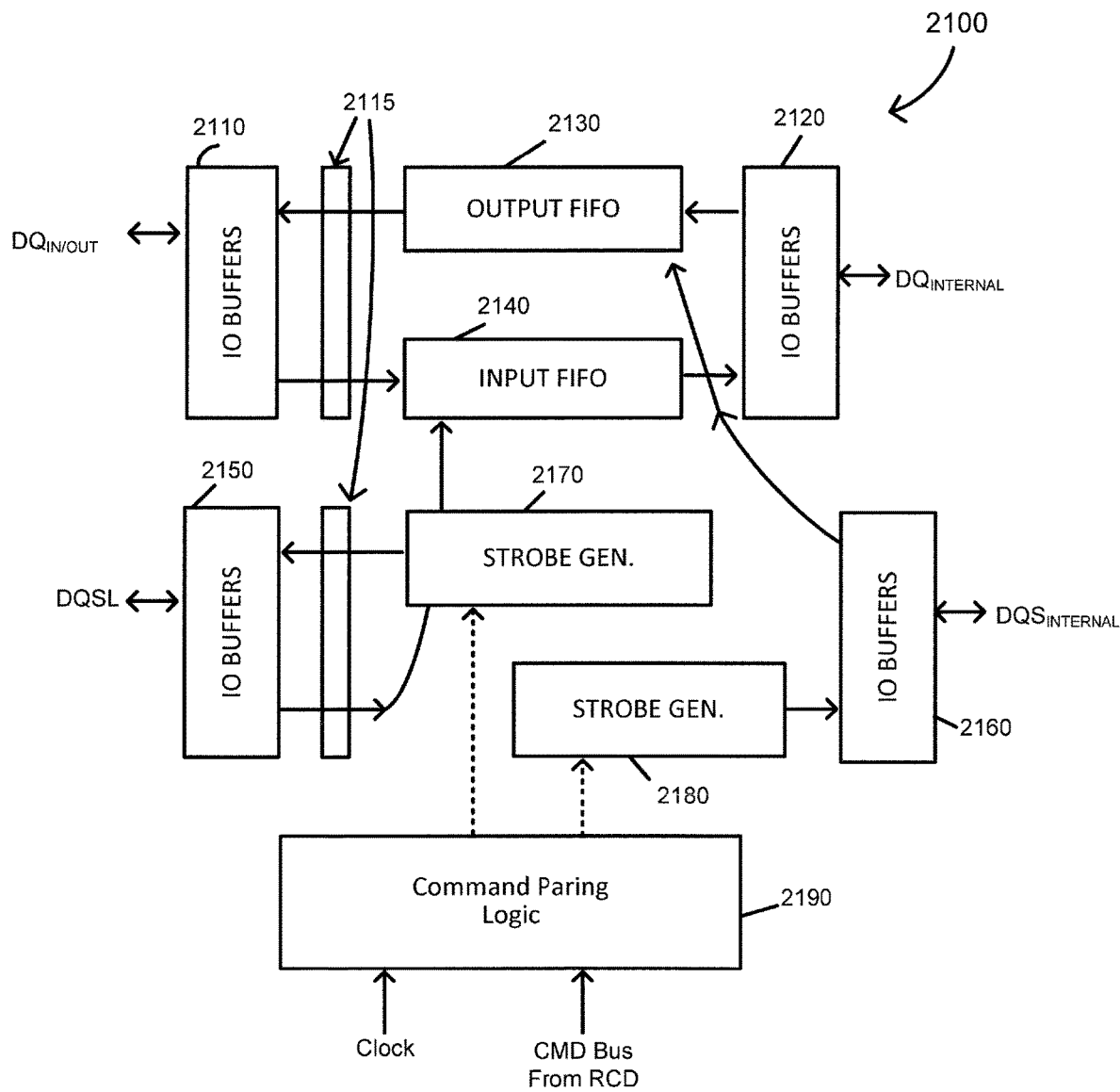
FIG. 21 is a block diagram of a data buffer.

Changes to the DBs 1550 can also be made to account for the use of non-volatile memory and the NVM controller 1530. To understand these changes, first consider a DB 2100 shown in FIG. 21. This DB 2100 comprises a set of components for the DQ signals and for the DQ strobe signals. As shown in FIG. 21, the components for the DQ signals comprise I/O buffers 2110, 2120, input and output FIFOs 2130, 2140, and synchronization/phase adjust logic 2115. The components for the DQ strobe signals comprises I/O buffers 2150, 2160 and strobe generators 2170, 2180. The DB 2100 also contains command parsing logic 2190 that has the clock and command bus signals as its input. In this embodiment, the FIFOs 2130, 2140 are used for caching data and are synchronized by the RCD and DQ strobe generators. In another implementation, the FIFOs are not used, and the DB 2100 is configured in "pass-through mode."

Figure 22:
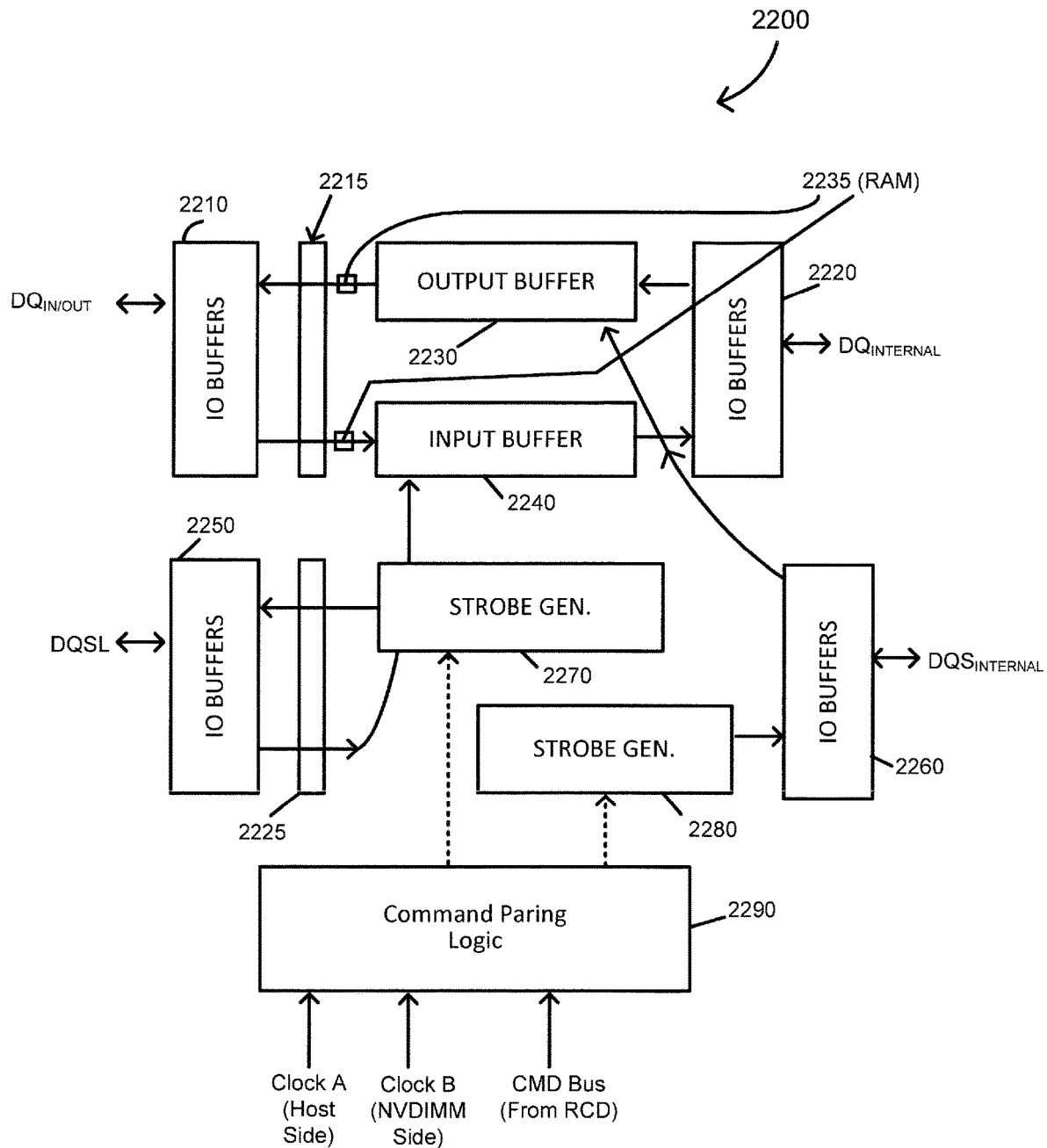
FIG. 22 is a block diagram of a data buffer of an embodiment.

If a DB is configured to downconvert data to a lower frequency, additional components may be used, as shown in FIG. 22. Like the DB 2100 in FIG. 21, the components for the DQ strobe signals comprises I/O buffers 2250, 2260 and strobe generators 2270, 2280, and the components for the DQ signals comprises I/O buffers 2210, 2220 and synchronization/phase adjust logic 2215. However, instead of input and output FIFOs, the DB 22 in FIG. 22 comprises I/O buffers 2230, 2240, and the command parsing logic 2290 contains the following inputs: Clock A (host side), Clock B (NV-DIMM side), and command bus signals from the RCD. Additionally, the DB 2200 contains dual-port, dual-clock random access memories 2235 to allow for out-of-order processing, as the input and output buffers 2230, 2240 serve as both a data store and a staging area for synchronization (a second FIFO can be used for further synchronization).

Returning to the drawings. FIG. 23 is an illustration of an alternative architecture to the one shown in FIG. 15.

Figure 23A:
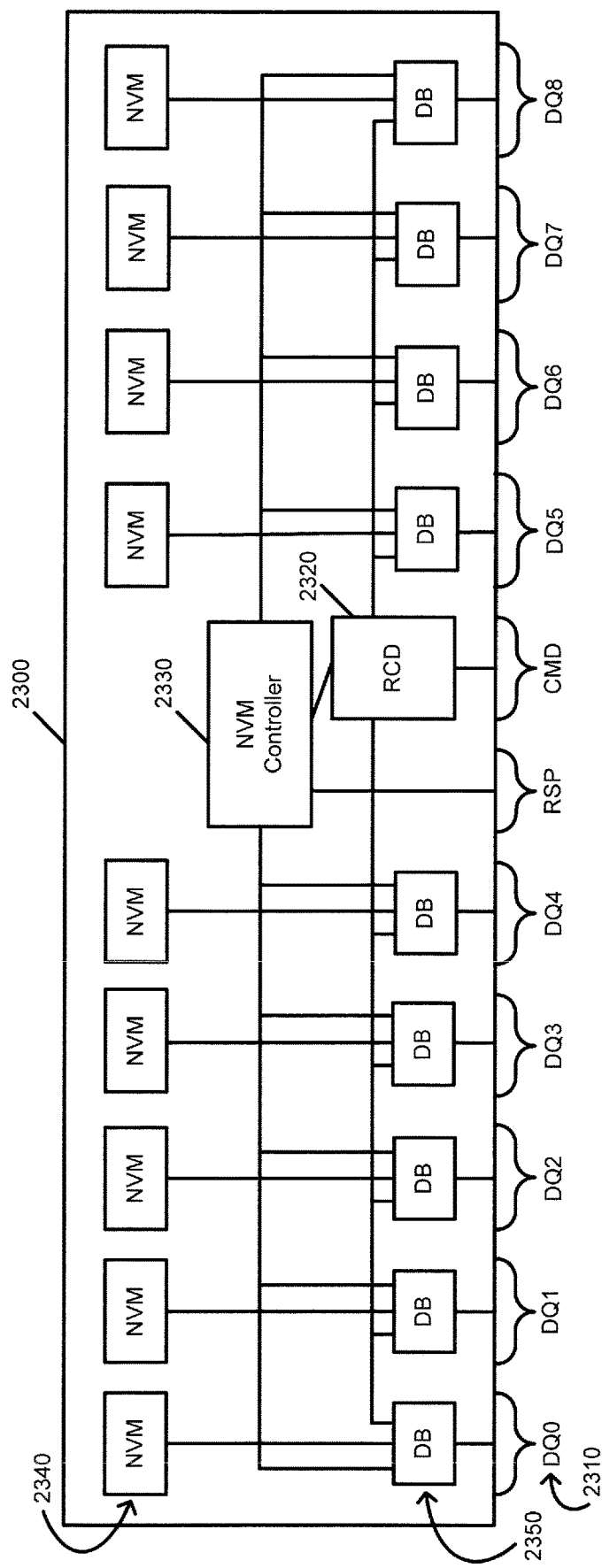
FIG. 23A is block diagram of a storage system of an embodiment in which non-volatile memory devices are connected to data buffers without going through an NVM controller.

As shown in FIG. 23A, the NVM devices 2540 connect to the DBs 2350 without going through the NVM controller 2330. This embodiment may be useful when NVM devices that operate at DRAM speed are able to match data rates with the DBs 2350 and the bus 2310. Writes and reads that conflict in media locations causing unforeseen latencies can be absorbed by the DBs 2350 without impacting the bus 2310. The NVM controller 2330 can coordinate the DBs 2350, RCD 2320, and NVM activity while allowing data to directly pass between the DBs 2350 and the NMV devices 2340.

Also, as noted above, the storage system with an RCD and DBs can be added in various variations of DIMMs (e.g., UDIMM, RDIMM, and LRDIMM). There are variations in each of these DIMM formats. For example, in terms of electrical routing rules, UDIMMs have straight short lines. UDIMMs generally have a small number of DIMMs, DRAM banks/ranks per package, and closest physical layout in server motherboard. The DRAM packages and command routing lines are all specified for repeatable system integration and system electrical interactions. This helps make UDIMMs have the cheapest production cost. RDIMMs have an RCD and generally have a larger number of DIMMs. DRAM banks/ranks per package are possible. DRAM Packages, terminations, routing for data, and RCD specifics are specified. RCD to DRAM connections are relaxed specifications. As compared to UDIMM, there is an incremental cost for RCD. LRDIMMs have isolators on all electrical communicating groups, and DB and RCD connections to the memory controller are tightly specified. LRDIMMs have the highest cost among these three formats, but the most number of DIMMs, BGAs, and banks/ranks per memory controller are allowed.

For each DRAM bus (UDIMM, RDIMM, LRDIMM), the storage system can use specifications on the external interacting components. These specifications can encompass physical and electrical characteristics for maximum interoperability. This can include changes to both the physical signaling layer (e.g., to match electrical specifications) and the command layer (e.g., to provide the appropriate command decode). Changes to the physical signaling layer may include the introduction of extra transmission lines in the control set, or changes to the geometry, impedance, and or termination of any of the clock, command, data or control set lines (including both standard SDRAM/DDR control set lines and the response bus). In the command layer, these changes can also include selecting among different Tsends, depending on the delay experienced by these different formats, or adding new interpretation to new commands (e.g., associating particular row decoding bits not with addresses within a rank, but rather inferred selection of additional ranks within a DIMM).

Also, parameterized specifications on the internal connections from an NVM controller to the RCD and DBs can be established. The internal connections can be optional to allow for vendor-specific optimizations, package integrations, or ASIC integration. The specifications can be sufficiently robust to handle diverse NVM controller placement, diverse data communication rates, and signal integrity characteristics. The specifications for RAM buffer sizing and RCD timing behaviors can also be used for successful vendor-agnostic interoperability.

Figure 23B:
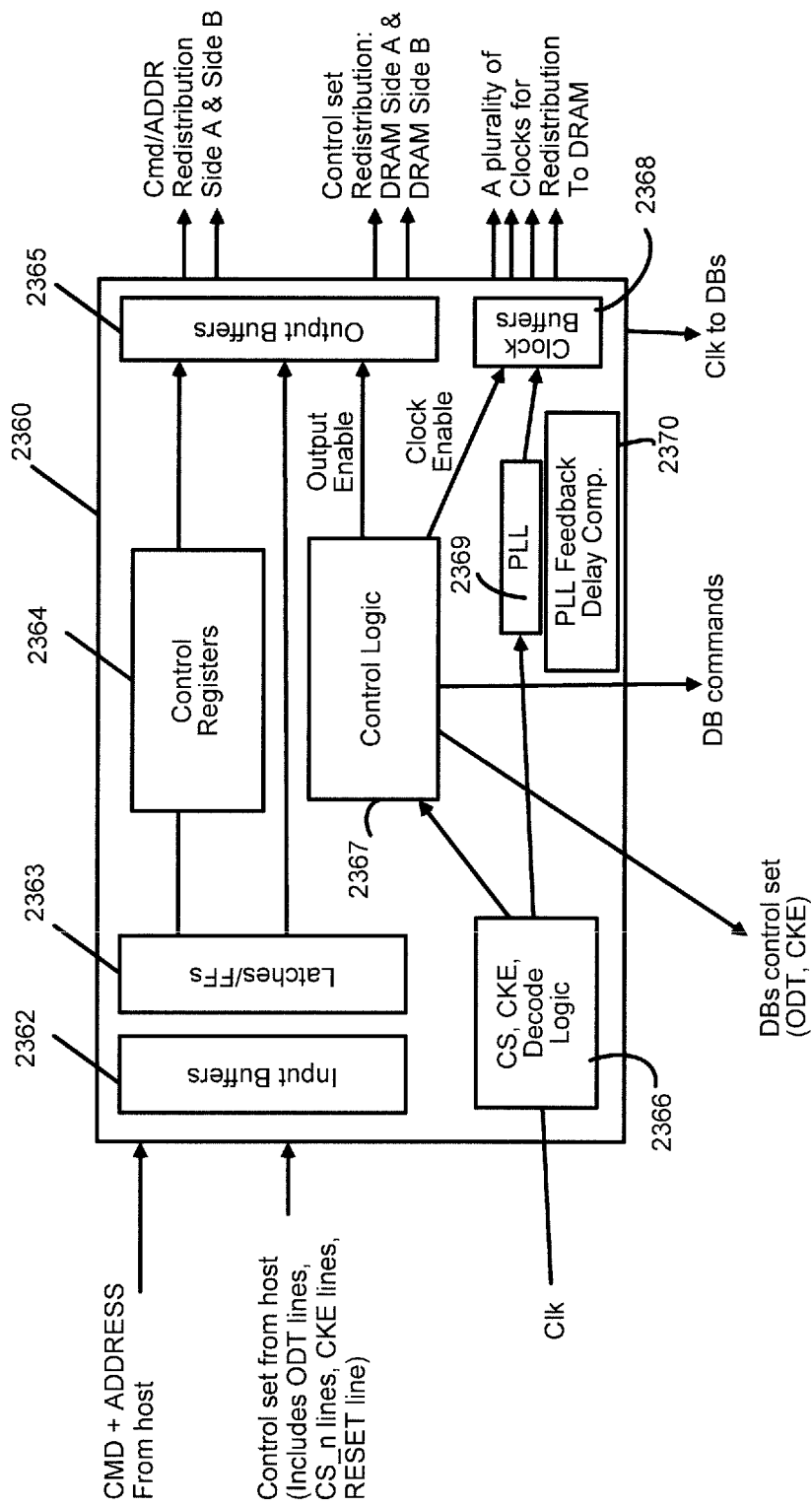
FIG. 23B is a block diagram of a registered clock driver (RCD) of an embodiment.

Returning to the drawings, FIG. 23B is an illustration of an RCD 2360 of an embodiment. As shown in FIG. 23B, the RCD 2360 in this embodiment comprises input buffers 2363, latches/FFs 2363, control registers 2364, output buffers 2365, CS, CKE, decode logic 2366, control logic 2367, clock buffers 2368, a PLL 2369, and a PLL feedback delay compensation module 2370. Many of the circuit elements in this RCD 2360 may be similar to those found in the RCD discussed above. However, the configuration of the control logic 2367 can be changed to account for the nature of the non-deterministically-timed SNVRAM command sequences to support SNVRAMs. The control logic 2367 is responsible for the behavioral response of the RCD, and changes can be made so that the DRAM DIMM RCDs will be able to orchestrate the command flows shown in the flowcharts on FIGS. 18 and 19. The RCD also has the differentiating capability of understanding more commands, controls, and addresses. There may be additional outputs and inputs to synchronize new parts such as the NVM controller.

The DBs 1530 in FIG. 15 repeat data on those lines while still electrically separating the DQ traces on the DIMM from the rest of the memory channel, thereby improving signal integrity on these lines. In certain NVDIMM embodiments, the link between the NVM controller and the RSP pins may also benefit from similar electrical separation. Thus, in FIG. 24A, we show another NVDIMM embodiment 2400 with a response buffer (RB) 2405 to repeat response bus messages, while maintaining electrical separation along these lines between the NVM controller 1530 and the rest of the host memory channel.

RB devices also allow for better management of messages sent on the response bus. For instance, as mentioned above with respect to FIG. 15, after the NVM controller 1530 reads data from the NVM devices 1540 and send the data out to the DBs 1550, it sends a ready signal on the response line. However, at that point, the data might not, in fact, be ready to be send in response to a send command from the host, as there may be a delay in storing and synchronizing the data in the DBs 1550. To address the potential delay, the response buffer (RB) 2405 buffers the ready signal until the RCD 2410 knows the data is, in fact, ready to be sent from the DBs 2415; at which time, the RCD 2410 can instruct the RB 2405 to send the ready signal to the host.

When RBs are used, some of the acts discussed above in read and write operations that were performed by other components can be performed by the RB instead. For example, in FIG. 18A, acts 1886, 1894, and 1896 can be performed by an RB. In FIG. 18B, acts 1850, 1865, and 1870 can be performed by an RB. In FIG. 19A, acts 1944, 1952, and 1964 can be performed by an RB. In FIG. 19B, acts 1955, 1970, and 1985 can be performed by an RB.

There are many alternative architectures that can be used with an RB. For example, in the storage system 2400 in FIG. 24B, there is a split RB 2425, 2430, which may be needed if the response buffer pins are far apart from each other. It should be noted that while two RBs 2425, 2430 are shown in this drawing, more RBs can be used.

Figure 24A:
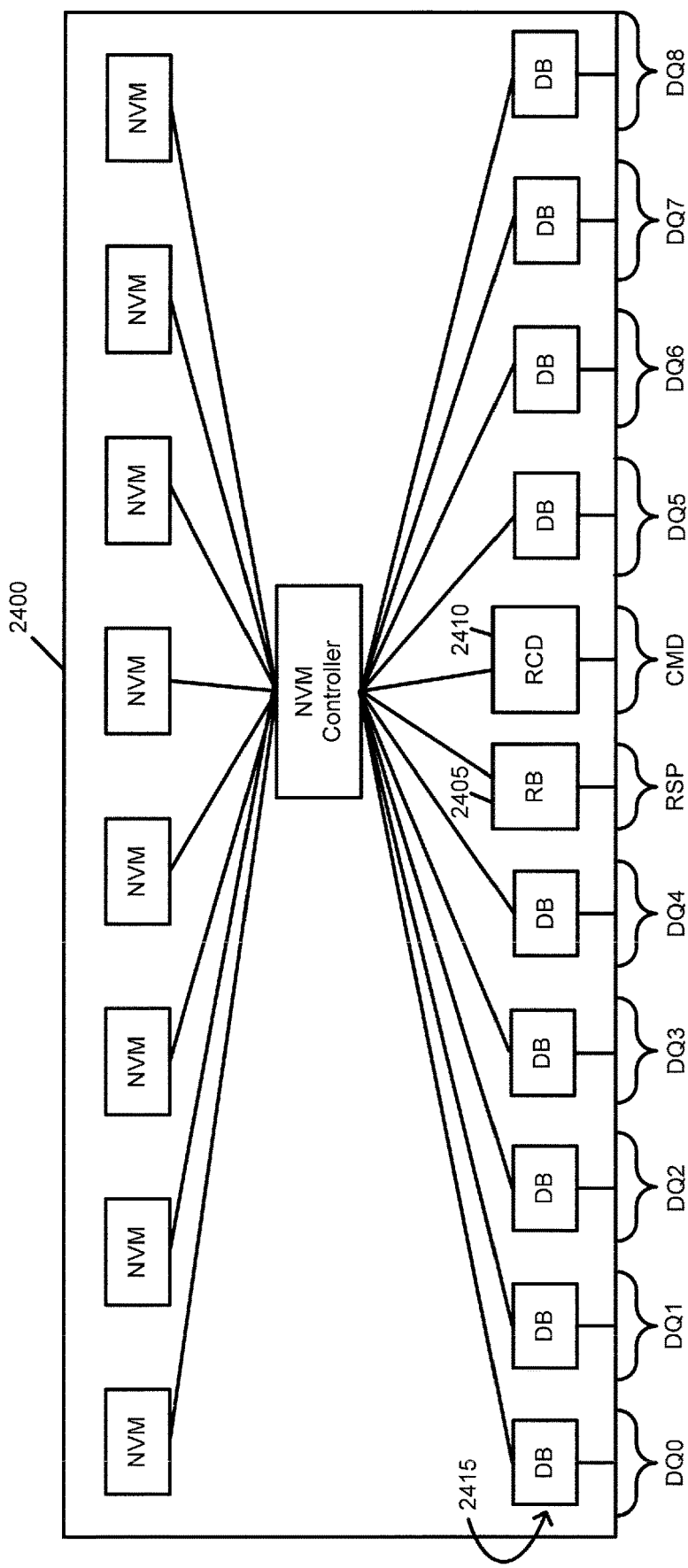
FIGS. 24A, 24B, and 24C are block diagrams of a storage system of an embodiment in which the storage system takes the form of a non-volatile dual in-line memory module (NV-DIMM) with a response buffer.
Figure 24B:
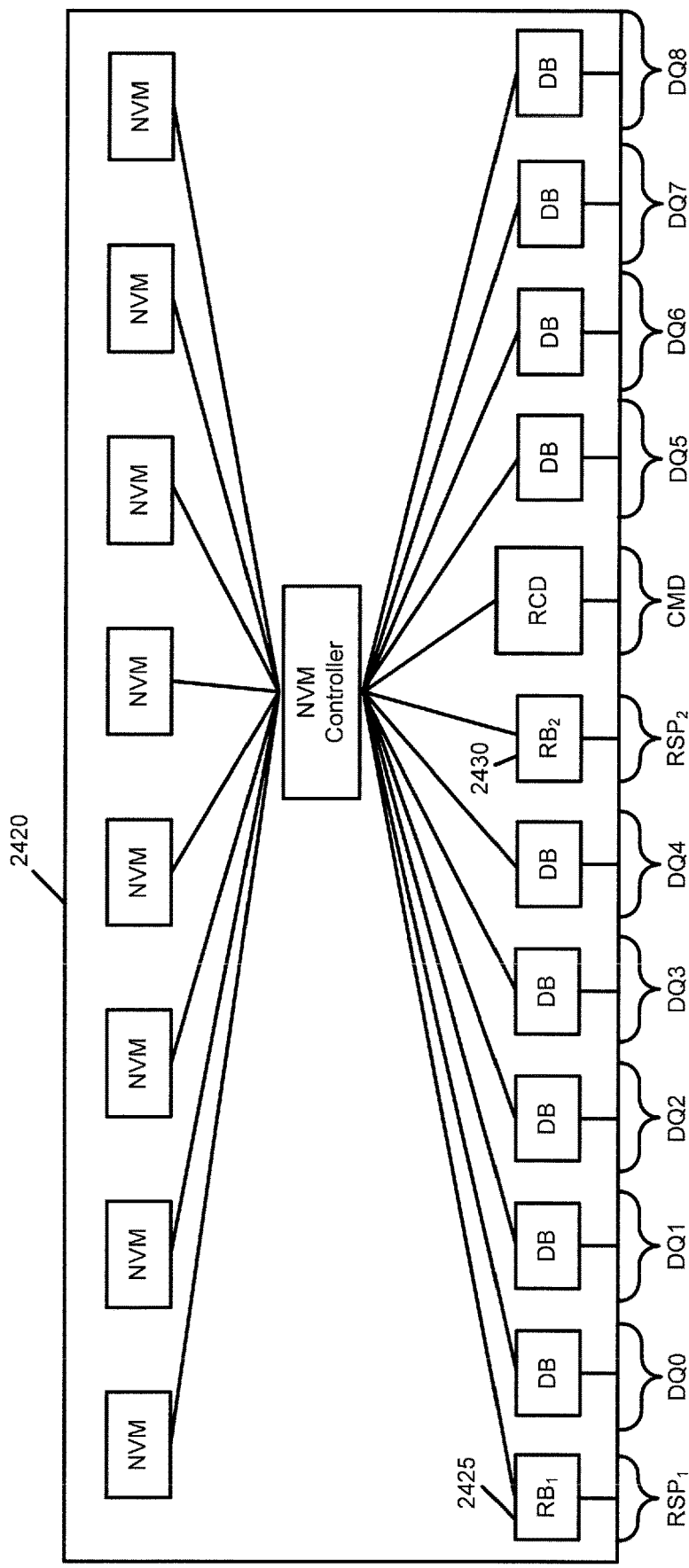
Figure 24C:
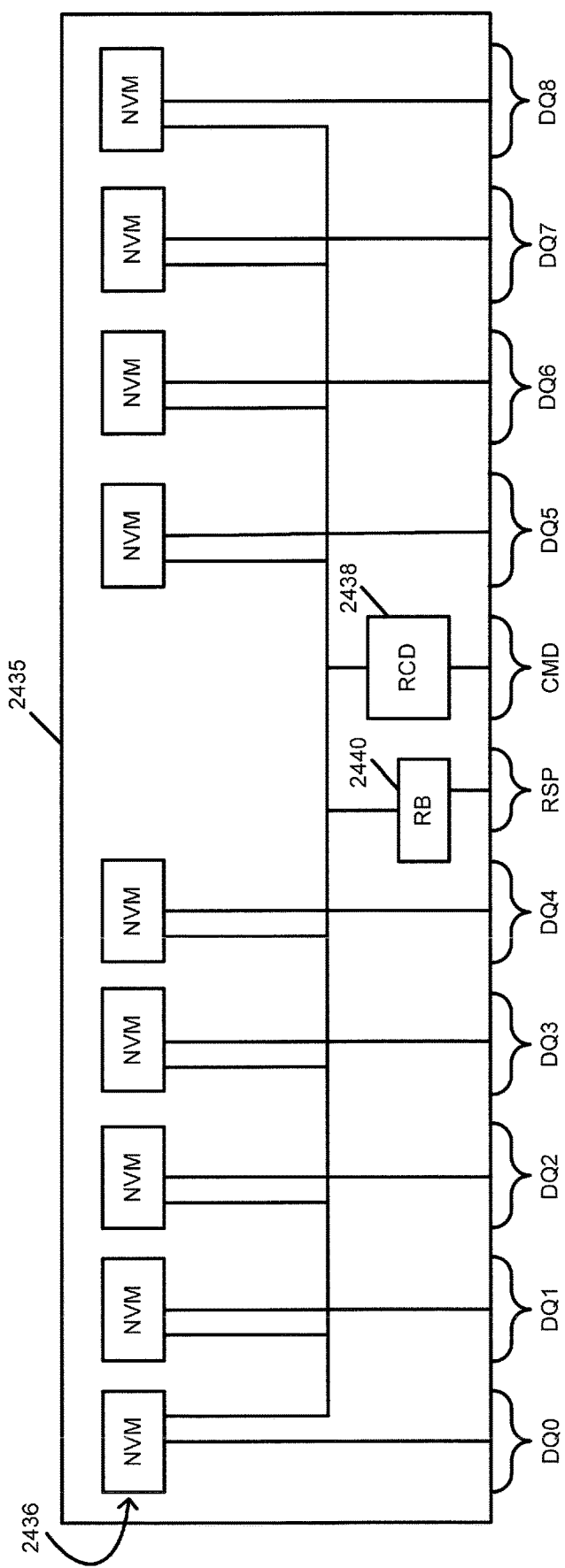

As another alternative, FIG. 24C shows a storage system 2435 where the NVM devices 2436 directly connected to the DQ lines. This embodiment has an RCD 2438 and an RB 2440 but no NVM controller (however, this embodiment is assuming a coordinating function in addition to the RB and RCD functionality). This architecture closely mimics a DRAM-based DIMM and has the hypothetical advantage of behavior emulating high cache hit rates. However, this architecture may not be ideal for absorbing media conflicts and buffering the DRAM bus from internal NV-DIMM behavior. For example, there can be direct degradation of DRAM bus traffic efficiency for every media conflict, and incubation of new/future NVM devices with unpredictable latencies, error rates, or defects can be hindered.

Figure 24D:
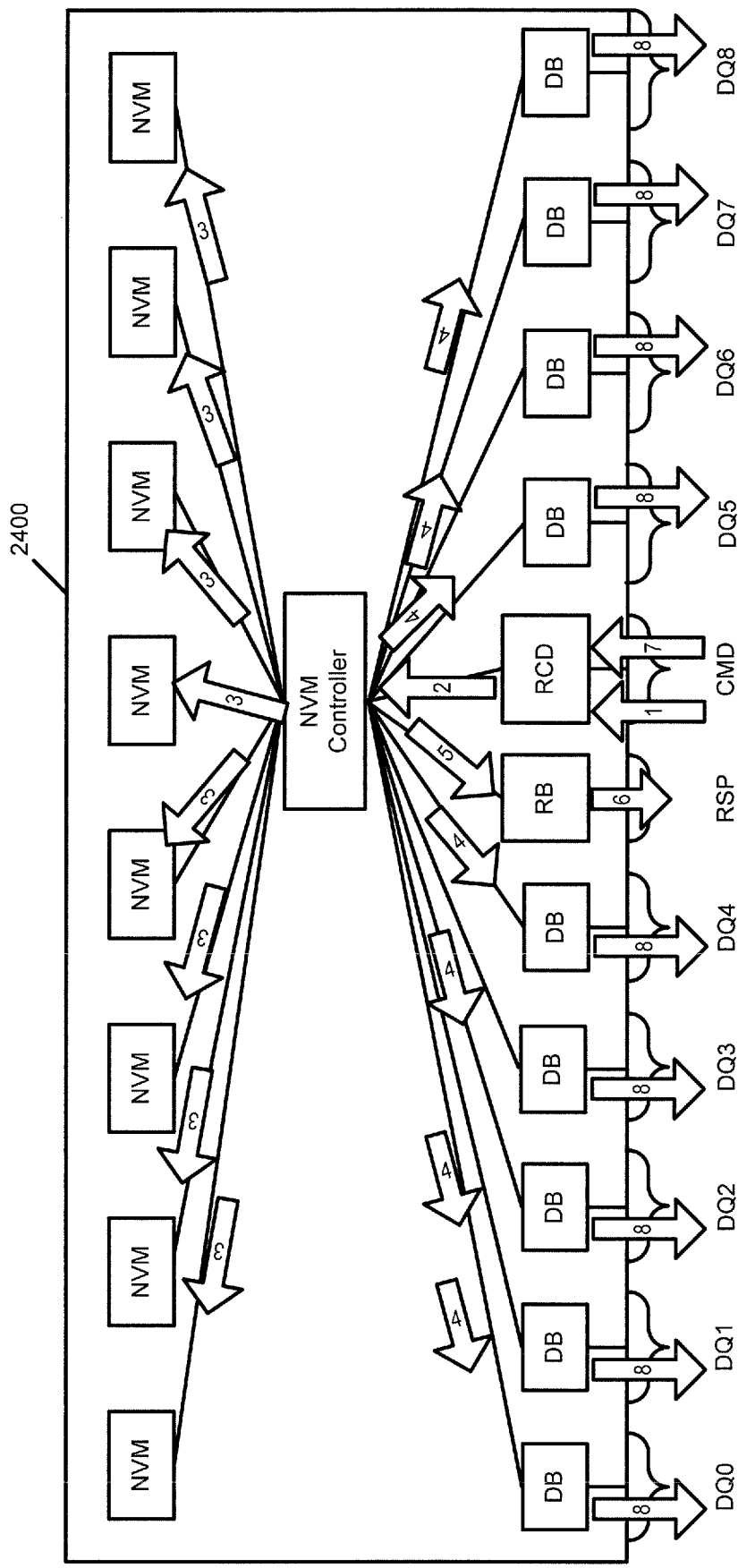
FIG. 24D is a block diagram showing a read operation of an embodiment.
Figure 24E:
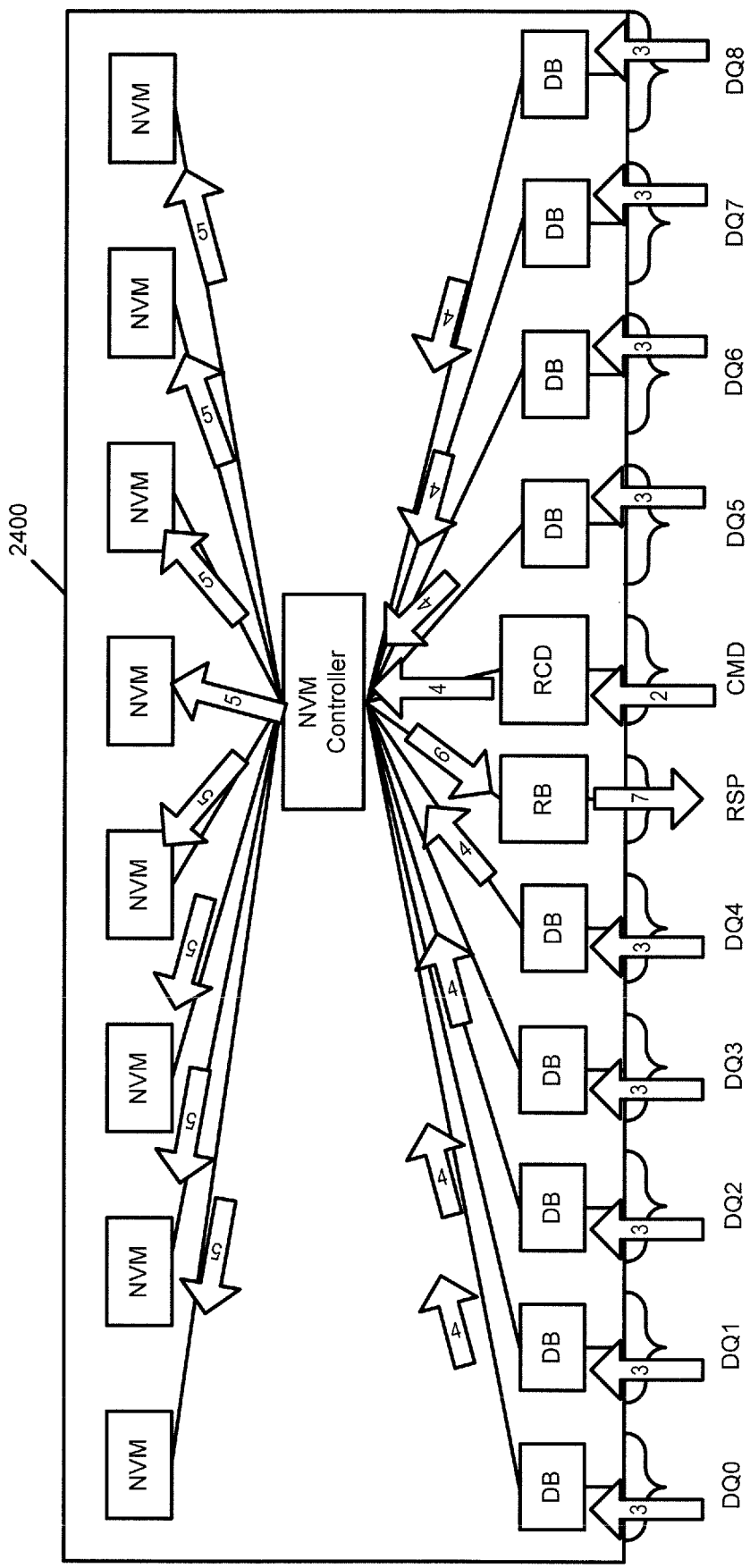
FIG. 24E is a block diagram showing a write operation of an embodiment.

Returning to the architecture shown in FIG. 24A as an example, the read and write flows can be similar to those discussed above with respect to FIGS. 16 and 17, but adjusted for the use of a response buffer. For example, FIG. 24D is a block diagram showing a read operation of an embodiment. As compared to FIG. 16, this embodiment includes an intermediate transmission step to the RB (arrow 5) before transmission to the host 100 (arrow 6). The step at arrow 5 (when the RB is told to send a ready signal to the host 100) can take place in parallel to the step at arrow 4 (data transmission step) or after a preset delay. FIG. 24E is a block diagram showing a write operation of an embodiment. As compared to FIG. 17, this embodiment includes telling the RB to give write credit(s) back to the host (arrow 6).

Figure 25A:
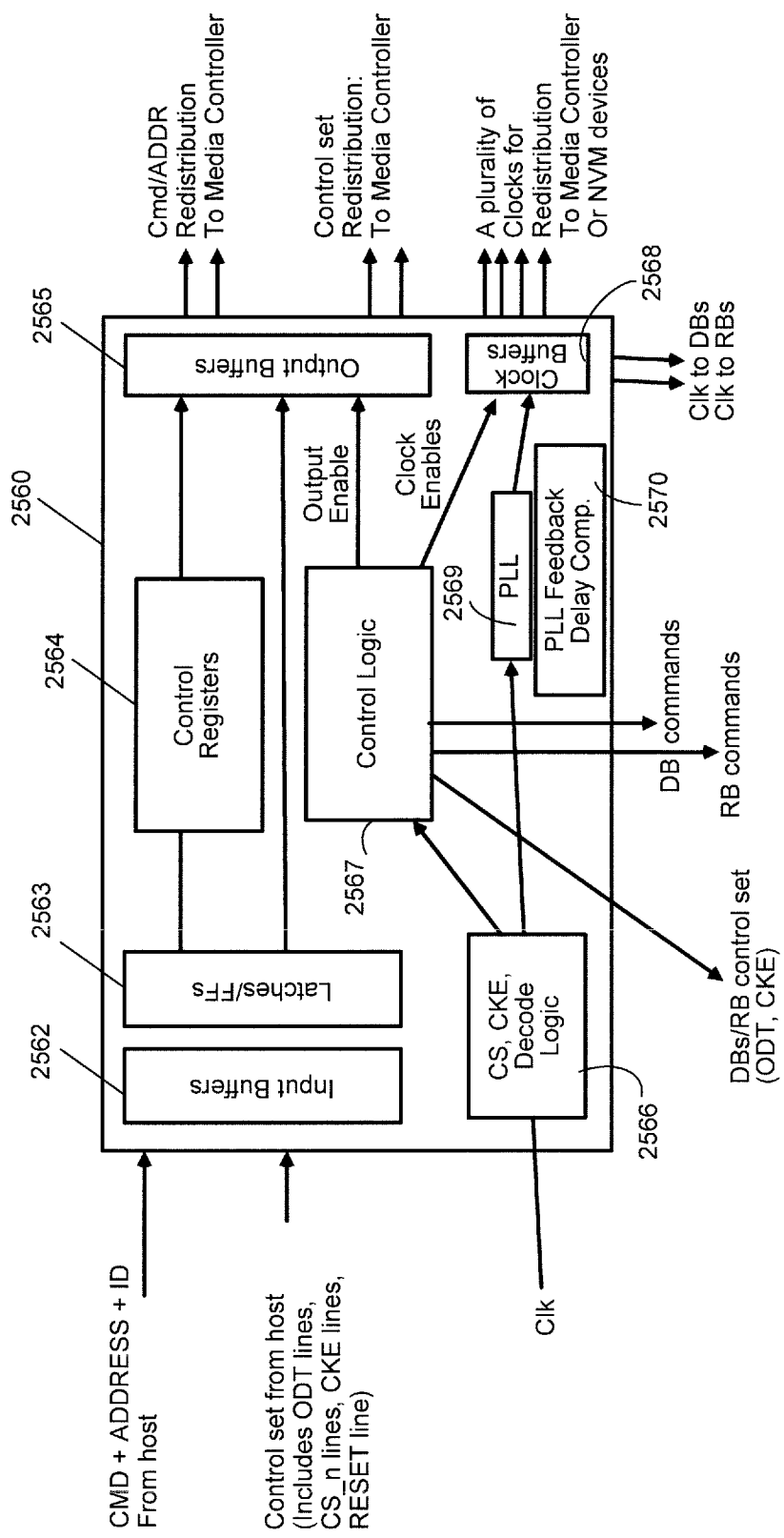
FIG. 25A is a block diagram of an RCD of an embodiment.

Returning to the drawings, FIG. 25A is an illustration of an RCD 2560 of an embodiment. As shown in FIG. 25A, the RCD 2560 in this embodiment comprises input buffers 2563, latches/FFs 2563, control registers 2564, output buffers 2565, CS, CKE, decode logic 2566, control logic 2567, clock buffers 2568, a PLL 2569, and a PLL feedback delay compensation module 2570.

Figure 25B:
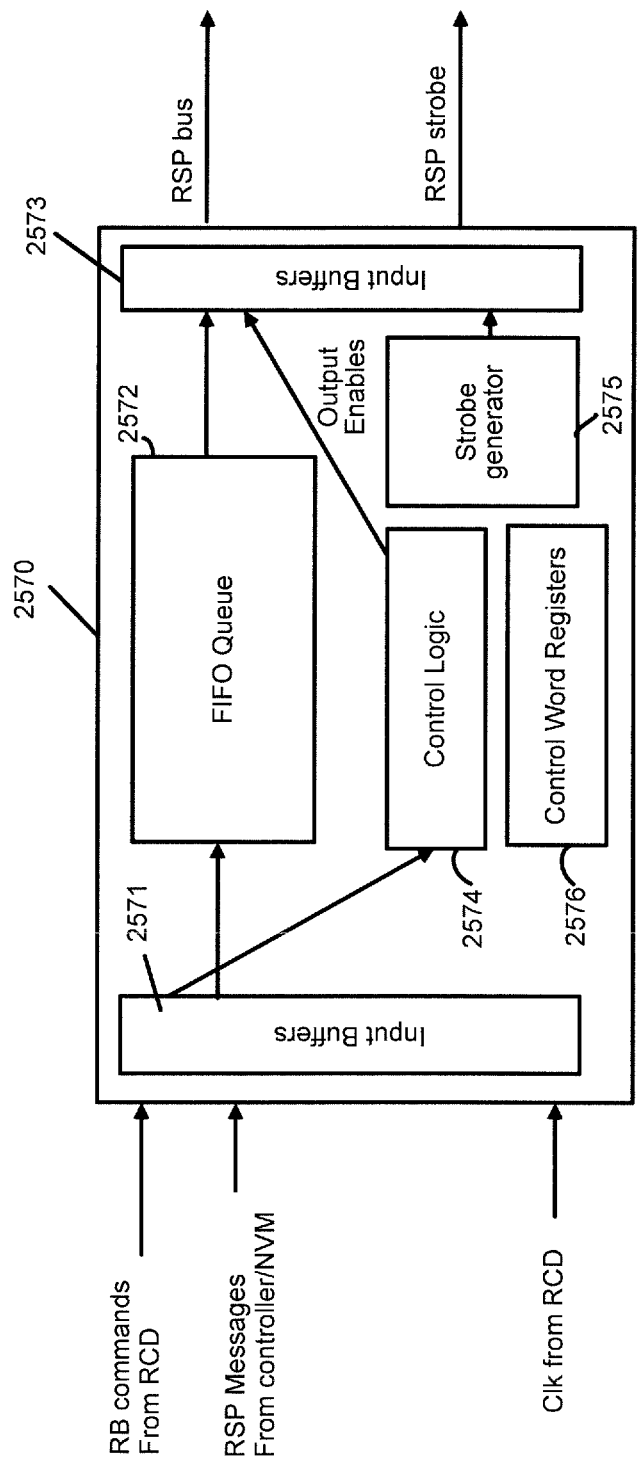
FIG. 25B is a block diagram of an RB 2570 of an embodiment.

FIG. 25B is a block diagram of an RB 2570 of an embodiment. As shown in FIG. 25B, the RB 2570 of this embodiment comprises input buffers 2571, a FIFO queue 2572, input buffers 2573, control logic 2574, a strobe generator 2575, and control word registers 2576.

Figure 25C:
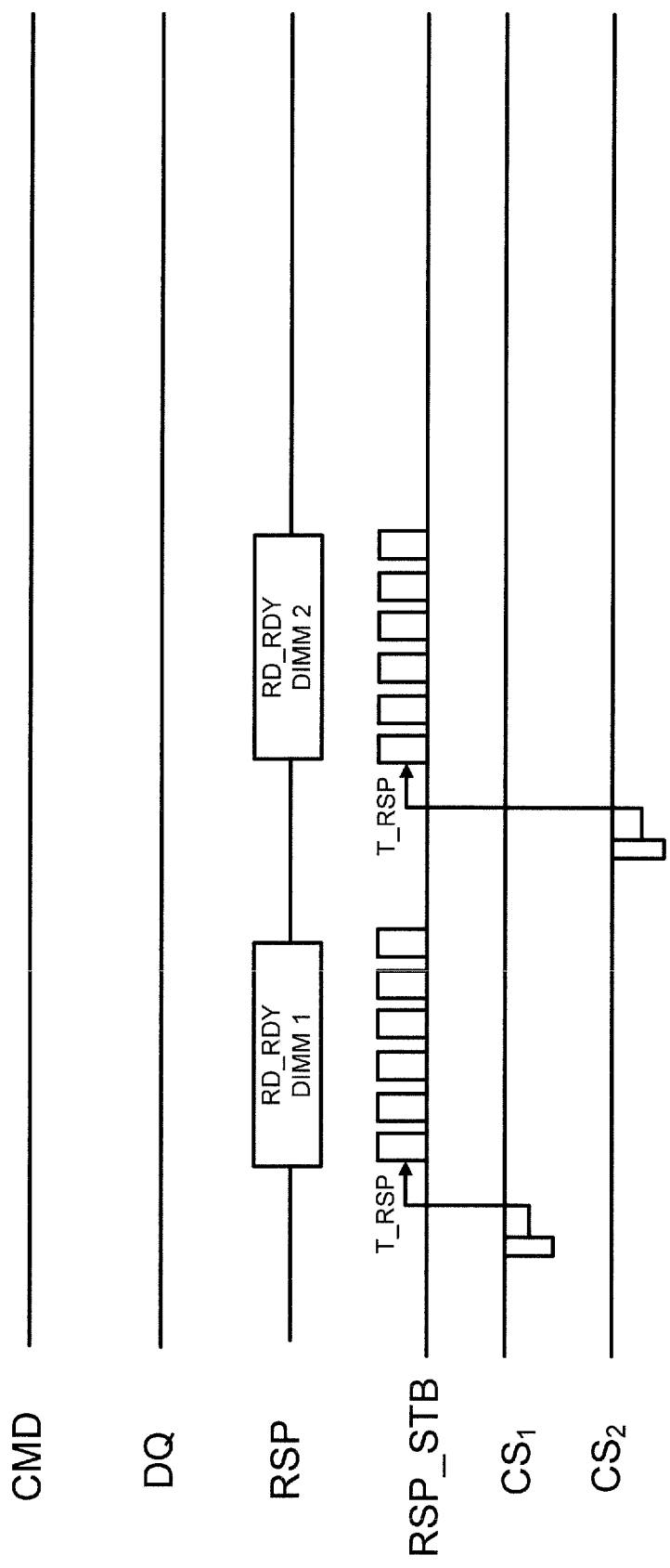
FIG. 25C is an illustration of bus arbitration of an embodiment.

As mentioned previously, some SNVRAM protocol variants may require a shared response bus for all DIMMs in the memory channel. In such embodiments, RBs are particularly important for maintaining signal integrity, just as DBs are important to maintain signal integrity along a shared DQ bus. Furthermore, such shared response bus arrangements can use additional arbitration schemes to avoid conflicts between RSP messages originating from two separate storage devices over the same lines. FIG. 25C is an illustration of bus arbitration of such an embodiment. In this embodiment, two NVM controllers wish to send an asynchronous message (e.g., RD_RDY or WC_INC). In this scheme, an unshared chip select signal (CS) that goes from the memory controller to each DIMM may be used by the memory controller to signal a window of response bus ownership to each DIMM in turn. In other embodiments, the memory controller may use other signals or sequences of voltages on the DDR lines to notify the storage device that it may transmit RSP messages in a window of response bus ownership. If at any time the storage device has no messages to send during its window, it simply transmits an "empty message": a protocol defined sequence of RSP bus voltages which are intended to be ignored by the memory controller.

Control signals entering the storage system pass through the RCD, and, as such, the RCD logically plays a central role in arbitrating asynchronous RSP messages from the NVM controller to the host. The mechanism by which the RCD coordinates RSP message transmission between the NVM controller will vary based on the behavior of the RB.

Figure 25D:
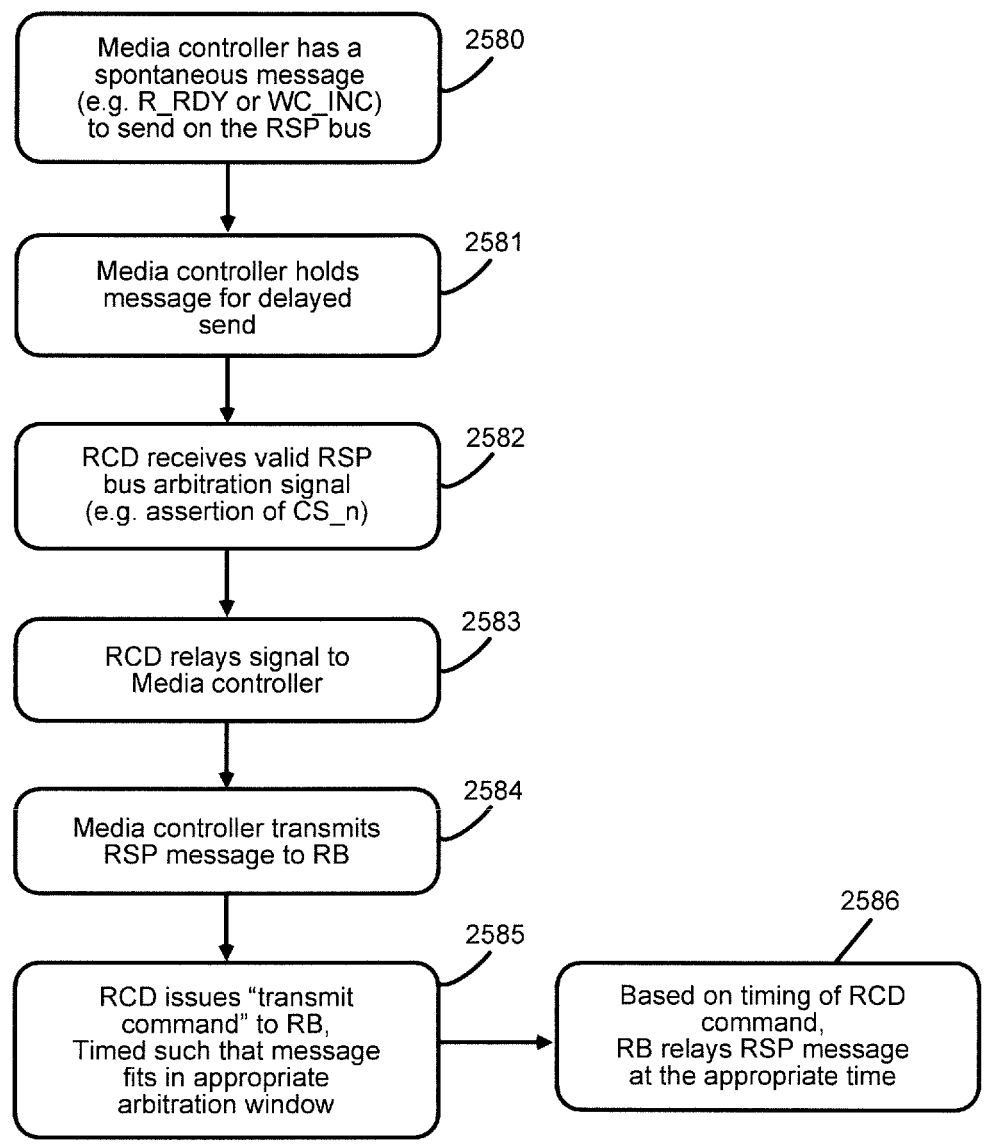
FIG. 25D is a flow chart of a pass-through RB of an embodiment.

In some embodiments, the RB may be configured in "pass-through" mode, meaning that spontaneous RSP messages from the media controller are not stored in the RB for an extended period of time. FIG. 25D is a flow chart of an RB operation in pass-through mode. As shown in this figure, the media controller has a spontaneous message to send on the RSP bus (act 2580). The media controller holds the message for delayed send (act 2581). The RCD receives a valid RSP bus arbitration signal (act 2582). The RCD relays the signal to the media controller (act 2583). The media controller transmits the RSP message to the RB (act 2584). The RCD issues a "transmit command" to the RB, timed such that the message fits in the appropriate arbitration window (act 2585). Based on the timing of the RCD command, the RB relays the RSP message at the appropriate time (act 2586).

Figures 25E, 25F:
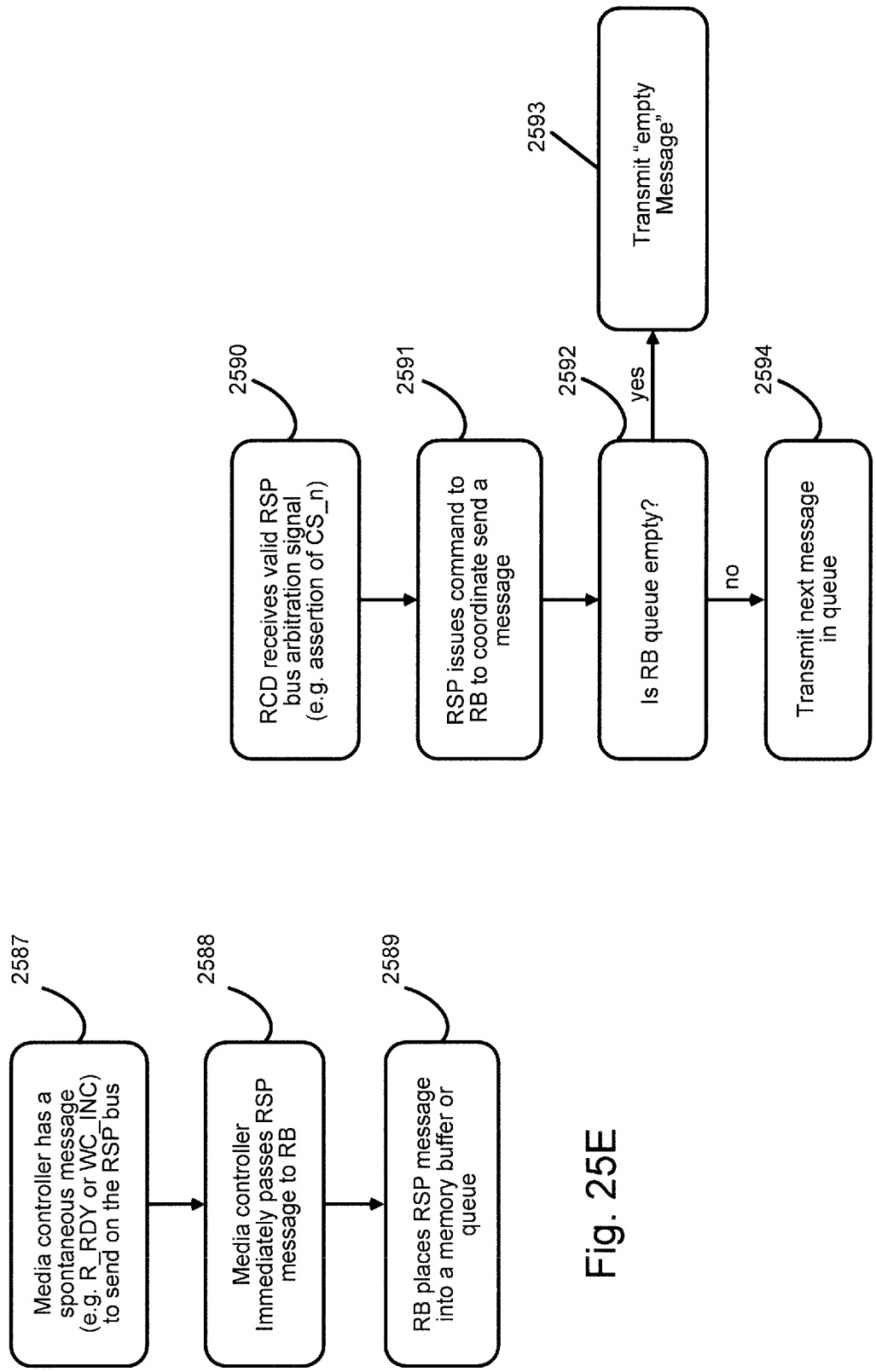
FIGS. 25E and 25F are flow charts of a queued RB of an embodiment.

As an alternative to pass-through mode, the RB may have another "queued" mode in which the RB collects numerous spontaneous messages from the media controller and holds them while waiting for a bus ownership window. FIG. 25E is a flow chart depicting the role arbitration operation RB when operating in queued mode, the media controller has a spontaneous message (act 2587). The media controller immediately passes an RSP message to the RB (Act 2588). The RB places the RSP message into a memory buffer or queue (act 2589). Turning now to FIG. 25F, the RCD receives a valid RSP bus arbitration signal (act 2590). The RSP issues a command to the RB to coordinate a send message (act 2591). It is then determined if the RB queue is empty (act 2592). If it is, the "empty message" signal is transmitted (act 2592). If it is not, the next message in the queue is transmitted (act 2594)

RB embodiments may exist with the capacity to operate in either queued mode or pass-through mode. In such embodiments, the RB may use control registers or internal control words to toggle from one operational mode to the other. Likewise, since the behavioral requirements of the RCD differ in either mode, the RCD can have analogous control word registers in 2564 to toggle from queued RB mode to pass-through mode.

Just as the control logic 2367 of the non-RB compatible NVDIMM RCD 2360 is different from the other control logic by changes to allow the unique behaviors required by SNVRAM protocols, so can the control logic 2567 of the RB-compatible RCD be modified in order to support the interactions between the NVM controller, the RCD, and the RB, as captured in FIGS. 25D, 25E and 25F.

Turning again to the drawings, FIGS. 26A-28 provide alternate architectures to the ones mentioned above. Specifically, in the following embodiments, one or more of the components mentioned above are integrated with one another (e.g., as two or more components in the same package or as being a component on an ASIC of another component). By way of background, DRAM DIMMs and NV-DIMMs may be constrained on printed circuit board (PCB) space, power, signal integrity, and device latencies. Data buffers (DBs) and registered clock drivers (RCDs) are two existing LRDIMM chips that isolate the DRAM bus for faster data rates and improved signal integrity. DBs and RCDs can help NV-DIMMs provide more-predictable electrical behavior and interoperability in UDIMM, RDIMM, and LRDIMM communication standards. Integration of the chips into an interface of the NVM of the NVDIMM, controller ASICs, or combined packages can assist on PCB space, power, signal integrity, and device latencies while maintaining consistent external electrical characteristics.

Figure 26A:
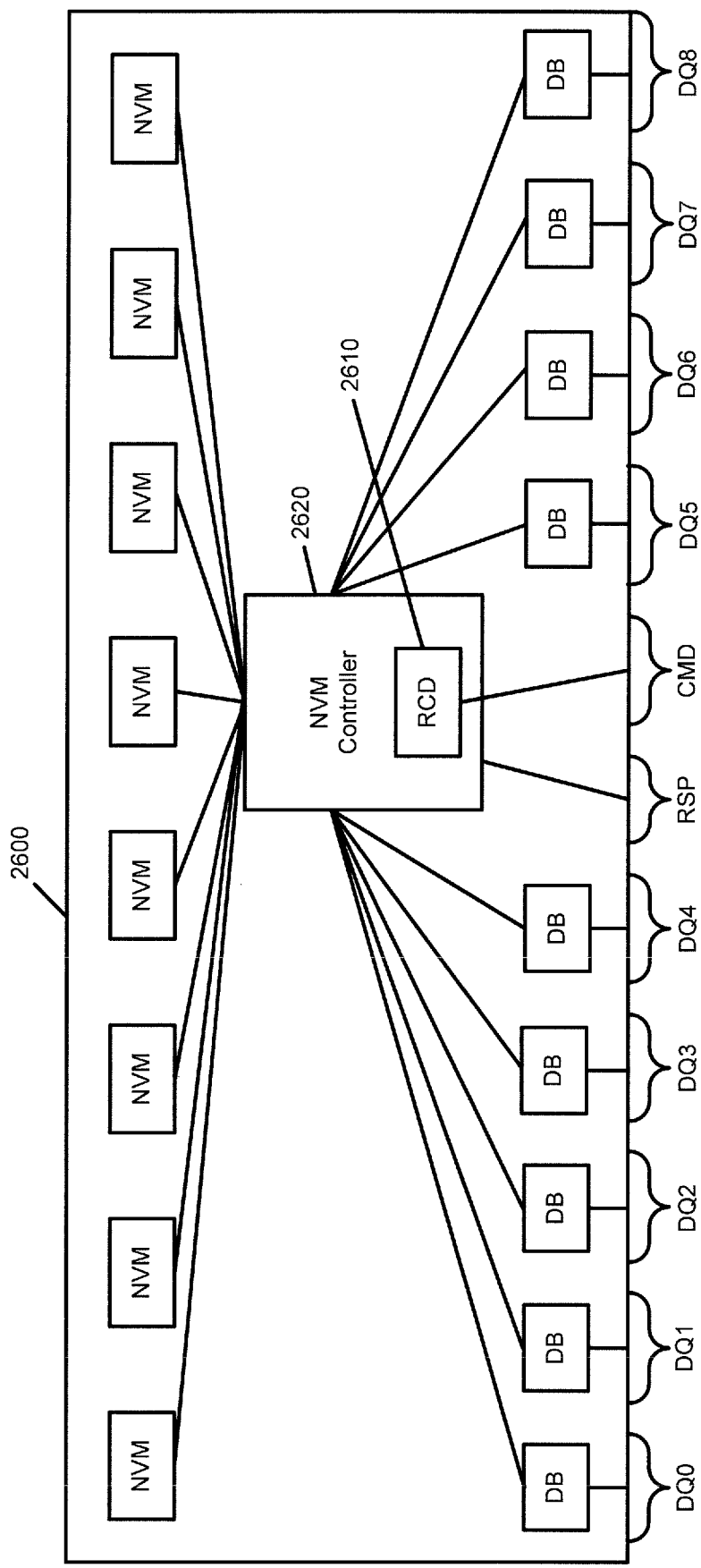
FIGS. 26A, 26B, and 26C are block diagrams of a storage system of an embodiment having an RCD integrated into a controller.
Figure 26B:
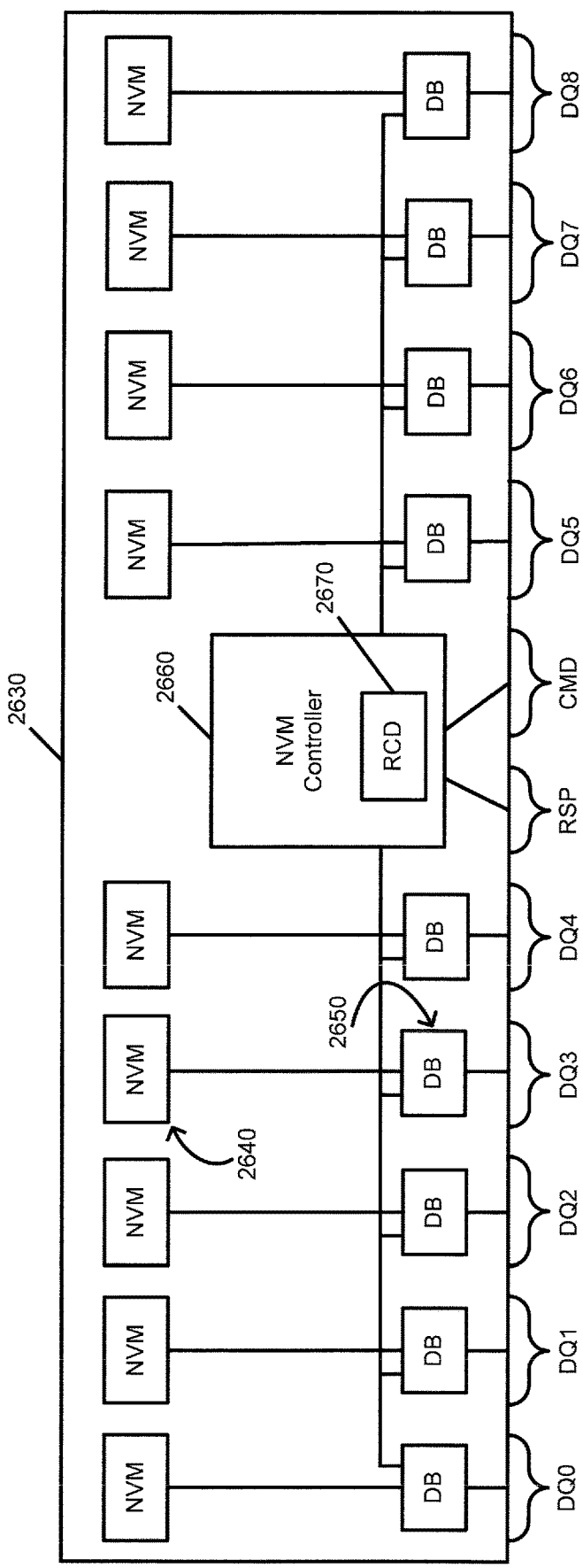
Figure 26C:
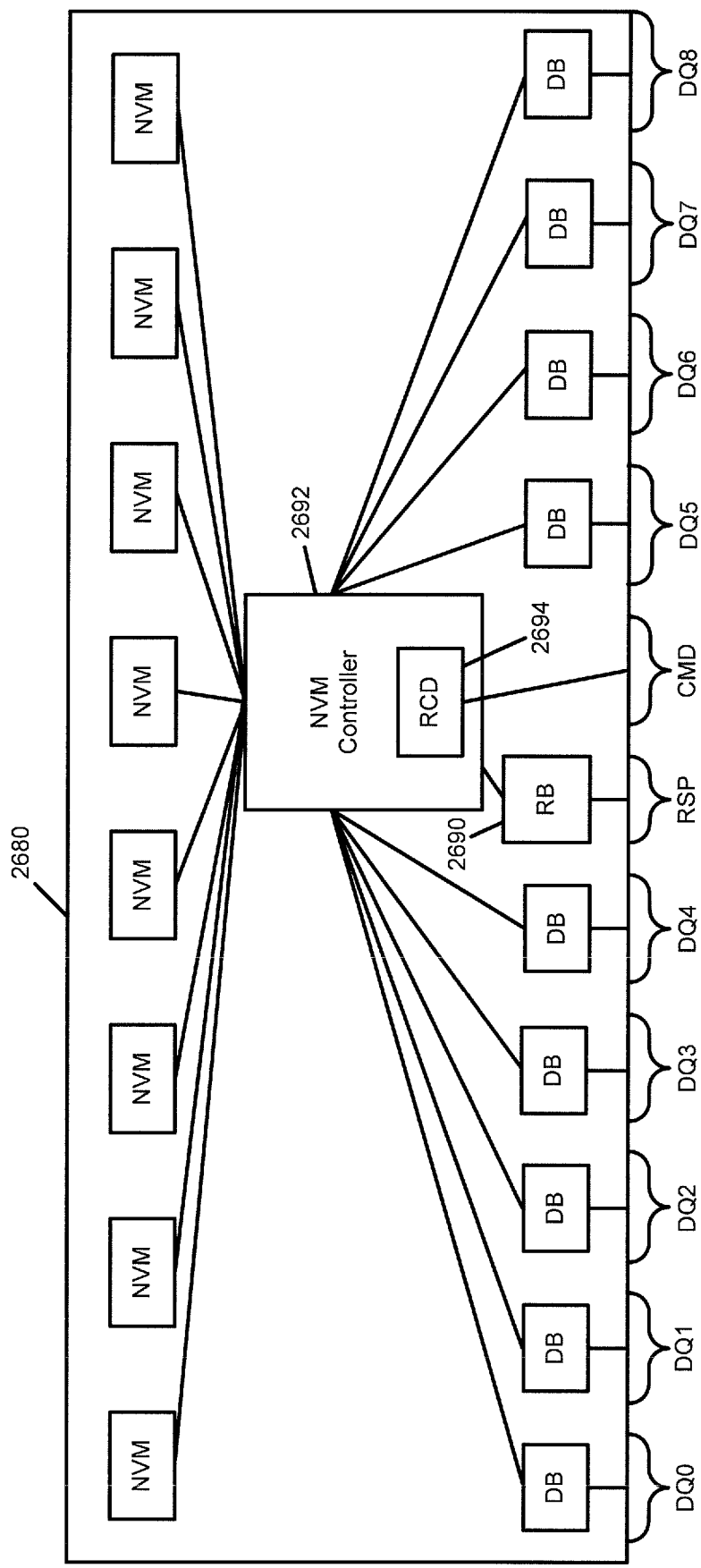

Turning first to FIG. 26, FIG. 26 shows a storage system 2600 having an RCD 2610 integrated into the NVM controller 2620. The RCD 2610 and NVM controller 2620 can have similar or different functionality than the functionality discussed above. In this embodiment, the RCD pinout, electrical characteristics, and positioning is specified. However, the connection between the NVM controller 2620 and the RCD 2610 is not utilized since the RCD 2610 is now a component in the NVM controller package or ASIC 2620. The storage system 2630 in FIG. 26B is similar to the storage system 2600 in FIG. 26 in that it has an RCD 2670 integrated into the NVM controller 2600. However, in this embodiment, the NVM devices 2640 communicate directly with the DBs 2650 without going through the NVM controller 2660. As another alternative, the storage system 2680 in FIG. 26C has an RB 2690 connected to the NVM controller 2692, which has an RCD 2694 integrated in it.

Figure 27:
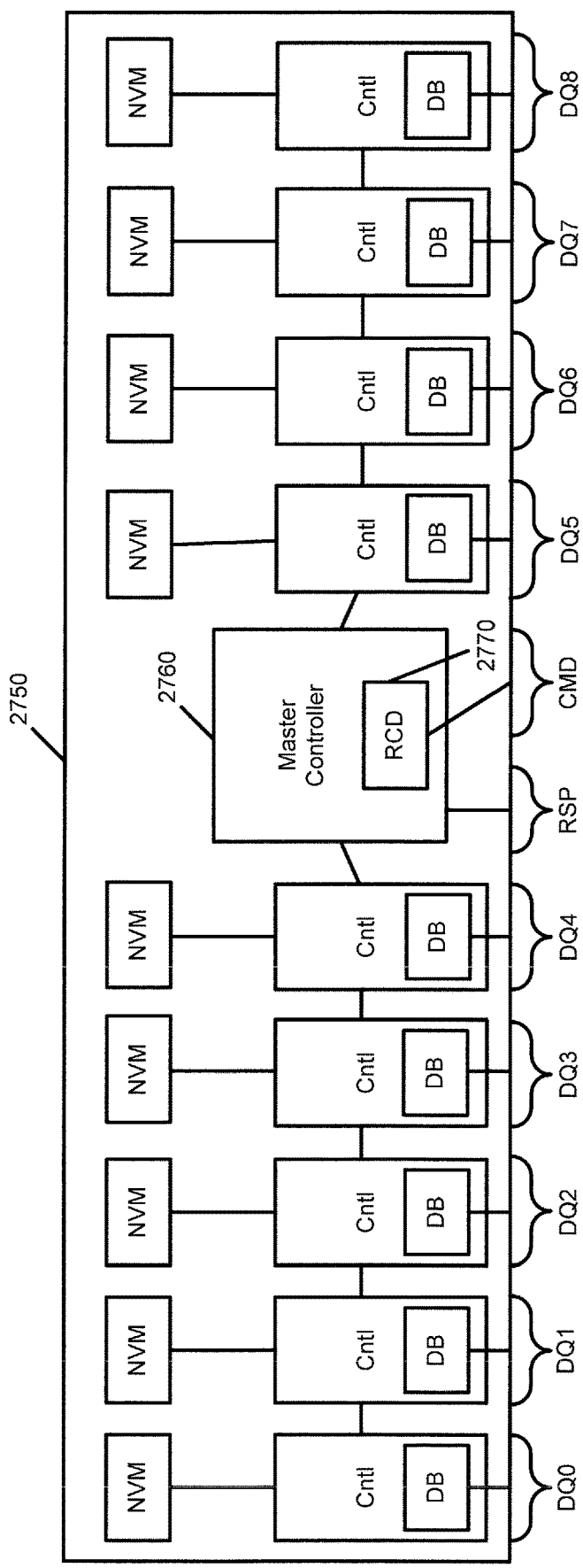
FIG. 27 is a block diagram of a storage system of an embodiment having data buffers integrated into a distributed controller.

As another alternative, FIG. 27 shows a storage system 2750 with a master controller 2760 that has an RCD 2770 integrated in it. In one embodiment, the master controller 2780 performs all the functionality of the NVM controller discussed above expect for data protection (e.g., ECC), which is performed by the individual controllers.

In another alternative (shown in FIG. 28A), the storage system 2800 uses a distributed NVM controller 2830. Each NVM device 2440 communicates with its own NVM controller 2430, instead of all NVM devices communicating with a single NVM controller. Further, each DB 2450 communicates with its own NVM controller 2430. In this embodiment, the DBs 2850 can be produced to vendor-agnostic specifications with both the connections to the bus and to the individual NVM controllers 2830. The connection from the RCD 2820 to the bus can meet signal integrity specifications, but the connections from the RCD 2820 to the individual NVM controllers 2830 can be vendor specific.

Additionally, in this embodiment, the RCD 2420, which has an RB integrated in it, is used to coordinate the actions of all the individual NVM controllers 2830. Though, in some embodiments, multiple RBs 2425, 2430 may be used to keep them close to the RSP pins on the DIMM connector, other embodiments may exist where the functionality of at least one RB may be integrated into the RCD in order to reduce costs or save space. However, the viability of this solution would depend on the distance between the command and control set pins going to the RCD and the nearest RB. Just as having a single RB may in some embodiments force some RSP transmission lines to become too long, integrating some RB functionality into the RCD might force some RSP transmission lines to become too long for adequate signal integrity.

Figure 28A:
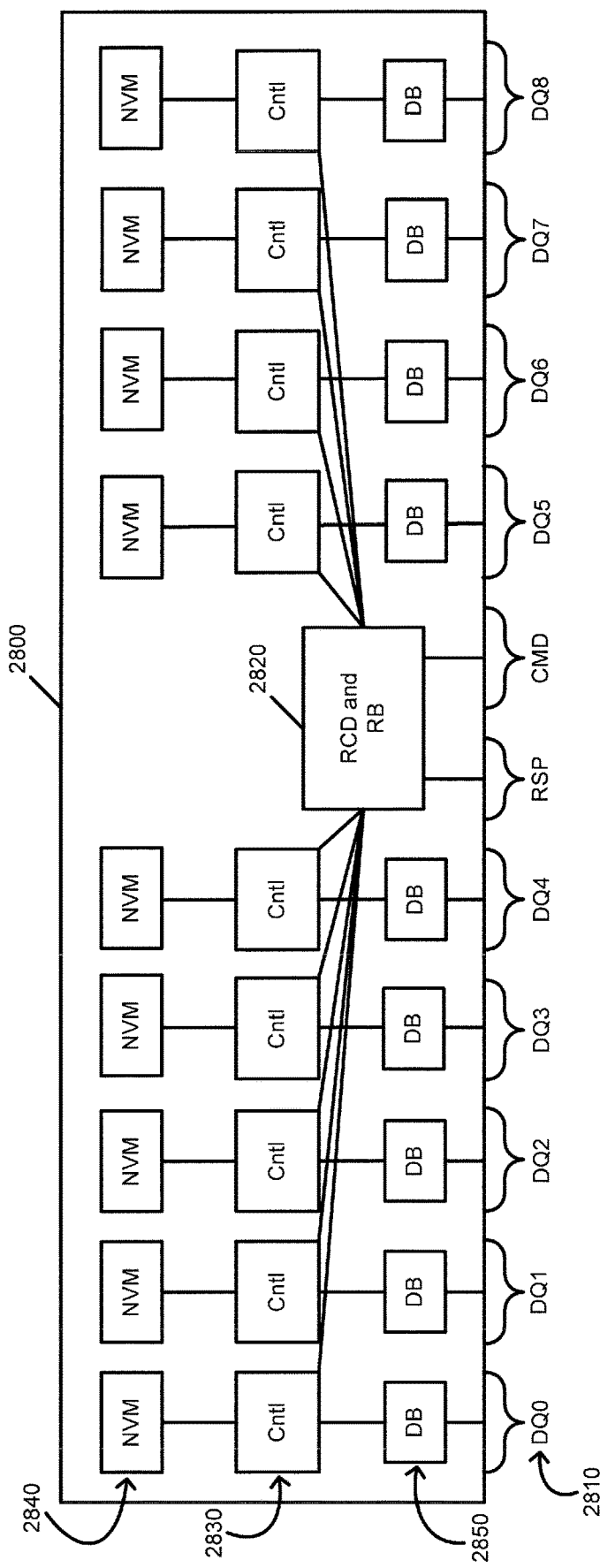
FIG. 28A is a block diagram of a storage system of an embodiment having a distributed NVM controller.
Figure 28B:
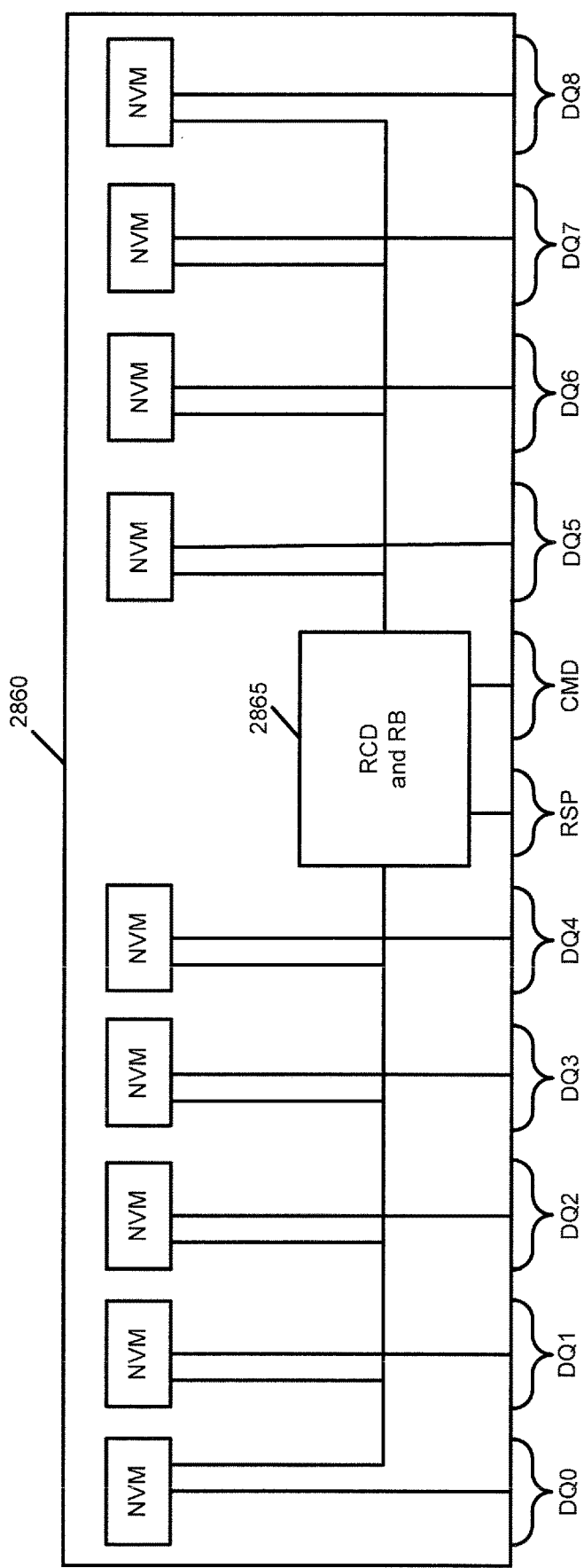
FIGS. 28B and 28C are block diagrams of a storage system of an embodiment with an integrated RCD and RB.
Figure 28C:
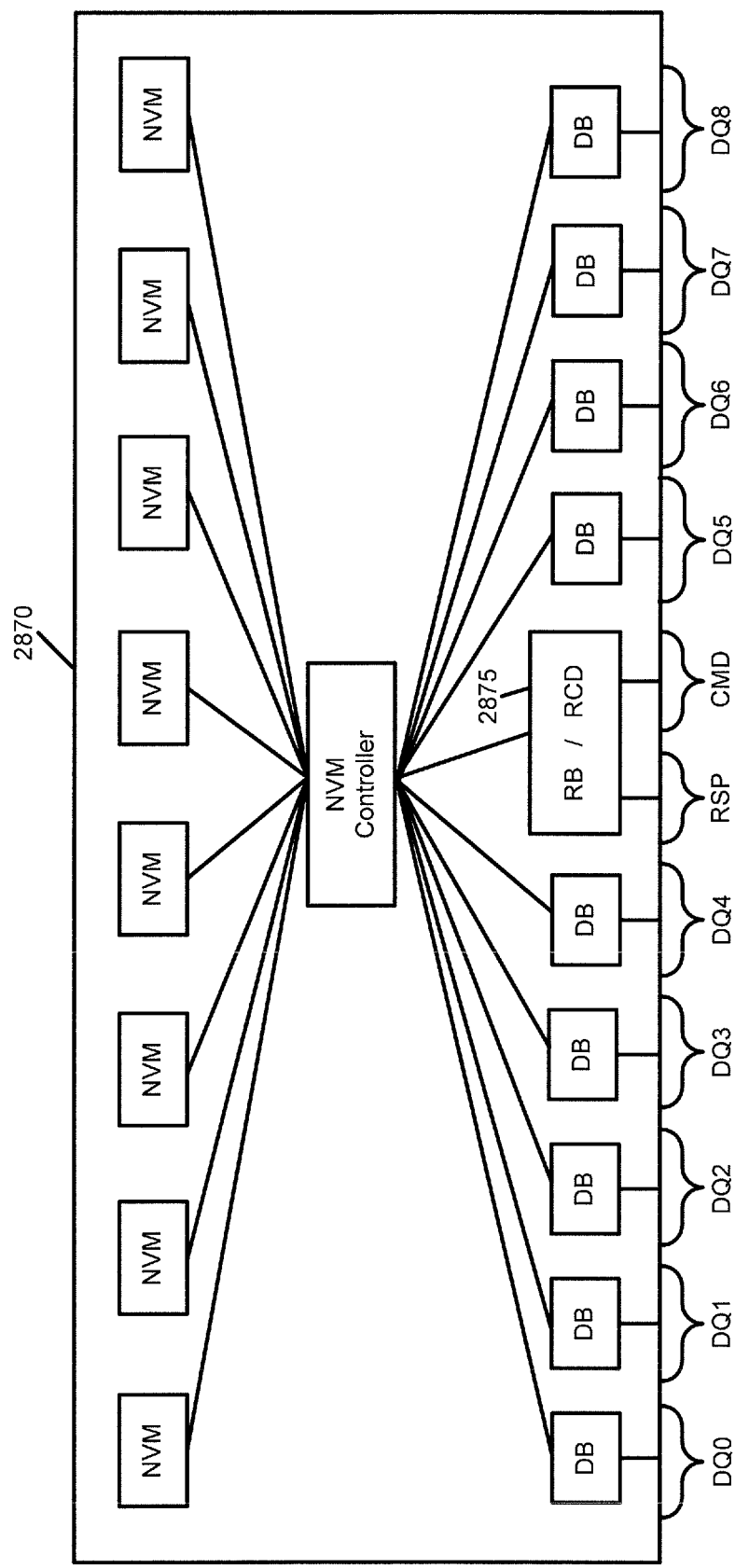

In yet another alternative. FIG. 28B shows a storage system 2860 that is similar to the storage system 2435 in FIG. 24C but has an integrated RCD and RB 2885. Further, FIG. 28C shows a storage system 2870 that is similar to the storage system 2400 in FIG. 24A but has an integrated RCD and RB 2875.

There are several advantages associated with these embodiments. For example, there are both cost savings and PCB space savings by fabricating two chips together as one. Additionally, integrating two components reduces delays of chip-to-chip transfers and communications, reduces pinout concerns, reduces signal integrity concerns, and reduces coordination effort and corner case concerns.

Architectures with multi-chip integrated components can be used as well. Once specifications of DBs and RCDs for integration or isolated development and deployment exist, multiple chip integrations can create greater advantages on the PCB. Such combinations include, but are not limited to, multiple DBs and NVM devices, RCD and DBs, RCD and DBs with an NVM controller, and multiple DBs and an NVM controller.

Figure 29A:
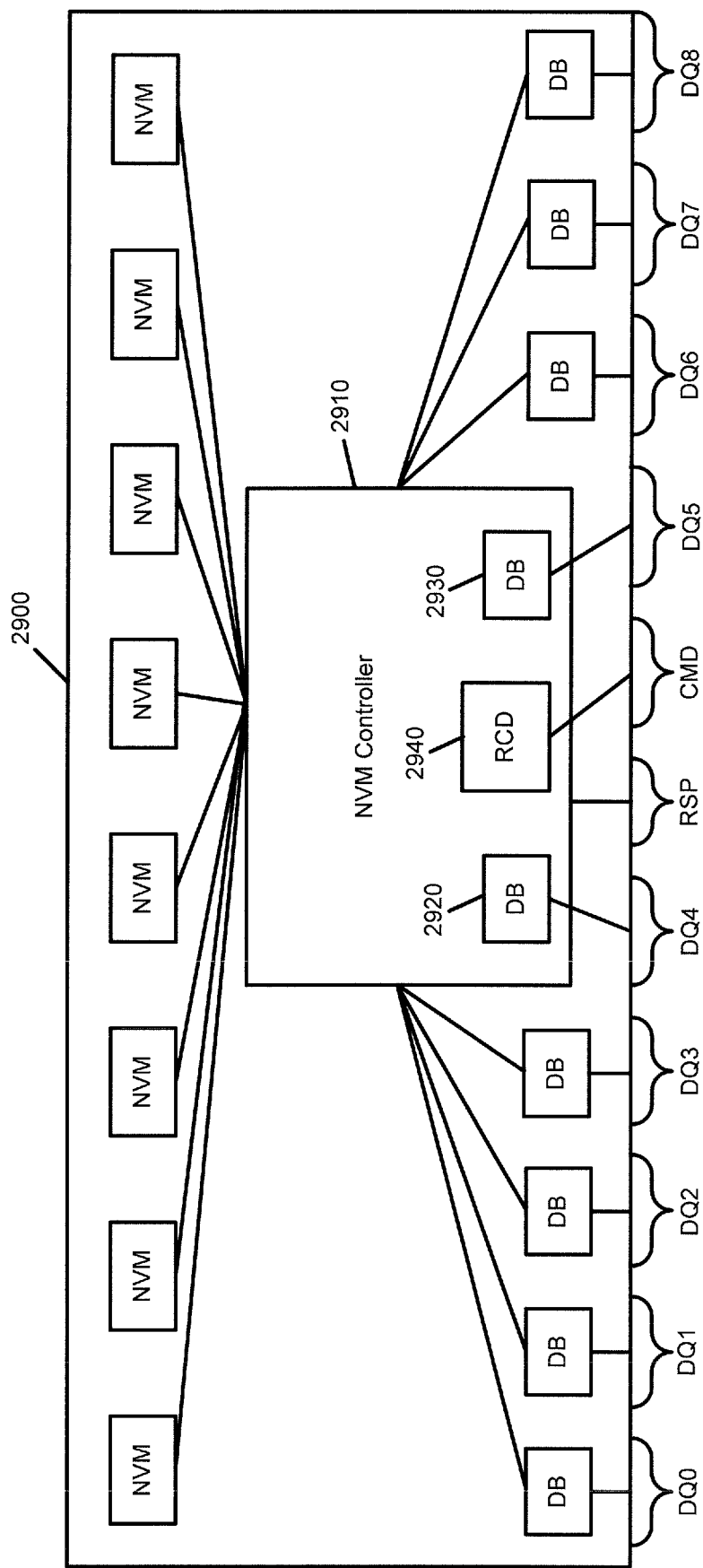
FIGS. 29A and 29B are block diagrams of a storage system of an embodiment having a data buffer and an RCD integrated into a controller.
Figure 29B:
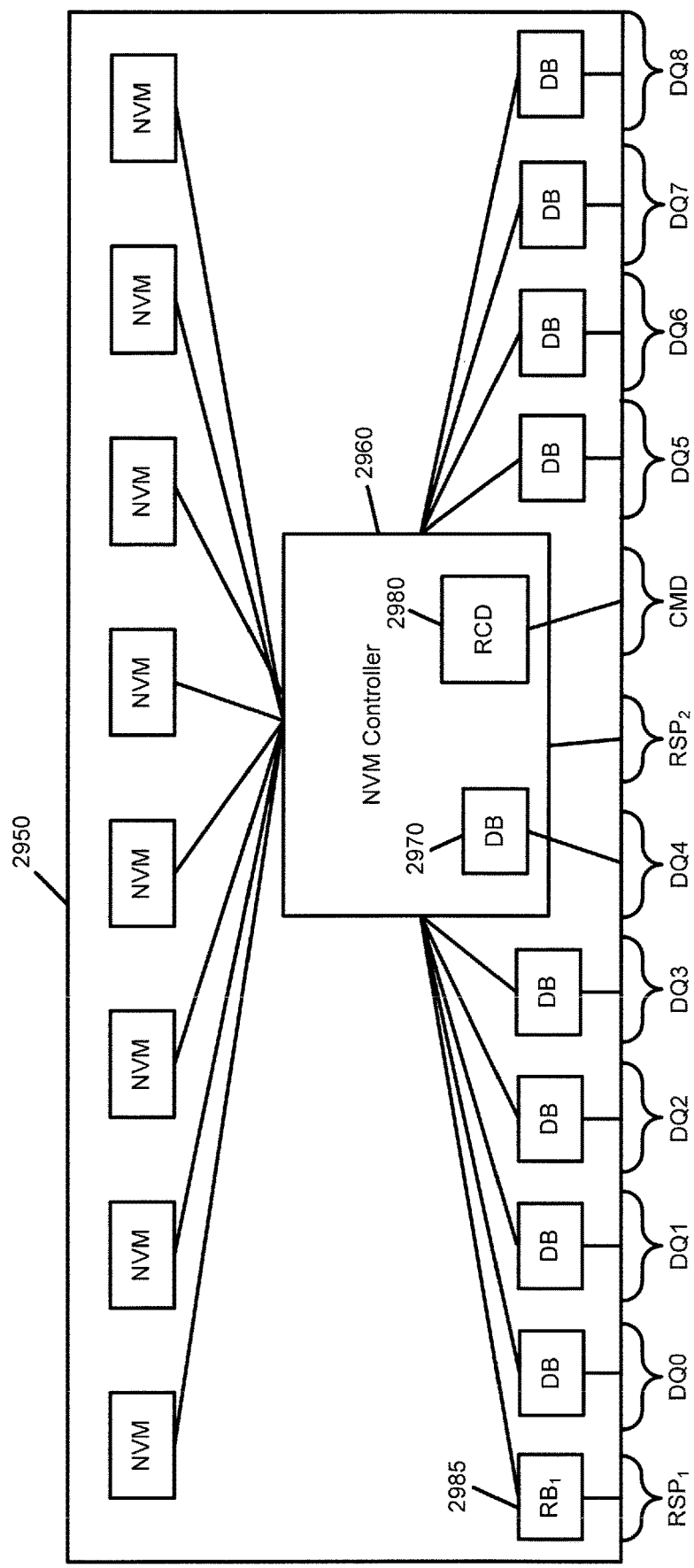

For example, the storage system 2900 in FIG. 29A has an NVM controller 2910 integrated with two DBs 2920, 2930 and an RCD 2940. In this embodiment, the RCD pinout, electrical characteristics, and positioning can be specified, and the prior connection between the NVM controller and RCD is not utilized since the RCD 2940 is now a component in the NVM controller package or ASIC. The storage system 2950 in FIG. 29B is similar to the storage system 2900 in FIG. 29A in that the NVM controller 2960 has an RCD 2970 integrated in it, but it only has one DB 2970 integrated in it. Also, the storage system 2950 in FIG. 29B has two response lines (RSP1 and RSP2) with a response buffer 2985 associated with RSP1. This is an example of a "split buffer" embodiment, where there can be more than one response buffer (here, the NVM controller 2960 can have its own response buffer for RSP2).

Figure 30:
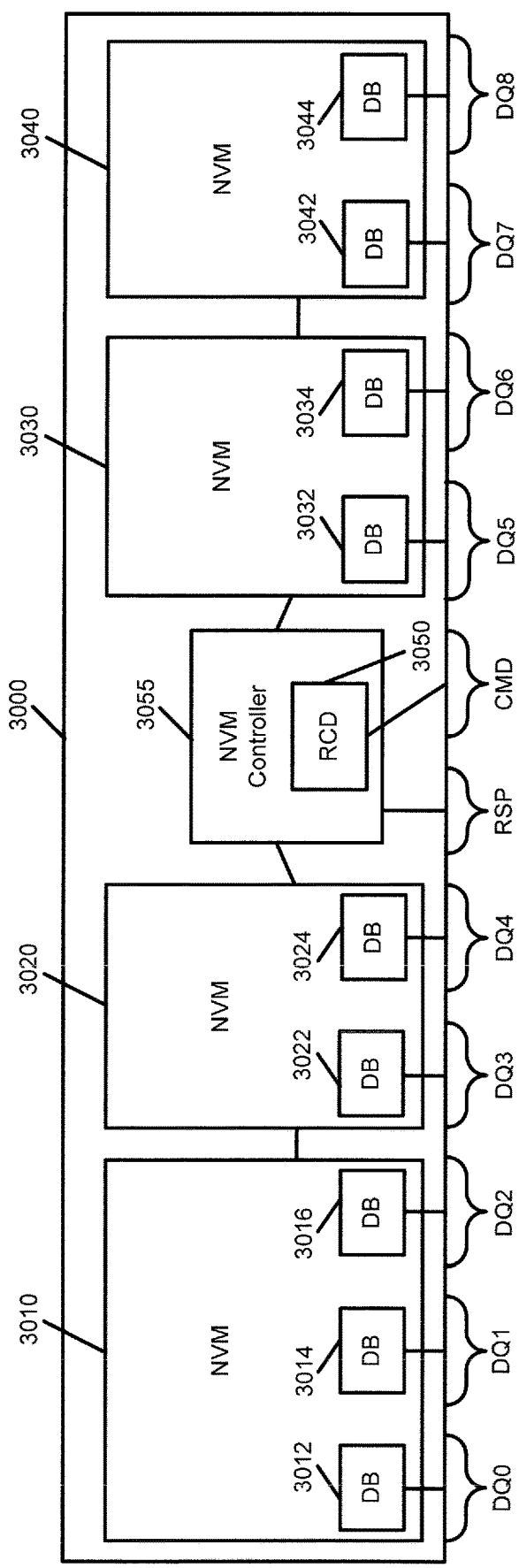
FIG. 30 is a block diagram of a storage system of an embodiment in which data buffers are integrated into NVM devices.

As another example, the storage system 3000 in FIG. 30 has two or more DBs integrated into each NVM device. In this particular implementation, there are four NVM devices 3010, 3020, 3030, 3040. The first NVM device 3010 has three DBs 3012, 3014, 3016; the second and third NVM devices 3020, 3030 each have two DBs 3022, 3024 and 3032, 3034; and the fourth NVM device 3040 has two DBs 3042, 3044. An RCD 3050 integrated in an NVM controller 3055 is connected to each of the NVM devices 3010, 3020, 3030, 3040.

Figure 31:
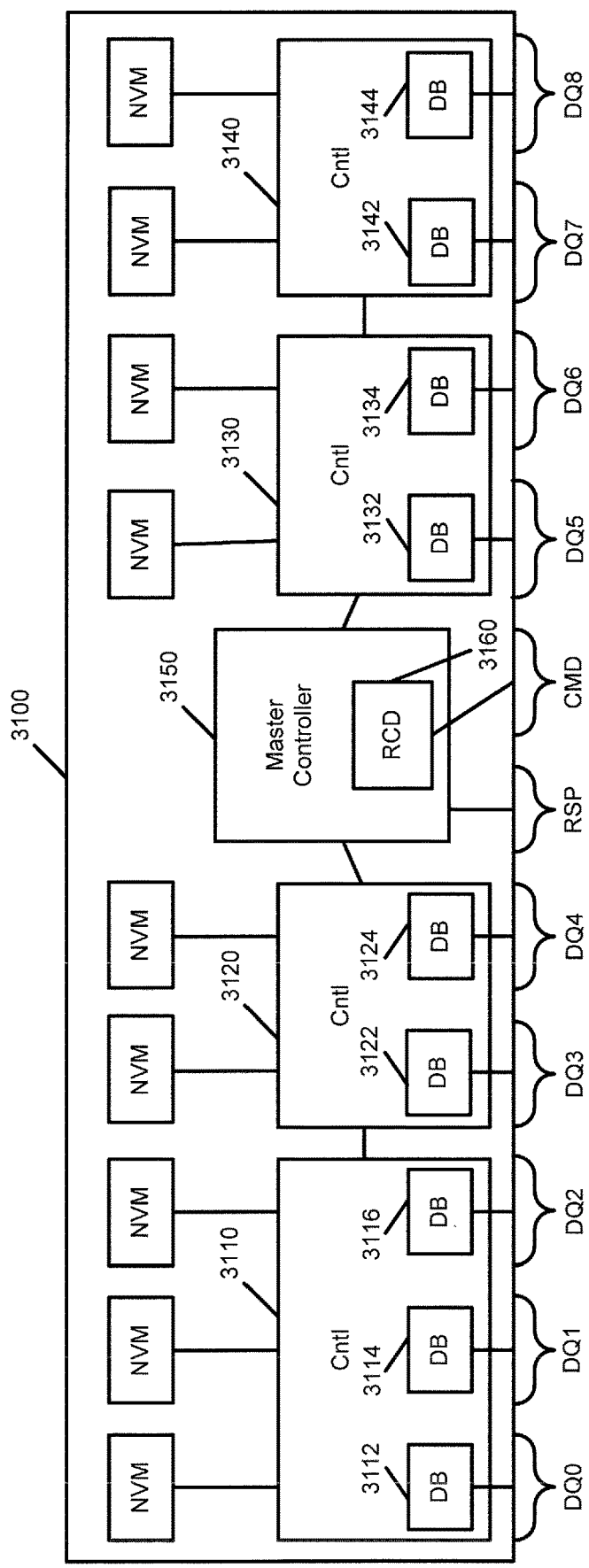
FIG. 31 is a block diagram of a storage system of an embodiment in which data buffers are integrated into distributed controllers and an RCD is integrated in a master controller.

As yet another example, the storage system 3100 in FIG. 31 has two or more DBs integrated into each distributed NVM controller 3110, 3120, 3130, 3140. The first NVM controller 3110 has three DBs 3112, 3114, 3116; the second and third NVM controllers 3120, 3130 each have two DBs 3122, 3124 and 3132, 3134; and the fourth NVM controller 3140 has two DBs 3142, 3144. In this embodiment, an RCD 3160 is integrated into a master controller 3150.

Figure 32:
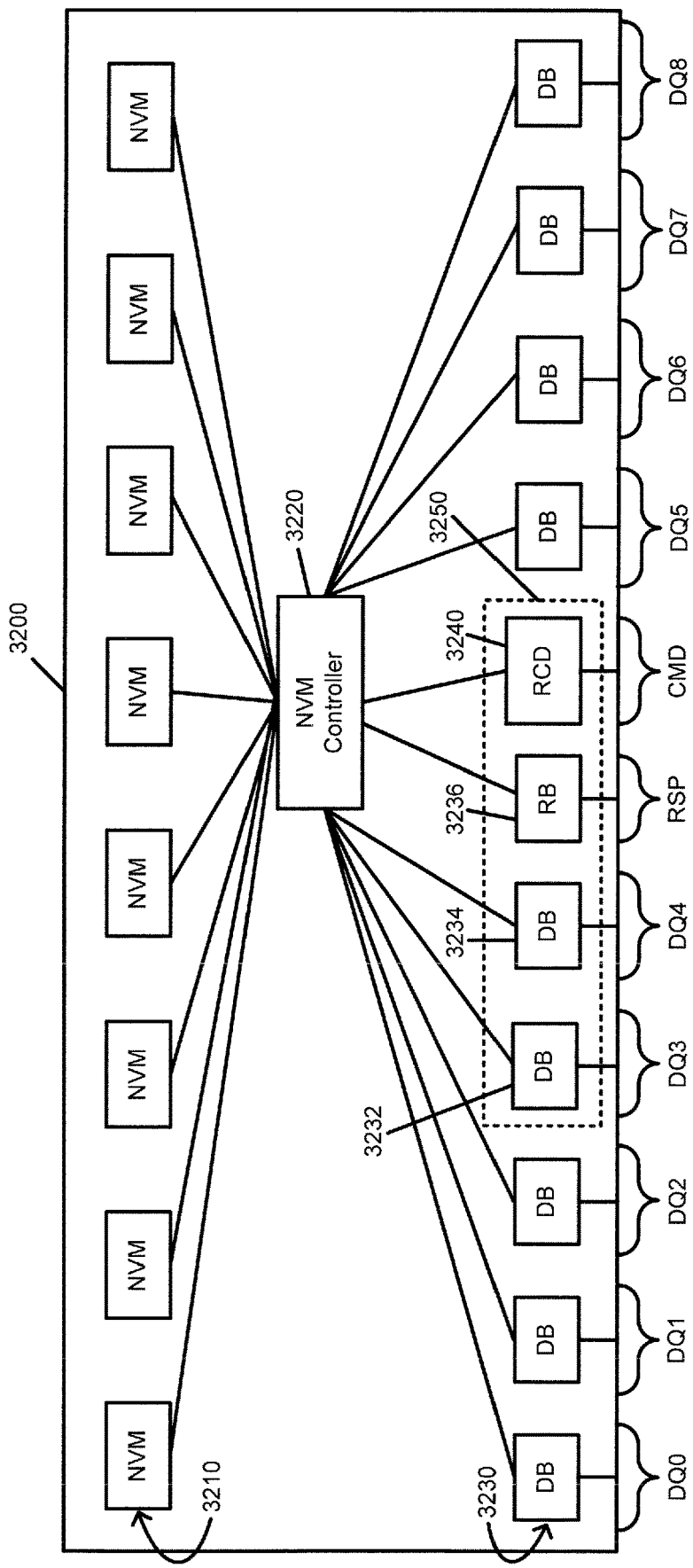
FIG. 32 is a block diagram of a storage system of an embodiment in which data buffers and an RCD are integrated together.

In yet another example, the storage system 3200 has a plurality of NVM devices 3210, an NVM controller 3220, a plurality of DBs, a response buffer (RB) 3236, and an RCD 3240. In this embodiment, two of the DBs 3232, 3234 and the RB 3236 are integrated with the RCD 3240. It should be noted that this is merely one variation and that any three or more of any of the components shown in FIG. 32 (and/or other components) can be integrated together.

There are several advantages associated with these embodiments. For example, there are both cost savings and PCB space savings by fabricating two chips together as one. Additionally, integrating two components reduces delays of chip-to-chip transfers and communications, reduces pinout concerns, reduces signal integrity concerns, and reduces coordination effort and corner case concerns.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be Ruined from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A storage system, comprising:
non-volatile memories;
data buffers;
a driver; and
a controller;
wherein the controller is configured to determine whether a host and the storage system have agreed to use, for data to be read from the non-volatile memories, non-deterministic reads or deterministic reads,
wherein when the controller determines that the host and the storage system have agreed to use the non-deterministic reads, the controller is configured to cause holding each data read, from the non-volatile memories, for a send command to be received from the host, and preventing transmission of the each read data to the host until receiving the respective send command,
otherwise, the controller is configured to determine that the host and the storage system have agreed to use the deterministic reads, and the controller is configured to cause transmitting the each read data, from the non-volatile memories, to the host when an elapsed time does not exceed a pre-determined time,
wherein the driver is configured to receive, from the host, a read command, an address and a read identifier, configured to provide, to the controller, the read command, the address and the read identifier, and configured to provide, to the data buffers, the read command and the read identifier but not the address,
wherein the controller is configured to read requested data from the non-volatile memories and configured to provide the requested data and the read identifier to the data buffers, and
wherein the data buffers are configured to place the requested data into an allocated space identified by the read identifier, for transmission to the host.

2. The storage system of claim 1,
wherein the non-deterministic reads are defined to complete transmitting the each read data to the host irrespective of the pre-determined time, and
wherein the deterministic reads are defined to complete transmitting the each read data to the host only within the pre-determined time.

3. The storage system of claim 1, comprising:
one or more first memories configured to store data sent between the controller and an input/output interface; and
at least one second memory configured to store commands received from the host,
wherein the one or more first memories are configured to be used for the non-deterministic reads and for the deterministic reads, and
wherein the at least one second memory is configured to be used for the non-deterministic reads and for the deterministic reads.

4. The storage system of claim 1,
wherein when the host and the storage system have agreed to use the non-deterministic reads, for all data to be read from the non-volatile memories for transmission to the host, then with respect to determining when to transmit the each read data, the controller is prevented from using, a determination whether the elapsed time exceeds the pre-determined time, to transmit the each read data to the host, and wherein when the host and the storage system have agreed to use the deterministic reads, for all the data to be read from the non-volatile memories for transmission to the host, then with respect to determining when to transmit the each read data, the controller is prevented from using, the respective send command received, to transmit the each read data to the host.

5. The storage system of claim 1, wherein physical and command layers of the storage system are configured to be compatible with one or more of the following: unbuffered dual in-line memory module, registered dual in-line memory module, and load-reduced dual in-line memory module, and
wherein the controller is configured to communicate with the host using a clock-data parallel interface, and
wherein the driver is a registered clock driver.

6. The storage system of claim 1, wherein the controller is configured to cause:
receiving a write command from the host, wherein the host is allowed only a certain number of outstanding write commands as tracked by a write counter in the host;
performing an operation having an undetermined duration from a perspective of the host;
writing data to the non-volatile memories; and
after the data to the non-volatile memories has been written, sending a write counter increase signal to the host.

7. The storage system of claim 1,
wherein the pre-determined time has been agreed by the host and the storage system, and
wherein the controller is configured to determine whether the host and the storage system have agreed to use either the non-deterministic reads for all data to be read from the non-volatile memories, or the deterministic reads for all data to be read from the non-volatile memories.

8. The storage system of claim 1,
wherein the data buffers are configured to allocate space before receiving the requested data and configured to reference the allocated space with the read identifier,
wherein the controller is configured to provide, to the driver, a completion signal and the read identifier, and
wherein the driver is configured to provide, to the host, a ready signal and the read identifier, configured to receive a corresponding send command from the host, and in response, configured to send a request to the controller to have the data buffers transmit, to the host, the requested data associated with the read identifier.

9. The storage system of claim 1,
wherein the data buffers have the allocated space having an identifier correlated to the read identifier within the driver,
wherein the controller is configured to provide, to the driver, a completion signal and the read identifier, and
wherein the driver is configured to provide, to the host, a ready signal and the read identifier, configured to receive a corresponding send command from the host, and in response, configured to send a request to the controller to have the data buffers transmit, to the host, the requested data associated with the read identifier.

10. The storage system of claim 8,
wherein the storage system comprises a response buffer,
wherein the data buffers are configured to allocate space before receiving the requested data and configured to reference the allocated space with the read identifier,
wherein the response buffer is configured to provide, to the host, a ready signal,
wherein the driver is configured to receive a corresponding send command from the host, and in response, configured to send a request to the controller to have the data buffers transmit, to the host, the requested data associated with the read identifier.

11. A method for a storage system comprising non-volatile memories, data buffers, a driver and a controller and, the method comprising:
determining, by the controller, whether a host and the storage system have agreed to use, for data to be read from the non-volatile memories, non-deterministic reads or deterministic reads,
wherein the determining comprises determining, by the controller, that the host and the storage system have agreed to use the non-deterministic reads but not the deterministic reads, and the controller performs operations comprising:
holding each data read, from the non-volatile memories, for a send command to be received from the host; and
preventing transmission of the each read data to the host until receiving the respective send command,
wherein the storage system comprises one or more first memories, and the method comprises storing, in the one or more first memories, the each data read from the non-volatile memories for the non-deterministic reads,
wherein the one or more first memories are used for the non-deterministic reads and are to be used for the deterministic reads, and
wherein the method comprises:
receiving, by the driver from the host, a read command, an address and a read identifier;
providing, by the driver to the controller, the read command, the address and the read identifier;
providing, to the data buffers, the read command and the read identifier but not the address;
reading, by the controller, requested data from the non-volatile memories;
providing, by the controller, the requested data and the read identifier to the data buffers; and
placing, by the data buffers, the requested data into an allocated space identified by the read identifier, for transmission to the host.

12. The method of claim 11,
wherein the non-deterministic reads are defined to complete transmitting the each read data to the host irrespective of a pre-determined time, and
wherein the deterministic reads are defined to complete transmitting the each read data to the host only within the pre-determined time.

13. The method of claim 11,
wherein the storage system comprises at least one second memory, and the method comprises storing commands received from the host, and
wherein the at least one second memory is used for the non-deterministic reads and is to be used for the deterministic reads.

14. The method of claim 11,
wherein when the host and the storage system have agreed to use the non-deterministic reads, for all data to be read from the non-volatile memories for transmission to the host, then with respect to determining when to transmit the each read data, the controller is prevented from using, a determination whether an elapsed time exceeds a pre-determined time, to transmit the each read data to the host.

15. The method of claim 11, wherein physical and command layers of the storage system are compatible with one or more of the following: unbuffered dual in-line memory module, registered dual in-line memory module, and load-reduced dual in-line memory module, and
wherein the driver is a registered clock driver.

16. The method of claim 11, comprising:
receiving a write command from the host, wherein the host is allowed only a certain number of outstanding write commands as tracked by a write counter in the host;
performing an operation having an undetermined duration from a perspective of the host;
writing data to the non-volatile memories; and
after the data to the non-volatile memories has been written, sending a write counter increase signal to the host.

17. The method of claim 11, wherein determining, by the controller, whether the host and the storage system have agreed to use the non-deterministic reads or the deterministic reads comprises: determining, by the controller, whether the host and the storage system have agreed to use the non-deterministic reads for all data to be read from the non-volatile memories, or the deterministic reads for all data to be read from the non-volatile memories.

18. A storage system, comprising:
non-volatile memories;
means for determining whether a host and the storage system have agreed to use, for data to be read from the non-volatile memories, non-deterministic reads or deterministic reads,
wherein when the means for determining determines that the host and the storage system have agreed to use the non-deterministic reads, the storage system comprises: means for causing holding each data read, from the non-volatile memories, for a send command to be received from the host; and means for causing preventing transmission of the each read data to the host until receiving the respective send command,
otherwise, the means for determining comprises means for determining that the host and the storage system have agreed to use the deterministic reads, and the storage system comprises means for causing transmission of the each read data, from the non-volatile memories, to the host when an elapsed time does not exceed a pre-determined time, and
wherein the storage system comprises:
means for receiving, from the host, a read command, an address and a read identifier;
means for providing, to the means for determining, the read command, the address and the read identifier;
means for providing, to data buffers, the read command and the read identifier but not the address;
means for reading requested data from the non-volatile memories;
means for providing the requested data and the read identifier to the data buffers; and
means for placing the requested data into an allocated space identified by the read identifier, for transmission to the host.

19. The storage system of claim 18,
wherein the non-deterministic reads are defined to complete transmitting the each read data to the host irrespective of the pre-determined time, and
wherein the deterministic reads are defined to complete transmitting the each read data to the host only within the pre-determined time.

20. The storage system of claim 18, comprising:
means for storing data sent between an input/output interface and the means for determining whether the host and the storage system have agreed to use the non-deterministic reads or the deterministic reads; and
means for storing commands received from the host,
wherein the means for storing data sent are configured to be used for the non-deterministic reads and for the deterministic reads, and
wherein the means for storing commands is configured to be used for the non-deterministic reads and for the deterministic reads.

* * * * *